United States Patent
Munro et al.

(10) Patent No.: US 12,351,707 B2
(45) Date of Patent: *Jul. 8, 2025

(54) CURABLE COMPOSITIONS COMPRISING UNSATURATED POLYOLEFINS

(71) Applicant: Dow Global Technologies LLC, Midland, MI (US)

(72) Inventors: Jeffrey C. Munro, Bellaire, TX (US); Paul J. Brigandi, Schwenksville, PA (US); Jeffrey M. Cogen, Flemington, NJ (US); Lixin Sun, Sugar Land, TX (US); Colin LiPiShan, Pearland, TX (US)

(73) Assignee: Dow Global Technologies LLC, Midland, MI (US)

( * ) Notice: Subject to any disclaimer, the term of this patent is extended or adjusted under 35 U.S.C. 154(b) by 645 days.

This patent is subject to a terminal disclaimer.

(21) Appl. No.: 17/419,281

(22) PCT Filed: Dec. 27, 2019

(86) PCT No.: PCT/US2019/068656
§ 371 (c)(1),
(2) Date: Jun. 28, 2021

(87) PCT Pub. No.: WO2020/139993
PCT Pub. Date: Jul. 2, 2020

(65) Prior Publication Data
US 2022/0073716 A1  Mar. 10, 2022

Related U.S. Application Data

(60) Provisional application No. 62/786,084, filed on Dec. 28, 2018, provisional application No. 62/786,119, (Continued)

(51) Int. Cl.
| | |
|---|---|
| C08L 23/06 | (2006.01) |
| C07F 3/06 | (2006.01) |
| C07F 5/06 | (2006.01) |
| C08F 2/38 | (2006.01) |
| C08F 210/02 | (2006.01) |
| C08F 210/06 | (2006.01) |
| C08F 210/14 | (2006.01) |
| C08F 210/16 | (2006.01) |
| C08J 9/10 | (2006.01) |
| C08J 9/14 | (2006.01) |
| C08K 5/00 | (2006.01) |
| C08K 5/14 | (2006.01) |
| C08K 5/3435 | (2006.01) |
| C08K 5/5419 | (2006.01) |
| C08K 5/5425 | (2006.01) |
| C08L 23/0807 | (2025.01) |
| C08L 23/16 | (2006.01) |

(Continued)

(52) U.S. Cl.
CPC ............ *C08L 23/0815* (2013.01); *C07F 3/06* (2013.01); *C07F 5/062* (2013.01); *C08F 2/38* (2013.01); *C08F 210/02* (2013.01); *C08F 210/06* (2013.01); *C08F 210/14* (2013.01); *C08J 9/103* (2013.01); *C08J 9/14* (2013.01); *C08J 9/142* (2013.01); *C08K 5/0025* (2013.01); *C08K 5/005* (2013.01); *C08K 5/14* (2013.01); *C08K 5/3435* (2013.01); *C08K 5/5419* (2013.01); *C08K 5/5425* (2013.01); *C08L 23/16* (2013.01); *C08L 23/20* (2013.01); *H01L 31/0481* (2013.01); *C08F 210/16* (2013.01); *C08J 2203/04* (2013.01); *C08J 2323/06* (2013.01); *C08J 2323/14* (2013.01); *C08J 2323/20* (2013.01); *C08J 2353/00* (2013.01); *C08J 2423/08* (2013.01); *C08J 2423/14* (2013.01); *C08J 2423/20* (2013.01); *C08K 5/23* (2013.01); *C08L 2203/14* (2013.01); *C08L 2203/16* (2013.01); *C08L 2203/202* (2013.01); *C08L 2203/206* (2013.01); *C08L 2205/025* (2013.01); *C08L 2207/066* (2013.01); *C08L 2312/08* (2013.01); *C08L 2314/06* (2013.01)

(58) Field of Classification Search
CPC .......... C08F 4/52; C08F 10/02; C08F 210/16; C08F 2500/29; C08L 23/06; C08L 23/08; C08L 23/0815; C08L 23/16
See application file for complete search history.

(56) References Cited

U.S. PATENT DOCUMENTS

| | | | |
|---|---|---|---|
| 3,124,604 A | 3/1964 | Huther et al. | |
| 4,316,973 A * | 2/1982 | Kennedy | .................. C08F 8/26 525/337 |

(Continued)

FOREIGN PATENT DOCUMENTS

| | | |
|---|---|---|
| CN | 102558401 | 7/2012 |
| EP | 0647244 | 4/1995 |

(Continued)

OTHER PUBLICATIONS

Bremner and Rudin, Polymer Engineering and Science, 1992, pp. 939-943, vol. 32.
Freijee et al., Journal of Organometallic Chemistry, 1982, pp. 217-221, vol. 224.
Hu et al., Chemical Communications, 2016, pp. 2237-2240, vol. 52, No. 11.
Jian et al., Angew. Chem. Int. Ed., 2016, 55, 14378-14383.
Makio et al., Journal of the American Chemical Society, 2013, pp. 8177-8180, vol. 135.

(Continued)

*Primary Examiner* — Rip A Lee
(74) *Attorney, Agent, or Firm* — Karen L. Beckman

(57) ABSTRACT

The present disclosure relates to unsaturated polyolefins and processes for preparing the same. The present disclosure further relates to curable formulations comprising the unsaturated polyolefins that show improved crosslinking.

14 Claims, 4 Drawing Sheets

Related U.S. Application Data filed on Dec. 28, 2018, provisional application No. 62/786,100, filed on Dec. 28, 2018, provisional application No. 62/786,110, filed on Dec. 28, 2018.

(51) Int. Cl.
   *C08L 23/20* (2006.01)
   *H01L 31/048* (2014.01)
   *C08K 5/23* (2006.01)

(56) References Cited

U.S. PATENT DOCUMENTS

| | | | |
|---|---|---|---|
| 4,486,572 A * | 12/1984 | Kennedy | C08F 8/00 |
| | | | 525/283 |
| 5,334,678 A | 8/1994 | Furuhashi et al. | |
| 5,814,714 A * | 9/1998 | Palomo | C08F 210/18 |
| | | | 526/170 |
| 5,965,628 A * | 10/1999 | Li | C08J 9/0061 |
| | | | 521/142 |
| 6,444,773 B1 | 9/2002 | Markel | |
| 6,891,018 B2 | 5/2005 | Murakami et al. | |
| 7,109,284 B2 | 9/2006 | Ishii et al. | |
| 8,188,191 B2 * | 5/2012 | Ikenaga | C08F 210/16 |
| | | | 525/938 |
| 8,299,195 B2 * | 10/2012 | Kawashima | C08F 110/02 |
| | | | 526/348 |
| 8,318,998 B2 | 11/2012 | Crowther et al. | |
| 8,455,597 B2 | 6/2013 | Crowther et al. | |
| 8,791,284 B2 | 7/2014 | Ochiai et al. | |
| 8,802,780 B2 * | 8/2014 | Hampton | C08L 23/06 |
| | | | 525/240 |
| 9,045,568 B2 | 6/2015 | Giesbrecht et al. | |
| 9,208,923 B2 * | 12/2015 | Sengupta | C08F 210/02 |
| 9,464,148 B2 | 10/2016 | Giesbrecht et al. | |
| 10,004,293 B2 * | 6/2018 | Nakano | C08J 3/24 |
| 10,005,878 B2 | 6/2018 | Martinez et al. | |
| 10,221,267 B2 * | 3/2019 | Cain | C08K 3/22 |
| 10,435,494 B2 | 10/2019 | Ichino et al. | |
| 11,078,312 B2 | 8/2021 | Smedberg et al. | |
| 11,359,038 B2 * | 6/2022 | Sun | C08F 210/02 |
| 2008/0306217 A1 | 12/2008 | Karjala et al. | |
| 2010/0004393 A1 | 1/2010 | Ikenaga et al. | |
| 2010/0324242 A1 | 12/2010 | Machida et al. | |
| 2011/0290317 A1 | 12/2011 | Naumovitz et al. | |
| 2013/0000947 A1 | 1/2013 | Smedberg et al. | |
| 2013/0066007 A1 * | 3/2013 | Machida | C09J 123/142 |
| | | | 525/327.4 |
| 2013/0267669 A1 | 10/2013 | Stokes et al. | |
| 2014/0357802 A1 | 12/2014 | Aou et al. | |
| 2014/0357805 A1 * | 12/2014 | Sawaguchi | C08F 8/50 |
| | | | 525/55 |
| 2015/0038647 A1 | 2/2015 | Boisson et al. | |
| 2022/0064345 A1 * | 3/2022 | Munro | C08F 210/16 |
| 2022/0073540 A1 * | 3/2022 | Munro | C08F 210/06 |
| 2022/0073658 A1 * | 3/2022 | Sun | C08F 10/02 |
| 2022/0073715 A1 * | 3/2022 | Munro | C08J 9/14 |
| 2022/0081500 A1 * | 3/2022 | Munro | C08J 3/24 |
| 2022/0204716 A1 * | 6/2022 | Munro | C08L 23/20 |

FOREIGN PATENT DOCUMENTS

| | | | | |
|---|---|---|---|---|
| EP | 0863924 | | 9/1998 | |
| EP | 2077283 | | 7/2009 | |
| EP | 2993210 | | 3/2016 | |
| JP | 2016056337 A | | 4/2016 | |
| WO | 2013135314 A1 | | 9/2013 | |
| WO | 2015090641 A1 | | 6/2015 | |
| WO | WO 2015/129414 A1 * | | 9/2015 | C08J 3/24 |
| WO | 2019000311 | | 1/2019 | |
| WO | 2019000654 | | 1/2019 | |
| WO | 2019000744 | | 1/2019 | |
| WO | 2019182993 | | 9/2019 | |
| WO | 2020062036 | | 4/2020 | |
| WO | 2020135680 | | 7/2020 | |
| WO | 2020135708 | | 7/2020 | |
| WO | 2020140058 | | 7/2020 | |
| WO | 2020140061 | | 7/2020 | |
| WO | 2020140064 | | 7/2020 | |
| WO | 2020140067 | | 7/2020 | |

OTHER PUBLICATIONS

Norsic et al., Angew. Chem. Int. Ed., 2015, 54, 4631-4635.
Patil et al., Macromolecular Chemistry and Physics, 2014, pp. 1140-1145, vol. 215.
PCT/US2019/068656, International Search Report and Written Opinion with a mailing date of Apr. 7, 2020.
Prasad et al., Journal of Organometallic Chemistry, 1998, pp. 133-139, vol. 562.
Sawaguchi et al., Macromolecules, 1995, pp. 7973-7978, vol. 28.
Britovsek et al., Angew. Chem. Int. Ed., 2002, pp. 489-491, vol. 41.
Office Action from corresponding Japanese Patent Application: 2021-538065 dated Jan. 24, 2024.

* cited by examiner

CURABLE COMPOSITIONS COMPRISING UNSATURATED POLYOLEFINS

CROSS-REFERENCE TO RELATED APPLICATIONS

The present application claims the benefit of priority to U.S. provisional application Nos. 62/786,084, 62/786,100, 62/786119, and 62/786110, filed on Dec. 28, 2018, which are incorporated herein by reference in their entirety.

FIELD

Embodiments relate to curable compositions that are useful for improved crosslinking.

BACKGROUND

Polyethylene polymers, such as LDPE, are widely used in wire and cable applications. In general, polyethylene-based power cable insulations require a certain amount of cross-linking agent, such as peroxide, to reach a sufficiently high degree of crosslinking. However, this required amount of peroxide directly leads to the production of byproducts (such as methane) that can have a negative effect on the cable performance and must be removed via a time-consuming and costly degassing process. Accordingly, there is a need in the state of the art for novel compositions for cable insulation where the compositions allow for sufficiently high crosslinking with a reduced amount of peroxide such that degassing is not required while also demonstrating industry hot creep requirements. The curable compositions of the present disclosure address this need.

SUMMARY

The present disclosure relates to a curable composition for a cable insulation layer, the curable composition comprising (A) a polyolefin component comprising an unsaturated polyolefin of the formula $A^1L^1$ and/or a telechelic polyolefin of the formula $A^1L^1L^2A^2$ and (B) a curing component comprising a cross-linking agent, wherein:

$L^1$ at each occurrence independently is a polyolefin;

$A^1$ at each occurrence independently is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;

$Y^1$ at each occurrence independently is a $C_1$ to $C_{30}$ hydrocarbyl group;

$L^2$ is a $C_1$ to $C_{32}$ hydrocarbylene group; and $A^2$ is a hydrocarbyl group comprising a hindered double bond.

The curable composition may further comprise (C) an additive component comprising an antioxidant.

DETAILED DESCRIPTION

Definitions

Figure 1A:
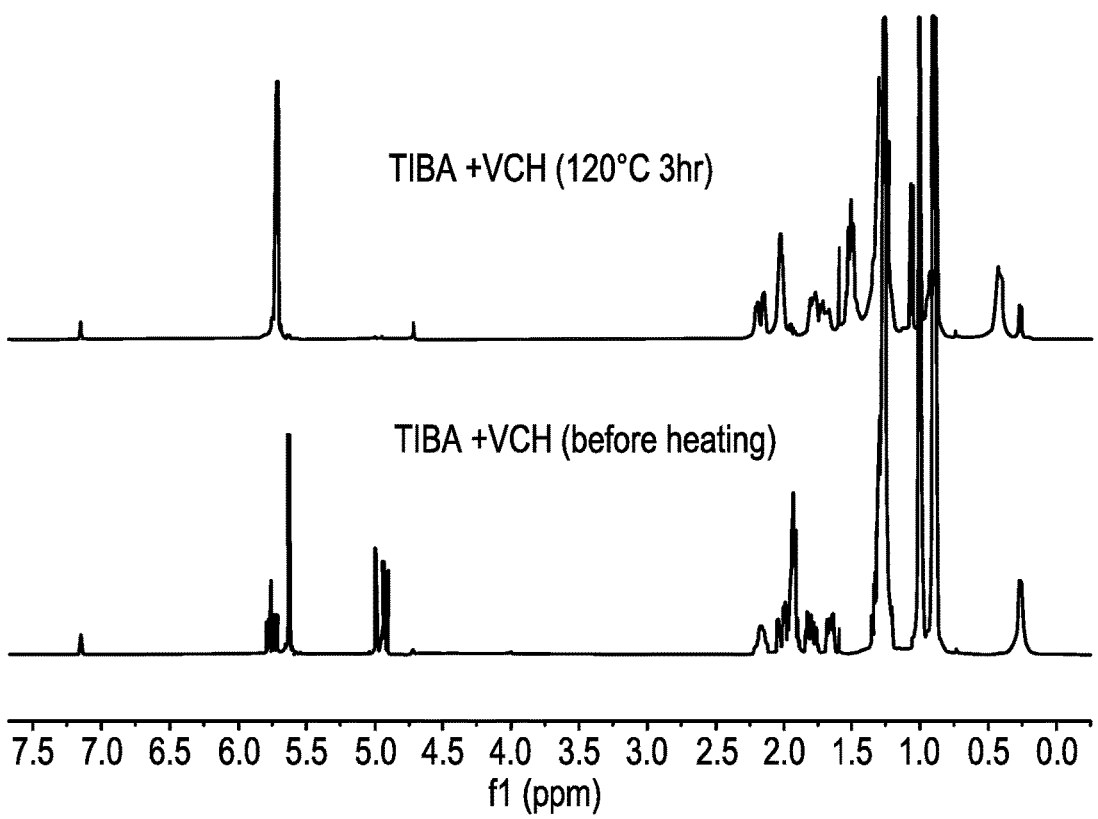
FIGS. 1A and 1B provide the 1H NMR and GC/MS spectra for the synthesis of CTA 1, respectively.

All references to the Periodic Table of the Elements herein shall refer to the Periodic Table of the Elements, published and copyrighted by CRC Press, Inc., 2003. Also, any references to a Group or Groups shall be to the Group or Groups reflected in this Periodic Table of the Elements using the IUPAC system for numbering groups. Unless stated to the contrary, implicit from the context, or customary in the art, all parts and percents are based on weight. For purposes of United States patent practice, the contents of any patent, patent application, or publication referenced herein are hereby incorporated by reference in their entirety (or the equivalent US version thereof is so incorporated by reference) especially with respect to the disclosure of synthetic techniques, definitions (to the extent not inconsistent with any definitions provided herein) and general knowledge in the art.

The numerical ranges disclosed herein include all values from, and including, the lower and upper value. For ranges containing explicit values (e.g., 1, or 2, or 3 to 5, or 6, or 7), any subrange between any two explicit values is included (e.g., 1 to 2; 2 to 6; 5 to 7; 3 to 7; 5 to 6; etc.). The numerical ranges disclosed herein further include the fractions between any two explicit values.

The terms "comprising," "including," "having" and their derivatives are not intended to exclude the presence of any additional component, step or procedure, whether or not the same is specifically disclosed. In order to avoid any doubt, all compositions claimed through use of the term "comprising" may include any additional additive, adjuvant, component, or compound, whether polymeric or otherwise, unless stated to the contrary. In contrast, the term "consisting essentially of" excludes from the scope of any succeeding recitation any other component, step, or procedure, excepting those that are not essential to operability. The term "consisting of" excludes any component, step, or procedure not specifically delineated or listed. The term "or," unless stated otherwise, refers to the listed members individually as well as in any combination.

The term "hindered double bond" refers to a carbon-carbon double bond that cannot readily participate in coordination polymerization. In other words, a hindered double bond has negligible reactivity to participate in coordination polymerization. Examples of hindered double bonds include but are not limited to the double bond of a vinylidene group, the double bond of a vinylene group, the double bond of a trisubstituted alkene, and the double bond of a vinyl group attached to a branched alpha carbon. The term "hindered double bond," as defined herein, excludes the double bonds of strained cyclic olefins that can readily participate in coordination polymerization. As one of ordinary skill in the art would understand, examples of such strained cyclic olefins include but are not limited to norbornene, ethylidene norbornene (ENB), 5-vinyl-2-norbornene (VNB), dicyclopentadiene, norbornadiene, 5-methylene-2-norbomene (MNB), 5-propenyl-2-norbomene, 5-isopropylidene-2-norbornene, 5-(4-cyclopentenyl)-2-norbomene, 5-cyclohexylidene-2-norbornene, etc. The term "hindered double bond," as defined herein, further excludes the double bond of a vinyl group attached to an unbranched alpha carbon.

The term "composition" refers to a mixture of materials or components which comprise the composition. Accordingly, the term "a composition comprising" and similar terms are not intended to exclude the presence of any additional components of the composition, whether or not the same is specifically disclosed.

The term "acyclic" refers to a series of atoms in a polymer or compound where such a series is linear or branched. Accordingly, the term "acyclic hydrocarbyl group" refers to a hydrocarbyl group that is linear or branched.

The term "cyclic" refers to a series of atoms in a polymer or compound where such a series includes one or more rings. Accordingly, the term "cyclic hydrocarbyl group" refers to a hydrocarbyl group that contains one or more rings. A "cyclic hydrocarbyl group," as used herein, may contain acyclic (linear or branched) portions in addition to the one or more rings.

The term "substituted" refers to a substitution of one or more hydrogen atoms with, for example, an alkyl group. The term "unsubstituted" refers to the absence of such a substitution.

The term "heteroatom," as one of ordinary skill in the art would understand, refers to any main group atom that is not carbon or hydrogen. Suitable heteroatoms include but are not limited to nitrogen, oxygen, sulfur, phosphorus, and the halogens.

As used herein, the terms "hydrocarbyl," "hydrocarbyl group," and like terms refer to compounds composed entirely of hydrogen and carbon, including aliphatic, aromatic, acyclic, cyclic, polycyclic, branched, unbranched, saturated, and unsaturated compounds.

The terms "hydrocarbyl," "hydrocarbyl group," "alkyl," "alkyl group," "aryl," "aryl group," "cycloalkene" and like terms are intended to include every possible isomer, including every structural isomer or stereoisomer. The same applies for like terms including but not limited to heterohydrocarbyl, hydrocarbylene, heterohydrocarbylene, alkylene, heteroalkyl, heteroalkylene, arylene, heteroaryl, heteroarylene, cycloalkyl, cycloalkylene, heterocycloalkyl, and heterocycloalkylene.

The term "endocyclic double bond" refers to a double bond between two carbon atoms that are members of a ring. The term "exocyclic double bond" refers to a double bond between two carbon atoms where only one of the carbon atoms is a member of a ring.

"Active catalyst," "active catalyst composition," and like terms refer to a transition metal compound that is, with or without a co-catalyst, capable of polymerization of unsaturated monomers. An active catalyst may be a "procatalyst" that becomes active to polymerize unsaturated monomers without a co-catalyst. Alternatively, an active catalyst may a "procatalyst" that becomes active, in combination with a co-catalyst, to polymerize unsaturated monomers.

The term "procatalyst" is used interchangeably with "catalyst," "precatalyst," "catalyst precursor," "transition metal catalyst," "transition metal catalyst precursor," "polymerization catalyst," "polymerization catalyst precursor," "transition metal complex," "transition metal compound," "metal complex," "metal compound," "complex," "metal-ligand complex," and like terms.

"Co-catalyst" refers to a compound that can activate certain procatalysts to form an active catalyst capable of polymerization of unsaturated monomers. The term "co-catalyst" is used interchangeably with "activator" and like terms.

"Polymer" refers to a compound prepared by polymerizing monomers, whether of the same or a different type. The generic term "polymer" thus embraces the term "homopolymer" that refers to polymers prepared from only one type of monomer and the terms "interpolymer" or "copolymer" as defined herein. Trace amounts of impurities, for example, catalyst residues, may be incorporated into and/or within the polymer.

"Interpolymer" or "copolymer" refer to a polymer prepared by polymerizing at least two different types of monomers. These generic terms include both polymers prepared from two different types of monomers and polymers prepared from more than two different types of monomers (e.g., terpolymers, tetrapolymers, etc.). These generic terms embrace all forms of interpolymers or copolymers, such as random, block, homogeneous, heterogeneous, etc.

An "ethylene-based polymer" or "ethylene polymer" is a polymer that contains a majority amount (greater than 50 wt %) of polymerized ethylene, based on the weight of the polymer, and, optionally, may further contain polymerized units of at least one comonomer. An "ethylene-based interpolymer" is an interpolymer that contains, in polymerized form, a majority amount (greater than 50 wt %) of ethylene, based on the weight of the interpolymer, and further contains polymerized units of at least one comonomer. Preferably, the ethylene-based interpolymer is a random interpolymer (i.e., comprises a random distribution of its monomeric constituents). An "ethylene homopolymer" is a polymer that comprises repeating units derived from ethylene but does not exclude residual amounts of other components.

A "propylene-based polymer" or "propylene polymer" is a polymer that contains a majority amount (greater than 50 wt %) of polymerized propylene, based on the weight of the polymer, and, optionally, may further contain polymerized units of at least one comonomer. A "propylene-based interpolymer" is an interpolymer that contains, in polymerized form, a majority amount (greater than 50 wt %) of propylene, based on the weight of the interpolymer, and further contains polymerized units of at least one comonomer. Preferably, the propylene-based interpolymer is a random interpolymer (i.e., comprises a random distribution of its monomeric constituents). A "propylene homopolymer" is a polymer that comprises repeating units derived from propylene but does not exclude residual amounts of other components.

An "ethylene/alpha-olefin interpolymer" is an interpolymer that contains a majority amount (greater than 50 wt %) of polymerized ethylene, based on the weight of the interpolymer, and further contains polymerized units of at least one alpha-olefin. Preferably, the ethylene/alpha-olefin interpolymer is a random interpolymer (i.e., comprises a random distribution of its monomeric constituents). An "ethylene/alpha-olefin copolymer" is a copolymer that contains a majority amount (greater than 50 wt %) of polymerized ethylene, based on the weight of the copolymer, and further contains polymerized units of an alpha-olefin. Preferably, the ethylene/alpha-olefin copolymer is a random copolymer (i.e., comprises a random distribution of its monomeric constituents).

A "propylene/alpha-olefin interpolymer" is an interpolymer that contains a majority amount (greater than 50 wt %) of polymerized propylene, based on the weight of the interpolymer, and further contains polymerized units of at least one alpha-olefin. Preferably, the propylene/alpha-olefin interpolymer is a random interpolymer (i.e., comprises a random distribution of its monomeric constituents). A "propylene/alpha-olefin copolymer" is an interpolymer that contains a majority amount (greater than 50 wt %) of polymerized propylene, based on the weight of the copolymer, and further contains polymerized units of an alpha-olefin. Preferably, the propylene/alpha-olefin copolymer is a random copolymer (i.e., comprises a random distribution of its monomeric constituents).

"Polyolefin" refers to a polymer produced from olefin monomers, where an olefin monomer (also called an alkene) is a linear, branched, or cyclic compound of carbon and hydrogen having at least one double bond.

The terms "chain transfer agent component" and "chain transfer agent" as used herein, refers to a compound or mixture of compounds that is capable of causing reversible or irreversible polymeryl exchange with active catalyst sites. Irreversible chain transfer refers to a transfer of a growing polymer chain from the active catalyst to the chain transfer agent that results in termination of polymer chain growth. Reversible chain transfer refers to transfers of growing polymer chain back and forth between the active catalyst and the chain transfer agent.

The term "olefin block copolymer" or "OBC" refers to an ethylene/alpha-olefin multi-block interpolymer and includes ethylene and one or more copolymerizable alpha-olefin comonomers in polymerized form, characterized by multiple blocks or segments of two or more (preferably three or more) polymerized monomer units, the blocks or segments differing in chemical or physical properties. Specifically, the term "olefin block copolymer" refers to a polymer comprising two or more (preferably three or more) chemically distinct regions or segments (referred to as "blocks") joined in a linear manner, that is, a polymer comprising chemically differentiated units which are joined (covalently bonded) end-to-end with respect to polymerized functionality, rather than in pendent or grafted fashion. The blocks differ in the amount or type of comonomer incorporated therein, the density, the amount of crystallinity, the type of crystallinity (e.g., polyethylene versus polypropylene), the crystallite size attributable to a polymer of such composition, the type or degree of tacticity (isotactic or syndiotactic), region-regularity or region-irregularity, the amount of branching, including long chain branching or hyper-branching, the homogeneity, and/or any other chemical or physical property. The block copolymers are characterized by unique distributions of both polymer polydispersity (PDI or Mw/Mn) and block length distribution, e.g., based on the effect of the use of a shuttling agent(s) in combination with catalyst systems. Non-limiting examples of the olefin block copolymers of the present disclosure, as well as the processes for preparing the same, are disclosed in U.S. Pat. Nos. 7,858,706 B2, 8,198,374 B2, 8,318,864 B2, 8,609,779 B2, 8,710,143 B2, 8,785,551 B2, and 9,243,090 B2, which are all incorporated herein by reference in their entirety.

The term "block composite" ("BC") refers to a polymer comprising three polymer components: (i) an ethylene-based polymer (EP) having an ethylene content from 10 mol % to 90 mol % (a soft copolymer), based on the total moles of polymerized monomer units in the ethylene-based polymer (EP); (ii) an alpha-olefin-based polymer (AOP) having an alpha-olefin content of greater than 90 mol % (a hard copolymer), based on the total moles of polymerized monomer units in the alpha-olefin-based polymer (AOP); and (iii) a block copolymer (diblock copolymer) having an ethylene block (EB) and an alpha-olefin block (AOB); wherein the ethylene block of the block copolymer is the same composition as the EP of component (i) of the block composite and the alpha-olefin block of the block copolymer is the same composition as the AOP of component (ii) of the block composite. Additionally, in the block composite, the compositional split between the amount of EP and AOP will be essentially the same as that between the corresponding blocks in the block copolymer. Non-limiting examples of the block composites of the present disclosure, as well as processes for preparing the same, are disclosed in U.S. Pat. Nos. 8,686,087 and 8,716,400, which are incorporated herein by reference in their entirety.

The term "specified block composite" ("SBC") refers to a polymer comprising three polymer components: (i) an ethylene-based polymer (EP) having an ethylene content from 78 mol % to 90 mol % (a soft copolymer), based on the total moles of polymerized monomer units in the ethylene-based polymer (EP); (ii) an alpha-olefin-based polymer (AOP) having an alpha-olefin content of from 61 mol % to 90 mol % (a hard copolymer), based on the total moles of polymerized monomer units in the alpha-olefin-based polymer (AOP); and (iii) a block copolymer (diblock copolymer) having an ethylene block (EB) and an alpha-olefin block (AOB); wherein the ethylene block of the block copolymer is the same composition as the EP of component (i) of the specified block composite and the alpha-olefin block of the block copolymer is the same composition as the AOP of component (ii) of the specified block composite. Additionally, in the specified block composite, the compositional split between the amount of EP and AOP will be essentially the same as that between the corresponding blocks in the block copolymer. Non-limiting examples of the specified block composites of the present disclosure, as well as processes for preparing the same, are disclosed in WO 2017/044547, which is incorporated herein by reference in its entirety.

The term "crystalline block composite" ("CBC") refers to polymers comprising three components: (i) a crystalline ethylene based polymer (CEP) having an ethylene content of greater than 90 mol %, based on the total moles of polymerized monomer units in the crystalline ethylene based polymer (CEP); (ii) a crystalline alpha-olefin based polymer (CAOP) having an alpha-olefin content of greater than 90 mol %, based on the total moles of polymerized monomer units in the crystalline alpha-olefin based copolymer (CAOP); and (iii) a block copolymer comprising a crystalline ethylene block (CEB) and a crystalline alpha-olefin block (CAOB); wherein the CEB of the block copolymer is the same composition as the CEP of component (i) of the crystalline block composite and the CAOB of the block copolymer is the same composition as the CAOP of component (ii) of the crystalline block composite. Additionally, in the crystalline block composite, the compositional split between the amount of CEP and CAOP will be essentially the same as that between the corresponding blocks in the block copolymer. Non-limiting examples of the crystalline block composites of the present disclosure, as well as the processes for preparing the same, are disclosed in U.S. Pat. No. 8,822,598 B2 and WO 2016/01028961 A1, which are incorporated herein by reference in its entirety.

The term "crystalline" refers to a polymer that possesses a first order transition or crystalline melting point (Tm) as determined by differential scanning calorimetry (DSC) or equivalent techniques. The term may be used interchangeably with the term "semicrystalline." The term "amorphous" refers to a polymer lacking a crystalline melting point as determined by differential scanning calorimetry (DSC) or equivalent technique.

(A) Polyolefin Component

In certain embodiments, the curable composition of the present disclosure may comprise from 5 wt % to 99.9 wt % (such as from 25 wt % to 99.9 wt %, or from 50 wt % to 99.9 wt %, or from 80 wt % to 99.9 wt %, or from 90 wt % to 99.9 wt %, or from 95 wt % to 99.99 wt %) of the (A) polyolefin component, based on the total weight of the curable composition.

In certain embodiments, the (A) polyolefin component comprises an unsaturated polyolefin of the formula $A^1L^1$. In certain embodiments, the (A) polyolefin component comprises a telechelic polyolefin of the formula $A^1L^1L^2A^2$. In further embodiments, the (A) polyolefin component comprises an unsaturated polyolefin of the formula $A^L$ and a telechelic polyolefin of the formula $A^1L^1L^2A^2$. In further embodiments, the (A) polyolefin component comprises an unsaturated polyolefin of the formula $A^1L^1$ and a telechelic polyolefin of the formula $A^1L^1L^2A^2$, wherein the (A) polyolefin component comprises a ratio of the unsaturated polyolefin of the formula $A^1L^1$ to the telechelic polyolefin of the formula $A^1L^1L^2A^2$ of from 1:99 to 99:1, or from 10:90 to 90:10, or from 20:80 to 80:20, or from 30:70 to 70:30, or from 40:60 to 60:40, or 50:50.

As discussed further below, the (A) polyolefin component may further comprise polymers other than the unsaturated polyolefin of the formula $A^1L^1$ and the telechelic polyolefin of the formula $A^1L^1L^2A^2$, such as ethylene-based polymers. Examples of ethylene-based polymers include but are not limited to polyethylene polymers, such as low-density polyethylene (LDPE). These polyethylene polymers have low or no unsaturations.

As one of ordinary skill in the art would understand in view of the formula $A^1L^1L^2A^2$, $A^1$ is covalently bonded to $L^1$ through a carbon-carbon single bond, $L^1$ is covalently bonded to $L^2$ through a carbon-carbon single bond, and $L^2$ is covalently bonded to $A^2$ through a carbon-carbon single bond. Accordingly, when it is stated herein that $L^1$ of the formula $A^1L^1L^2A^2$ is a polyolefin, it is understood that $L^1$ is a divalent polyolefinyl group (a polyolefin missing two hydrogens) that is covalently bonded to each of the $A^1$ and $L^2$ groups through carbon-carbon single bonds. Likewise, when it is stated that $L^1$ of the formula $A^1L^1L^2A^2$ is a polymer, it is understood that $L^1$ is a divalent polymeryl group (a polymer missing two hydrogens) that is covalently bonded to each of the $A^1$ and $L^2$ groups through carbon-carbon single bonds. For example, when it is stated that $L^1$ is an ethylene homopolymer, it is understood that $L^1$ is a divalent ethylene homopolymeryl group (an ethylene homopolymer missing two hydrogens) that is covalently bonded to each of the $A^1$ and $L^2$ groups through carbon-carbon single bonds. As a further example, when it is stated that $L^1$ is an ethylene/alpha-olefin copolymer, it is understood that $L^1$ is a divalent ethylene/alpha-olefin copolymeryl group (an ethylene/alpha-olefin copolymer missing two hydrogens) that is covalently bonded to each of the $A^1$ and $L^2$ groups through carbon-carbon single bonds.

Similarly, as one of ordinary skill in the art would understand in view of the formula $A^1L^1$, $A^1$ is covalently bonded to $L^1$ through a carbon-carbon single bond. Accordingly, wherein it is stated herein that $L^1$ of the formula $A^1L^1$ is a polyolefin, it is understood that $L^1$ is a polyolefinyl group (a polyolefin missing one hydrogen) that is covalently bonded to the $A^1$ group through a carbon-carbon single bond.

$L^1$ at each occurrence independently is a polyolefin resulting from the coordination polymerization of unsaturated monomers (and comonomers). Examples of suitable monomers (and comonomers) include but are not limited to ethylene and alpha-olefins of 3 to 30 carbon atoms, preferably 3 to 20 carbon atoms, such as propylene, 1-butene, 1-pentene, 3-methyl-1-butene, 1-hexene, 4-methyl-1-pentene, 3-methyl-1-pentene, 3,5,5-trimethyl-1-hexene, 1-octene, 1-decene, 1-dodecene, 1-tetradecene, 1-hexadecene, 5-ethyl-1-nonene, 1-octadecene and 1-eicosene; conjugated or nonconjugated dienes, such as butadiene, isoprene, 4-methyl-1,3-pentadiene, 1,3-pentadiene, 1,4-pentadiene, 1,5-hexadiene, 1,4-hexadiene, 1,3-hexadiene, 1,5-heptadiene, 1,6-heptadiene, 1,3-octadiene, 1,4-octadiene, 1,5-octadiene, 1,6-octadiene, 1,7-octadiene, 1,9-decadiene, 7-methyl-1,6-octadiene, 4-ethylidene-8-methyl-1,7-nonadiene, and 5,9-dimethyl-1,4,8-decatriene, 5-methyl-1,4-hexadiene, 3,7-dimethyl-1,6-octadiene, 3,7-dimethyl-1,7-octadiene, and mixed isomers of dihydromyrcene and dihydroocimene; norbornene and alkenyl, alkylidene, cycloalkenyl and cycloalkylidene norbornenes, such as 5-ethylidene-2-norbornene, 5-vinyl-2-norbornene, dicyclopentadiene, 5-methylene-2-norbornene, 5-propenyl-2-norbornene, 5-isopropylidene-2-norbornene, 5-(4-cyclopentenyl)-2-norbornene, 5-cyclohexylidene-2-norbornene, and norbornadiene; and aromatic vinyl compounds such as styrenes, mono or poly alkylstyrenes (including styrene, o-methylstyrene, t-methylstyrene, m-methylstyrene, p-methylstyrene, o,p-dimethylstyrene, o-ethylstyrene, m-ethylstyrene and p-ethylstyrene).

$L^1$ may be linear (unbranched), branched, or cyclic. The presence or absence of branching in $L^1$, and the amount of branching (if branching is present), can vary widely and may depend on the desired processing conditions and the desired polymer properties. If branching is present in $L^1$, the branching may be short chain branching or long chain branching. Exemplary types of long chain branching that may be present in $L^1$ include but are not limited to T-type branching and H-type branching. Accordingly, in some embodiments, $L^1$ may comprise long chain branching. In other words, in some embodiments, $L^1$ may comprise one or more long chain branches, wherein each long chain branch optionally comprises an $A^2$ group as defined herein.

In some embodiments, the $A^1$ group of each of the formulas $A^1L^1$ and $A^1L^1L^2A^2$ correlates to the last inserted monomer or comonomer based on the coordination polymerization of monomers and comonomers to form $L^1$. Accordingly, the selection of the monomers and comonomers for the coordination polymerization of $L^1$ will indicate what the $A^1$ group and the $Y^1$ group may be. In some embodiments, the $A^1$ group is a vinyl group. In some embodiments, the $A^1$ group is a vinylidene group of the formula $CH_2=C(Y^1)-$, wherein $Y^1$ is a $C_1$ to $C_{30}$ hydrocarbyl group. In some embodiments, the $A^1$ group is a vinylene group of the formula $Y^1CH=CH-$, wherein $Y^1$ is a $C_1$ to $C_{30}$ hydrocarbyl group. In some embodiments, the $A^1$ group is a mixture of a vinyl group and a vinylene group of the formula $Y^1CH=CH-$, wherein $Y^1$ is a $C_1$ to $C_{30}$ hydrocarbyl group. In some embodiments, the $A^1$ group is a mixture of a vinyl group and a vinylidene group of the formula $CH_2=C(Y^1)-$, wherein $Y^1$ is a $C_1$ to $C_{30}$ hydrocarbyl group. In some embodiments, the $A^1$ group is a mixture of a vinylidene group of the formula $CH_2=C(Y^1)-$ and a vinylene group of the formula $Y^1CH=CH-$, wherein $Y^1$ is a $C_1$ to $C_{30}$ hydrocarbyl group. In some embodiments, the $A^1$ group is a mixture of a vinyl group, a vinylidene group of the formula $CH_2=C(Y^1)-$, and a vinylene group of the formula $Y^1CH=CH-$, wherein $Y^1$ is a $C_1$ to $C_{30}$ hydrocarbyl group.

In further embodiments, the $A^1$ group is a mixture of a vinyl group and a vinylene group of the formula $Y^1CH=CH—$, wherein $A^1$ comprises a ratio of the vinyl group to the vinylene group of the formula $Y^1CH=CH—$ of from 0.99:0.01 to 0.01:0.99, and wherein $Y^1$ is a $C_1$ to $C_{30}$ hydrocarbyl group.

In further embodiments, the $A^1$ group is a mixture of a vinyl group and a vinylidene group of the formula $CH_2=C(Y^1)—$, wherein $A^1$ comprises a ratio of the vinyl group to the vinylidene group of the formula $CH_2=C(Y^1)—$ of from 0.99:0.01 to 0.01:0.99, and wherein $Y^1$ is a $C_1$ to $C_{30}$ hydrocarbyl group.

In further embodiments, the $A^1$ group is a mixture of a vinylidene group of the formula $CH_2=C(Y^1)—$ and a vinylene group of the formula $Y^1CH=CH—$, wherein $A^1$ comprises a ratio of the vinylidene group of the formula $CH_2=C(Y^1)—$ to the vinylene group of the formula $Y^1CH=CH—$ of from 0.99:0.01 to 0.01:0.99, and wherein $Y^1$ is a $C_1$ to $C_{30}$ hydrocarbyl group.

In further embodiments, the $A^1$ group is a mixture of a vinyl group, a vinylidene group of the formula $CH_2=C(Y^1)—$, and a vinylene group of the formula $Y^1CH=CH—$, wherein $A^1$ comprises a ratio of the vinyl group to the sum of the vinylene group of the formula $Y^1CH=CH—$, the vinylidene group of the formula $CH_2=C(Y^1)—$, and the vinyl group of from 0.99:0.01 to 0.01:0.99, and wherein $Y^1$ is a $C_1$ to $C_{30}$ hydrocarbyl group.

In certain embodiments, $L^1$ is a homopolymer comprising units derived from one monomer. The monomer may be selected from any of the suitable monomers discussed previously. In further embodiments, $L^1$ is an ethylene homopolymer comprising units derived from ethylene. In further embodiments, $L^1$ is a propylene homopolymer comprising units derived from propylene.

In some embodiments, $L^1$ is an interpolymer comprising units derived from at least two different types of monomers, such as a monomer and a comonomer. Accordingly, in certain embodiments, $L^1$ is an interpolymer comprising units derived from a monomer and at least one comonomer that is different from the monomer. Each of the monomer and the at least one comonomer that is different from the monomer may be selected from any of the suitable monomers discussed previously.

In further embodiments, $L^1$ is a copolymer comprising units derived from two different types of monomers, such as a monomer and a comonomer. Accordingly, in certain embodiments, $L^1$ is a copolymer comprising units derived from a monomer and a comonomer that is different from the monomer. Each of the monomer and the comonomer may be selected from any of the suitable monomers discussed previously.

In certain embodiments, $L^1$ is an ethylene/alpha-olefin copolymer. In some embodiments, $L^1$ is an ethylene/alpha-olefin copolymer comprising units derived from ethylene and a $C_3$ to $C_{30}$ alpha-olefin, wherein each of the polyolefins of the formulas $A^1L^1$ and $A^1L^1L^2A^2$ comprises an amount of ethylene that is greater than or equal to 50 wt %, or greater than or equal to 60 wt %, or greater than or equal to 70 wt %, or greater than or equal to 75 wt %, or greater than or equal to 80 wt %, or greater than or equal to 85 wt %, or greater than or equal to 88 wt %, or greater than or equal to 89 wt %, or greater than or equal to 90 wt %, based on the total weight of each of the polyolefins of the formulas $A^1L^1$ and $A^1L^1L^2A^2$. The $C_3$ to $C_{30}$ alpha-olefin may be selected from any of the suitable alpha-olefins discussed previously. In certain embodiments, the $C_3$ to $C_{30}$ alpha-olefin may be propylene, isobutylene, 1-butene, 1-hexene, 1-pentene, 4-methyl-1-pentene, 1-heptene, 1-octene, 1-nonene, 1-decene, or the like. In some embodiments, $L^1$ is an ethylene/alpha-olefin copolymer comprising units derived from ethylene and a $C_3$ to $C_{30}$ alpha-olefin, wherein the $C_3$ to $C_{30}$ alpha-olefin is selected from the group consisting of propylene, 1-butene, 1-hexene, and 1-octene.

In further embodiments, $L^1$ is a propylene/alpha-olefin copolymer. $L^1$ may be a propylene/alpha-olefin copolymer comprising units derived from propylene and either ethylene or a $C_4$ to $C_{30}$ alpha-olefin, wherein each of the polyolefins of the formulas $A^1L^1$ and $A^1L^1L^2A^2$ comprises an amount of propylene that is greater than or equal to 50 wt %, or greater than or equal to 60 wt %, or greater than or equal to 70 wt %, or greater than or equal to 75 wt %, or greater than or equal to 80 wt %, or greater than or equal to 85 wt %, or greater than or equal to 88 wt %, or greater than or equal to 89 wt %, or greater than or equal to 90 wt %, based on the total weight of each of the polyolefins of the formulas $A^1L^1$ and $A^1L^1L^2A^2$. The $C_4$ to $C_{30}$ alpha-olefin may be any of the suitable alpha-olefins discussed above. In certain embodiments, the $C_4$ to $C_{30}$ alpha-olefin may be isobutylene, 1-butene, 1-hexene, 1-pentene, 4-methyl-1-pentene, 1-heptene, 1-octene, 1-nonene, 1-decene, or the like. In certain embodiments, $L^1$ may be a propylene/alpha-olefin copolymer comprising units derived from propylene and either ethylene or a $C_4$ to $C_{30}$ alpha-olefin, wherein the $C_4$ to $C_{30}$ alpha-olefin is selected from the group consisting of 1-butene, 1-hexene, and 1-octene.

In certain embodiments, $L^1$ is a terpolymer comprising units derived from three different types of monomers, each of which may be selected from any of the suitable monomers discussed above. In further embodiments, $L^1$ is a terpolymer comprising ethylene or propylene as a first monomer, a $C_3$ to $C_{30}$ alpha-olefin or styrene as a second monomer, and a diene or polar monomer as a third monomer.

In some embodiments, $L^1$ comprises from 0 to 10 wt % of units derived from diene monomers. For example, $L^1$ may comprise from 1 to 8 wt %, or from 1 to 5 wt %, or from 1 to 3 wt % of units derived from diene monomers. In further embodiments, $L^1$ may be substantially free of units derived from diene monomers. For example, in certain embodiments, $L^1$ may comprise from 0 to 0.2 wt %, or from 0 to 0.01 wt %, or from 0 to 0.001 wt %, or from 0 to 0.0001 wt % of units derived from diene monomers.

In certain embodiments, $L^1$ is an olefin block copolymer as defined herein. In further embodiments, $L^1$ is a block composite, a specified block composite, or a crystalline block composite as defined herein.

In certain embodiments, $L^2$ is $—CH_2CH(Y^2)—$, such that the telechelic polyolefin is $A^1L^1CH_2CH(Y^2)A^2$, wherein $Y^2$ is hydrogen or a $C_1$ to $C_{30}$ hydrocarbyl group. In certain embodiments, the $Y^2$ group is hydrogen. In further embodiments, the $Y^2$ group is a $C_1$ to $C_{10}$ alkyl group, or a $C_1$ to $C_6$ alkyl group, or a $C_1$ to $C_3$ alkyl group. In further embodiments, the $Y^2$ group is an ethyl group.

In some embodiments, $A^2$ is a hydrocarbyl group comprising a hindered double bond. In further embodiments, $A^2$ is a hydrocarbyl group comprising two or more hindered double bonds.

In certain embodiments, due to the hindered double bond, the $A^2$ group is a group that is not readily incorporated by an active catalyst under the process conditions used to make the polyolefin $L^1$, such that direct incorporation of $A^2$ along the backbone chain of $L^1$ is less than or equal to 0.5 mol %, or less than or equal to 0.1 mol %, or is not detected, as determined by the $^{13}C$ NMR method described herein or similar $^{13}C$ NMR methods.

In some embodiments, $A^2$ is a hydrocarbyl group comprising a hindered double bond, wherein the hindered double bond is selected from the group consisting of the double bond of a vinylidene group, the double bond of a vinylene group, the double bond of a trisubstituted alkene, and the double bond of a vinyl group attached to a branched alpha carbon.

In further embodiments, $A^2$ is a hydrocarbyl group comprising two or more hindered double bonds, wherein each hindered double bond is independently selected from the group consisting of the double bond of a vinylidene group, the double bond of a vinylene group, the double bond of a trisubstituted alkene, and the double bond of a vinyl group attached to a branched alpha carbon.

In certain embodiments, $A^2$ is a hydrocarbyl group comprising a functional group, wherein the functional group is selected from the group consisting of a vinylidene group, a vinylene group, a trisubstituted alkene, and a vinyl group attached to a branched alpha carbon.

In further embodiments, $A^2$ is a hydrocarbyl group comprising two or more functional groups, wherein each functional group is independently selected from the group consisting of a vinylidene group, a vinylene group, a trisubstituted alkene, and a vinyl group attached to a branched alpha carbon.

The $A^2$ group may be a cyclic or acyclic (linear or branched) hydrocarbyl group. If $A^2$ is a cyclic hydrocarbyl group, $A^2$ may comprise one or more rings, wherein each ring may be a monocyclic, bicyclic, or polycyclic ring, and wherein each ring may comprise one or more hindered double bonds.

Furthermore, if $A^2$ is a cyclic hydrocarbyl group, each hindered double bond or functional group therein may be an endocyclic double bond, an exocyclic double bond, or an acyclic double bond. For example, $A^2$ may be a cyclic hydrocarbyl group comprising a vinylene group, wherein the double bond of the vinylene group may be an endocyclic double bond or an acyclic double bond. In further embodiments, $A^2$ may be a cyclic hydrocarbyl group comprising a vinylidene group, wherein the double bond of the vinylidene group may be an exocyclic double bond or an acyclic double bond. In further embodiments, $A^2$ may be a cyclic hydrocarbyl group comprising a trisubstituted alkene, wherein the double bond of the trisubstituted alkene may be an endocyclic double bond, an exocyclic double bond, or an acyclic double bond. In further embodiments, $A^2$ may be a cyclic hydrocarbyl group comprising a vinyl group attached to a branched alpha carbon, wherein the vinyl group attached to a branched alpha carbon is an acyclic double bond.

In any of the embodiments described herein, $A^2$ may comprise from 3 to 30 carbon atoms, or from 3 to 25 carbon atoms, or from 3 to 20 carbon atoms, or from 3 to 15 carbon atoms, or from 3 to 10 carbon atoms, or from 3 to 9 carbon atoms, or from 3 to 8 carbon atoms, or from 3 to 7 carbon atoms, or from 3 to 6 carbon atoms, or from 3 to 5 carbon atoms, or from 3 to 4 carbon atoms, or 3 carbon atoms.

In certain embodiments, $A^2$ is a $C_3$ to $C_{30}$ cyclic hydrocarbyl group comprising an alkyl-substituted or unsubstituted cycloalkene. In further embodiments, $A^2$ is an alkyl-substituted or unsubstituted cycloalkene comprising from 3 to 30 carbon atoms, or from 3 to 25 carbon atoms, or from 3 to 20 carbon atoms, or from 3 to 15 carbon atoms, or from 3 to 10 carbon atoms, or from 3 to 9 carbon atoms, or from 3 to 8 carbon atoms, or from 3 to 7 carbon atoms, or from 3 to 6 carbon atoms.

Exemplary unsubstituted cycloalkenes include but are not limited to cyclohexene, cycloheptene, cyclooctene, 1,3-cyclohexadiene, 1,4-cyclohexadiene, and 1,5-cyclooctadiene. Exemplary alkyl-substituted cycloalkenes include but are not limited to alkyl-substituted cyclohexene, alkyl-substituted cycloheptene, alkyl-substituted cyclooctene, alkyl-substituted 1,3-cyclohexadiene, alkyl-substituted 1,4-cyclohexadiene, and alkyl-substituted 1,5-cyclooctadiene.

In some embodiments, $A^2$ is a methyl-substituted or unsubstituted cycloalkene selected from the group consisting of a methyl-substituted or unsubstituted cyclohexene, a methyl-substituted or unsubstituted cycloheptene, and a methyl-substituted or unsubstituted cyclooctene. In some embodiments, $A^2$ is a methyl-substituted or unsubstituted cyclohexene.

In some embodiments, $A^2$ is a $C_1$ to $C_{10}$ acyclic alkyl group, or a $C_3$ to $C_{10}$ acyclic alkyl group, or a $C_4$ to $C_8$ acyclic alkyl group.

Exemplary $A^2$ groups include but are not limited to the following:

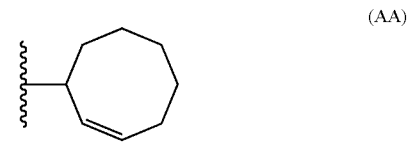

(AA)

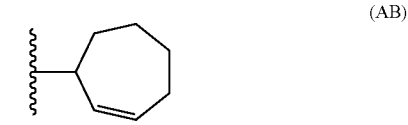

(AB)

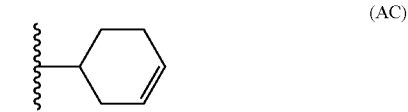

(AC)

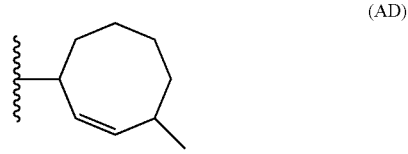

(AD)

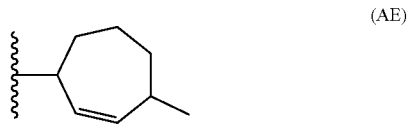

(AE)

(AF)

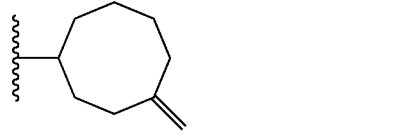

(AG)

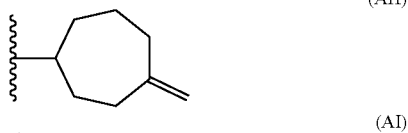

(AH)

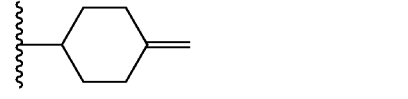

(AI)

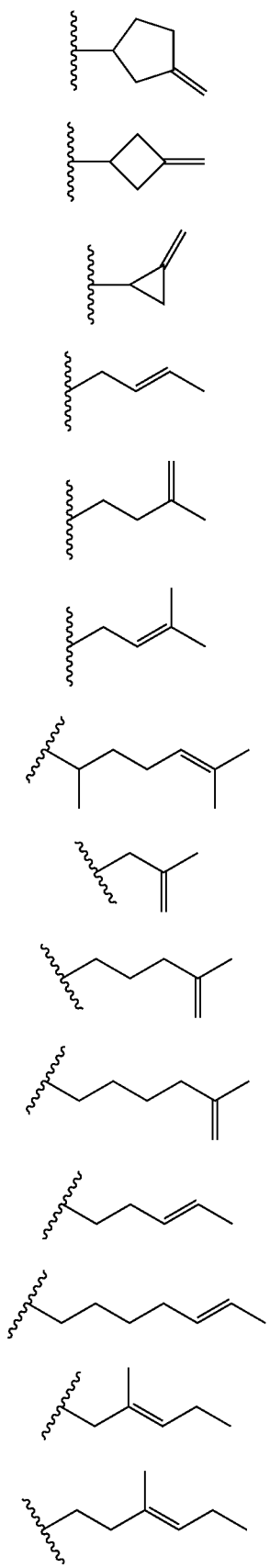
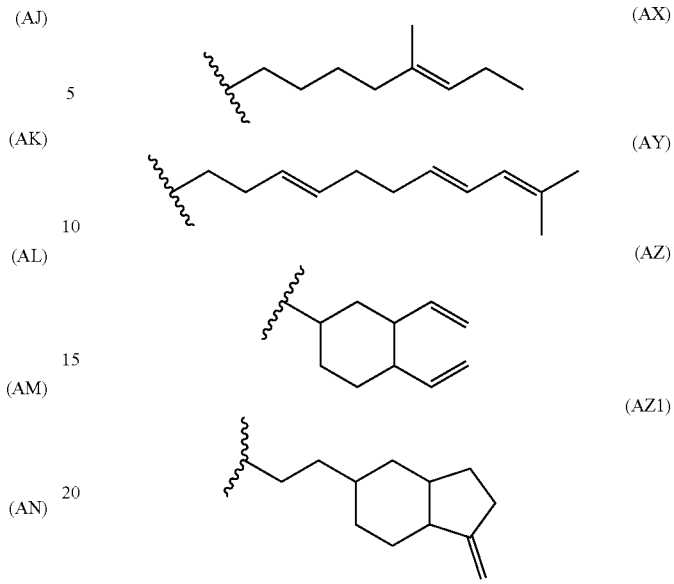

With regard to each of (AA) to (AZ) and (AZ1), the ⌇ symbol (squiggly line symbol) denotes the point of connection to $L^2$ in the formula $A^1L^1L^2A^2$, for example, the point of connection to the carbon attached to a hydrogen, "$Y^2$," and "$A^1L^1CH_2$" in the formula $A^1L^1CH_2CH(Y^2)A^2$. In addition, with regard to each of (AA) to (AZ) and (AZ1), the ⌇ symbol (squiggly line symbol) denotes the point of connection to the carbon attached to a hydrogen and $Y^2$ in the chain transfer agent formulas of $Al(CH_2CH(Y^2)A^2)_3$ and $Zn(CH_2CH(Y^2)A^2)_2$ discussed below.

With regard to each of (AA) to (AF), the endocyclic double bond may be between any two adjacent carbon atoms that are ring members.

With regard to each of (AD) to (AF), the pendant methyl group may be connected to any carbon atom that is a ring member.

With regard to each of (AG) to (AL), the exocyclic double bond may be connected to any ring member carbon atom that is not already connected to more than two carbon atoms.

In some embodiments, the (A) polyolefin component (or each of the polyolefins of the formulas $A^1L^1$ and $A^1L^1L^2A^2$) comprises or has, in accordance with the GPC method described herein or similar GPC methods, a weight average molecular weight (Mw) of from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol, or from 1,000 to 250,000 g/mol.

In some embodiments, the (A) polyolefin component (or each of the polyolefins of the formulas $A^1L^1$ and $A^1L^1L^2A^2$) comprises or has, in accordance with the GPC method described herein or similar GPC methods, a number average molecular weight (Mn) of from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol, or from 1,000 to 250,000 g/mol.

In some embodiments, the (A) polyolefin component (or each of the polyolefins of the formulas $A^1L^1$ and $A^1L^1L^2A^2$) comprises or has, in accordance with the GPC method described herein or similar GPC methods, an average molar mass (Mz) of from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol, or from 5,000 to 500,000 g/mol, or from 10,000 to 500,000 g/mol.

In some embodiments, the (A) polyolefin component (or each of the polyolefins of the formulas $A^1L^1$ and $A^1L^1L^2A^2$) comprises or has, in accordance with the GPC method described herein or similar GPC methods, a Mw/Mn (PDI) of from 1 to 10, or from 1 to 7, or from 1 to 5, or from 1.5 to 4, or from 2 to 4.

In some embodiments, the (A) polyolefin component (or each of the polyolefins of the formulas $A^1L^1$ and $A^1L^1L^2A^2$) comprises or has, in accordance with ASTM D-792, Method B, a density of from 0.850 to 0.965 g/cc, or from 0.854 to 0.950 g/cc, or from 0.854 to 0.935 g/cc, or from 0.854 to 0.925 g/cc, or from 0.854 to 0.910 g/cc, or from 0.854 to 0.900 g/cc, or from 0.854 to 0.885 g/cc, or from 0.854 to 0.880 g/cc, or from 0.854 to 0.875 g/cc.

In some embodiments, the (A) polyolefin component (or each of the polyolefins of the formulas $A^1L^1$ and $A^1L^1L^2A^2$) comprises or has, in accordance with ASTM D-1238, condition 190° C./2.16 kg, a melt index (I2) of from 0.01 to 2000 g/10 minutes, or from 0.01 to 1,500 g/10 minutes, or from 0.01 to 1,000 g/10 minutes, or from 0.01 to 500 g/10 minutes, or from 0.01 to 100 g/10 minutes, or from 0.5 to 50 g/10 minutes, or from 0.5 to 30 g/10 minutes.

In some embodiments, the (A) polyolefin component (or each of the polyolefins of the formulas $A^1L^1$ and $A^1L^1L^2A^2$) comprises or has, in accordance with the DSC method described herein or similar DSC methods, a Tm in the range of from −25° C. to 165° C., or from −25° C. to 150° C., or from −25° C. to 125° C., or from −25° C. to 100° C., or from 0° C. to 80° C., or from 10° C. to 60° C.

In some embodiments, the (A) polyolefin component (or each of the polyolefins of the formulas $A^1L^1$ and $A^1L^1L^2A^2$) comprises or has, in accordance with ASTM D-3236, a Brookfield viscosity (as measured at 177° C.) of from 10 to $10^8$ cP, or from 10 to $10^7$ cP, or from 10 to $10^6$ cP, or from 10 to 750,000 cP, or from 10 to 500,000 cP, or from 10 to 250,000 cP, or from 10 to 100,000 cP, or from 10 to 75,000 cP, or from 10 to 50,000 cP, or from 10 to 40,000 cP.

In some embodiments, the (A) polyolefin component (or each of the polyolefins of the formulas $A^1L^1$ and $A^1L^1L^2A^2$) comprises or has, in accordance with the DSC method described herein or similar DSC methods, an enthalpy of melting (ΔHm) of from 0 to 235 J/g, or from 0 to 200 J/g, or from 10 to 175 J/g, or from 10 to 150 J/g, or from 10 to 125 J/g, or from 20 to 117 J/g.

In some embodiments, the (A) polyolefin component (or each of the polyolefins of the formulas $A^1L^1$ and $A^1L^1L^2A^2$) comprises or has, in accordance with the DSC method described herein or similar DSC methods, a wt % crystallinity of from 0 to 80%, or from 0 to 60%, or from 5 to 50%, or from 7 to 40%, based on PE ΔHm of 292 J/g.

In some embodiments, the (A) polyolefin component (or each of the polyolefins of the formulas $A^1L^1$ and $A^1L^1L^2A^2$) comprises or has, in accordance with the DSC method described herein or similar DSC methods, a $T_g$ of from −80 to 100° C., or from −80 to 75° C., or from −80 to 50° C., or from −80 to 25° C., or from −80 to 0° C., or from −80 to −15° C., or from −70 to −30° C.

In some embodiments, $L^1$ is substantially free of units derived from diene monomers, and the polyolefin of the formula $A^1L^1$ comprises a total number of unsaturations of equal to or greater than 0.6, or equal to or greater than 0.7, or equal to or greater than 0.8, or equal to or greater than 0.9, or equal to or greater than 1.0, or equal to or greater than 1.1, or equal to or greater than 1.2, or equal to or greater than 1.3; and the polyolefin of the formula $A^1L^1L^2A^2$ comprises a total number of unsaturations of equal to or greater than 1.1, or equal to or greater than 1.2, or equal to or greater than 1.3, or equal to or greater than 1.4, or equal to or greater than 1.5, or equal to or greater than 1.6, or equal to or greater than 1.7, or equal to or greater than 1.8, or equal to or greater than 1.9. The total number of unsaturations may be defined as (unsaturations/1000 C)*(1000 C/chain)=(unsaturations/1000 C)*(Mn/$M_{CH2}$/1000), where unsaturations/1000 C is measured by $^1$H NMR, Mn is the number average molecular weight as measured by GPC and corrected for composition as measured by $^{13}$C NMR, $M_{CH2}$=14 g/mol. As reported, Mn measured by GPC is the polymer backbone number average molecular weight. Unsaturations/1000 C as measured by 1H NMR is relative to total carbons in the polymer chain. For ethylene, propylene, octene, and ethylidene norbornene there are 2, 3, 8, and 9 total carbon atoms respectively, per 2 backbone carbon atoms. Therefore, the Mn corrected for composition is Mn as measured by GPC times (mol % C2/2+mol % C3/3+mol % C8/8+mol % ENB/9)/2. $^{13}$C NMR, $^1$H NMR, and GPC here refer to the methods described herein or similar methods. "Substantially free," as used here, refers to, for example, $L^1$ comprising from 0 to 0.001 wt % of units derived from diene monomers, based on the total weight of each of the polyolefins of the formulas $A^1L^1$ and $A^1L^1L^2A^2$.

In some embodiments, $L^1$ comprises from 1 to 8 wt %, or from 1 to 5 wt %, or from 1 to 3 wt % of units derived from diene monomers, based on the total weight of each of the polyolefins of the formulas $A^1L^1$ and $A^1L^1L^2A^2$, and the polyolefin of the formula $A^1L^1$ comprises a total number of unsaturations of equal to or greater than ($X^D$+0.6), equal to or greater than ($X^D$+0.7), equal to or greater than ($X^D$+0.8), equal to or greater than ($X^D$+0.9), equal to or greater than ($X^D$+1), equal to or greater than ($X^D$+1.1), equal to or greater than ($X^D$+1.2), or equal to or greater than ($X^D$+1.3), and the polyolefin of the formula $A^1L^1L^2A^2$ comprises a total number of unsaturations of equal to or greater than ($X^D$+1.1), equal to or greater than ($X^D$+1.2), equal to or greater than ($X^D$+1.3), equal to or greater than ($X^D$+1.4), equal to or greater than ($X^D$+1.5), equal to or greater than ($X^D$+1.6), equal to or greater than ($X^D$+1.7), equal to or greater than ($X^D$+1.8), or equal to or greater than ($X^D$+1.9), wherein $X^D$ is the number of unsaturations from the units derived from diene monomers in $L^1$, and wherein unsaturations are measured as described in the previous paragraph.

Preparing the (A) Polyolefin Component

The present disclosure further relates to a process for preparing a polyolefin component comprising an unsaturated polyolefin of the formula $A^1L^1$, the process comprising:

1) combining starting materials comprising (a1) a monomer component, (b1) a chain transfer agent component, and (c1) a catalyst component comprising a procatalyst to form a solution and polymerizing from greater than 10 mol % to less than or equal to 99 mol % of the (a1) monomer component in the solution;
2) heating the solution; and
3) recovering a product comprising the polyolefin component comprising the unsaturated polyolefin of the formula $A^1L^1$, wherein:
   the (b1) chain transfer agent component comprises an aluminum alkyl of the formula Al(d)$_3$, and
   d at each occurrence independently is a $C_1$ to $C_{10}$ alkyl group;
   $L^1$ is a polyolefin;

$A^1$ is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$; and $Y^1$ at each occurrence independently is a $C_1$ to $C_{30}$ hydrocarbyl group.

The present disclosure further relates to a process for preparing a polyolefin component comprising a telechelic polyolefin of the formula $A^1L^1L^2A^2$, the process comprising:

1) combining starting materials comprising (a1) a monomer component, (b1) a chain transfer agent component, and (c1) a catalyst component comprising a procatalyst to form a solution and polymerizing from greater than 10 mol % to less than or equal to 99 mol % of the (a1) monomer component in the solution;
2) heating the solution; and
3) recovering a product comprising the polyolefin component comprising the telechelic polyolefin of the formula $A^1L^1L^2A^2$, wherein:

the (b1) chain transfer agent component comprises an organoaluminum compound of the formula $Al(CH_2CH(Y^2)A^2)_3$;

$L^1$ at each occurrence independently is a polyolefin;

$A^1$ at each occurrence independently is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;

$Y^1$ at each occurrence independently is a $C_1$ to $C_{30}$ hydrocarbyl group; and $L^2$ is a $C_1$ to $C_{32}$ hydrocarbylene group;

$Y^2$ at each occurrence independently is hydrogen or a $C_1$ to $C_{30}$ hydrocarbyl group; and $A^2$ at each occurrence independently is a hydrocarbyl group comprising a hindered double bond.

The present disclosure further relates to a process for preparing a polyolefin component comprising a polyolefin of the formula $A^1L^1$ and a telechelic polyolefin of the formula $A^1L^1L^2A^2$, the process comprising:

1) combining starting materials comprising (a1) a monomer component, (b1) a chain transfer agent component, and (c1) a catalyst component comprising a procatalyst to form a solution and polymerizing from greater than 10 mol % to less than or equal to 99 mol % of the (a1) monomer component in the solution;
2) heating the solution; and
3) recovering a product comprising the polyolefin component comprising the polyolefin of the formula $A^1L^1$ and the telechelic polyolefin of the formula $A^1L^1L^2A^2$, wherein:

the (b1) chain transfer agent component comprises an aluminum alkyl of the formula $Al(d)_3$ and an organoaluminum compound of the formula $Al(CH_2CH(Y^2)A^2)_3$;

d at each occurrence independently is a $C_1$ to $C_{10}$ alkyl group;

$L^1$ at each occurrence independently is a polyolefin;

$A^1$ at each occurrence independently is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;

$Y^1$ at each occurrence independently is a $C_1$ to $C_{30}$ hydrocarbyl group; and $L^2$ is a $C_1$ to $C_{32}$ hydrocarbylene group;

$Y^2$ at each occurrence independently is hydrogen or a $C_1$ to $C_{30}$ hydrocarbyl group; and $A^2$ at each occurrence independently is a hydrocarbyl group comprising a hindered double bond.

Each of the unsaturated polyolefin of the formula $A^1L^1$ and the telechelic polyolefin of the formula $A^1L^1L^2A^2$ prepared by the above processes may comprise a weight average molecular weight from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol. Polymers other than the unsaturated polyolefin of the formula $A^1L^1$ and the telechelic polyolefin of the formula $A^1L^1L^2A^2$ that are suitable for inclusion in the (A) polyolefin component (discussed below) may be prepared independently from the above processes and subsequently blended with the unsaturated polyolefin of the formula $A^1L^1$ and/or the telechelic polyolefin of the formula $A^1L^1L^2A^2$.

For the process of preparing a polyolefin component comprising an unsaturated polyolefin of the formula $A^1L^1$ and a telechelic polyolefin of the formula $A^1L^1L^2A^2$, the (b1) chain transfer agent component may comprise a ratio of the aluminum alkyl of the formula $Al(d)_3$ to the organoaluminum compound of the formula $Al(CH_2CH(Y^2)A^2)_3$ from 1:99 to 99:1, or from 10:90 to 90:10, or from 20:80 to 80:20, or from 30:70 to 70:30, or from 40:60 to 60:40, or 50:50

The previously described embodiments for each of the $L^1$, $A^1$, $Y^1$, $L^2$, $Y^2$, and $A^2$ groups apply with respect to the present processes disclosed herein. Similarly, the previously described embodiments for the unsaturated polyolefin of the formula $A^1L^1$ and the telechelic polyolefin of the formula $A^1L^1L^2A^2$ apply with respect to the present processes disclosed herein.

The starting materials in step 1) of any of the above processes may further comprise a (d1) solvent. The (d1) solvent of the starting materials may be any aromatic or aliphatic hydrocarbon. Suitable solvents include but are not limited to toluene, xylene, hexane, pentane, benzene, heptane, Isopar™, and combinations thereof. Beyond this, the starting materials in step 1) may further comprise hydrogen, adjuvants, scavengers, and/or polymerization aids.

Step 1) of any of the above processes is a coordination polymerization step to form $L^1$ from the monomers and comonomers of the (a1) monomer component. During step 1), polymeryl aluminum species can form via chain transfer between the (b1) chain transfer agent component and an active catalyst from the (c1) catalyst component. Subsequently, the polymeryl aluminum species undergo beta-hydride elimination during step 2) to form a product comprising the unsaturated polyolefin of the formula $A^1L^1$ and/or the telechelic polyolefin of the formula $A^1L^1L^2A^2$ of the (A) polyolefin component, which is recovered during step 3).

Step 1) of any of the above processes is preferably carried out as a solution polymerization step. Most preferably, step 1) is performed as a continuous solution polymerization step in which the starting materials are continuously supplied to a reaction zone and polymer products are continuously removed therefrom. Within the scope of the terms "continuous" and "continuously," as used in this context, are those processes in which there are intermittent additions of reactants and removal of products at regular or irregular intervals, so that, over time, the overall process is substantially continuous.

Step 1) of any of the above processes may be performed at a temperature from 60° C., or 80° C., or 100° C., or 110° C., or 115° C. to 120° C., or 130° C., or 140° C., or 150° C. For example, in certain embodiments, step 1) may be performed at a temperature from 60 to 150° C., or from 80 to 140° C., or from 100 to 130° C.

One of ordinary skill in the art would understand that the amounts of each component of the starting materials, including components (a1) to (d1), may be varied in order to produce polymers differing in one or more chemical or physical properties.

Without limiting in any way the scope of the invention, one means for carrying out step 1) is as follows. In a stirred-tank reactor, the monomers of the (a1) monomer component are introduced continuously together with any solvent or diluent. The reactor contains a liquid phase composed substantially of monomers together with any solvent or diluent and dissolved polymer. Preferred solvents include $C_{4-10}$ hydrocarbons or mixtures thereof, especially alkanes such as hexane or mixtures of alkanes, as well as one or more of the monomers employed in the polymerization. The (b1) chain transfer agent component and the (c1) catalyst component are continuously or intermittently introduced in the reactor liquid phase or any recycled portion thereof. The reactor temperature and pressure may be controlled by adjusting the solvent/monomer ratio, the addition rate of the (c1) catalyst component, as well as by cooling or heating coils, jackets or both. The polymerization rate is controlled by the rate of addition of the (c1) catalyst component. If the (a1) monomer component comprises ethylene and at least one comonomer, the ethylene content of the polymer product is determined by the ratio of ethylene to comonomer in the reactor, which is controlled by manipulating the respective feed rates of these components to the reactor. The polymer product molecular weight is controlled, optionally, by controlling other polymerization variables such as the temperature, monomer concentration, or others known in the art. In a continuous process, the mean residence time of the active catalyst and polymer in the reactor generally is from 5 minutes to 8 hours, and preferably from 10 minutes to 6 hours.

Alternatively, step 1) of any of the above processes may be conducted under differentiated process conditions in two or more reactors, connected in series, operating under steady state polymerization conditions or in two or more zones of a reactor operating under plug flow polymerization conditions. Alternatively, step 1) of any of the above processes may be conducted in one or more continuous loop reactors with or without monomer, catalyst, or chain transfer agent gradients established between differing regions thereof, optionally accompanied by separated addition of catalysts and/or chain transfer agent, and operating under adiabatic or non-adiabatic solution polymerization conditions or combinations of the foregoing reactor conditions.

Following step 1), the polymer solution is heated in accordance with step 2), as further described below. Such heating includes, but is not limited to, heating in a post-reactor heater. Following step 2), the polymer product is recovered in step 3) by means known in the art. Such means include contacting the polymer solution with a catalyst kill agent such as water, steam or an alcohol, flashing off gaseous monomers as well as residual solvent or diluent at reduced pressure, and, if necessary, conducting further devolatilization in equipment such as a devolatilizing extruder.

In some embodiments, the solution in step 2) of any of the above processes is heated at a temperature of at least 160° C., or at least 180° C., or at least 200° C., or at least 210° C., or at least 220° C., or at least 230° C., or at least 240° C., or at least 250° C., or at least 260° C., or at least 270° C., or at least 280° C., or at least 290° C., or at least 300° C.

In some embodiments, the solution in step 2) of any of the above processes is heated at a temperature of at least 160° C., or at least 180° C., or at least 200° C., or at least 210° C., or at least 220° C., or at least 230° C., or at least 240° C., or at least 250° C., or at least 260° C., or at least 270° C., or at least 280° C., or at least 290° C., or at least 300° C. for a time of at least 30 seconds, or at least 1 minute, or at least 5 minutes, or at least 10 minutes, or at least 15 minutes, or at least 20 minutes, or at least 30 minutes, or at least 45 minutes, or at least 1 hour, or at least 6 hours, or least 12 hours, or at least 18 hours, or at least 24 hours In some embodiments, the solution in step 2) of any of the above processes is heated to a temperature of at least 160° C., or at least 180° C., or at least 200° C., or at least 210° C., or at least 220° C., or at least 230° C., or at least 240° C., or at least 250° C., or at least 260° C., or at least 270° C., or at least 280° C., or at least 290° C., or at least 300° C. and held at a temperature of at least 160° C., or at least 180° C., or at least 200° C., or at least 210° C., or at least 220° C., or at least 230° C., or at least 240° C., or at least 250° C., or at least 260° C., or at least 270° C., or at least 280° C., or at least 290° C., or at least 300° C. for a time of at least 30 seconds, or at least 1 minute, or at least 5 minutes, or at least 10 minutes, or at least 15 minutes, or at least 20 minutes, or at least 30 minutes, or at least 45 minutes, or at least 1 hour, or at least 6 hours, or least 12 hours, or at least 18 hours, or at least 24 hours.

For example, in certain embodiments, the solution in step 2) of any of the above processes is heated at a temperature from 160 to 300° C., or from 180 to 300° C., or from 200 to 300° C., or from 210 to 300° C., or from 220 to 290° C., or from 230 to 290° C., or from 240 to 280° C.

In further embodiments, the solution in step 2) of any of the above processes is heated at a temperature from 160 to 300° C., or from 180 to 300° C., or from 200 to 300° C., or from 210 to 300° C., or from 220 to 290° C., or from 230 to 290° C., or from 240 to 280° C. for a time from 30 seconds to 24 hours, or from 30 seconds to 18 hours, or from 30 seconds to 12 hours, or from 30 seconds to 6 hours, or from 30 seconds to 1 hour, or from 30 seconds to 45 minutes, or from 30 seconds to 30 minutes, or from 30 seconds to 20 minutes, or from 1 minute to 20 minutes, or from 5 minutes to 20 minutes.

In further embodiments, the solution in step 2) of any of the above processes is heated to a temperature from 160 to 300° C., or from 180 to 300° C., or from 200 to 300° C., or from 210 to 300° C., or from 220 to 290° C., or from 230 to 290° C., or from 240 to 280° C. and held at a temperature from 160 to 300° C., or from 180 to 300° C., or from 200 to 300° C., or from 210 to 300° C., or from 220 to 290° C., or from 230 to 290° C., or from 240 to 280° C. for a time from 30 seconds to 24 hours, or from 30 seconds to 18 hours, or from 30 seconds to 12 hours, or from 30 seconds to 6 hours, or from 30 seconds to 1 hour, or from 30 seconds to 45 minutes, or from 30 seconds to 30 minutes, or from 30 seconds to 20 minutes, or from 1 minute to 20 minutes, or from 5 minutes to 20 minutes.

The (a1) Monomer Component

The (a1) monomer component comprises any monomer selected from the monomers and comonomers discussed herein with regard to $L^1$. Examples of suitable monomers and comonomers include but are not limited to ethylene and alpha-olefins of 3 to 30 carbon atoms, preferably 3 to 20 carbon atoms, such as propylene, 1-butene, 1-pentene, 3-methyl-1-butene, 1-hexene, 4-methyl-1-pentene, 3-methyl-1-pentene, 3,5,5-trimethyl-1-hexene, 1-octene, 1-decene, 1-dodecene, 1-tetradecene, 1-hexadecene, 5-ethyl-1-nonene, 1-octadecene and 1-eicosene; conjugated or nonconjugated dienes, such as butadiene, isoprene, 4-methyl-1,3-pentadiene, 1,3-pentadiene, 1,4-pentadiene, 1,5-hexadiene, 1,4-hexadiene, 1,3-hexadiene, 1,5-heptadiene, 1,6-heptadiene, 1,3-octadiene, 1,4-octadiene, 1,5-octadiene, 1,6-octadiene, 1,7-octadiene, 1,9-decadiene, 7-methyl-1,6-octadiene, 4-ethylidene-8-methyl-1,7-nonadiene, and 5,9-dimethyl-1,4,8-decatriene, 5-methyl-1,4-hexadiene, 3,7-dimethyl-1,6-octadiene, 3,7-dimethyl-1,7-octadiene, and mixed isomers of dihydromyrcene and dihydroocimene; norbornene and alkenyl, alkylidene, cycloalkenyl and cycloalkylidene norbornenes, such as 5-ethylidene-2-norbornene, 5-vinyl-2-norbornene, dicyclopentadiene, 5-methylene-2-norbornene, 5-propenyl-2-norbornene, 5-isopropylidene-2-norbornene, 5-(4-cyclopentenyl)-2-norbornene, 5-cyclohexylidene-2-norbornene, and norbornadiene; aromatic vinyl compounds such as styrenes, mono or poly alkylstyrenes (including styrene, o-methylstyrene, t-methylstyrene, m-methylstyrene, p-methylstyrene, o,p-dimethylstyrene, o-ethylstyrene, m-ethylstyrene and p-ethylstyrene).

In some embodiments, the (a1) monomer component comprises ethylene monomers. In some embodiments, the (a1) monomer component comprises propylene monomers. In some embodiments, the (a1) monomer component comprises ethylene monomers and comonomers of a C3 to C30 alpha-olefin. The C3 to C30 alpha olefin may be selected from propylene, 1-butene, 1-pentene, 3-methyl-1-butene, 1-hexene, 4-methyl-1-pentene, 3-methyl-1-pentene, 3,5,5-trimethyl-1-hexene, 1-octene, 1-decene, 1-dodecene, 1-tetradecene, 1-hexadecene, 5-ethyl-1-nonene, 1-octadecene and 1-eicosene. In some embodiments, the (a1) monomer component comprises propylene monomers and comonomers of ethylene or a C4 to C30 alpha-olefin. The C4 to C30 alpha-olefin may be selected from 1-butene, 1-pentene, 3-methyl-1-butene, 1-hexene, 4-methyl-1-pentene, 3-methyl-1-pentene, 3,5,5-trimethyl-1-hexene, 1-octene, 1-decene, 1-dodecene, 1-tetradecene, 1-hexadecene, 5-ethyl-1-nonene, 1-octadecene and 1-eicosene.

In certain embodiments, the (a1) monomer component comprises ethylene monomers and comonomers of a C3 to C30 alpha-olefin, wherein the C3 to C30 alpha-olefin is selected from the group consisting of propylene, 1-hexene, 1-butene, and 1-octene. In further embodiments, the (a1) monomer component comprises ethylene monomers and propylene comonomers. In further embodiments, the (a1) monomer component comprises ethylene monomers and 1-hexene comonomers. In further embodiments, the (a1) monomer component comprises ethylene monomers and 1-butene comonomers. In further embodiments, the (a1) monomer component comprises ethylene monomers and 1-octene comonomers.

In further embodiments, the (a1) monomer component comprises propylene monomers and comonomers of ethylene or a C4 to C30 alpha-olefin, wherein the C4 to C30 alpha-olefin is selected from the group consisting of 1-hexene, 1-butene, and 1-octene. In further embodiments, the (a1) monomer component comprises propylene monomers and ethylene comonomers. In further embodiments, the (a1) monomer component comprises propylene monomers and 1-hexene comonomers. In further embodiments, the (a1) monomer component comprises propylene monomers and 1-butene comonomers. In further embodiments, the (a1) monomer component comprises propylene monomers and 1-octene comonomers.

In certain embodiments, the (a1) monomer component comprises from greater than or equal to 50 wt % to less than or equal to 99 wt % (e.g., from greater than or equal to 60 wt % to less than or equal to 99 wt %, or from greater than or equal to 70 wt % to less than or equal to 99 wt %, or from greater than or equal to 75 wt % to less than or equal to 99 wt %, or from greater than or equal to 80 wt % to less than or equal to 99 wt %, or from greater than or equal to 85 wt % to less than or equal to 99 wt %, or from greater than or equal to 90 wt % to less than or equal to 99 wt %) of ethylene monomers and from greater than or equal to 1 wt % to less than or equal to 50 wt % (e.g., from greater than or equal to 1 wt % to less than or equal to 40 wt %, or from greater than or equal to 1 wt % to less than or equal to 30 wt %, or from greater than or equal to 1 wt % to less than or equal to 25 wt %, or from greater than or equal to 1 wt % to less than or equal to 20 wt %, or from greater than or equal to 1 wt % to less than or equal to 15 wt %, or from greater than or equal to 1 wt % to less than or equal to 10 wt %) of comonomers of a C3 to C30 alpha-olefin, wherein the C3 to C30 alpha-olefin is selected from the group consisting of propylene, 1-hexene, 1-butene, and 1-octene.

In certain embodiments, the (a1) monomer component comprises from greater than or equal to 50 wt % to less than or equal to 99 wt % (e.g., from greater than or equal to 60 wt % to less than or equal to 99 wt %, or from greater than or equal to 70 wt % to less than or equal to 99 wt %, or from greater than or equal to 75 wt % to less than or equal to 99 wt %, or from greater than or equal to 80 wt % to less than or equal to 99 wt %, or from greater than or equal to 85 wt % to less than or equal to 99 wt %, or from greater than or equal to 90 wt % to less than or equal to 99 wt %) of propylene monomers and from greater than or equal to 1 wt % to less than or equal to 50 wt % (e.g., from greater than or equal to 1 wt % to less than or equal to 40 wt %, or from greater than or equal to 1 wt % to less than or equal to 30 wt %, or from greater than or equal to 1 wt % to less than or equal to 25 wt %, or from greater than or equal to 1 wt % to less than or equal to 20 wt %, or from greater than or equal to 1 wt % to less than or equal to 15 wt %, or from greater than or equal to 1 wt % to less than or equal to 10 wt %) of comonomers of ethylene or a C4 to C30 alpha-olefin, wherein the C4 to C30 alpha-olefin is selected from the group consisting of 1-hexene, 1-butene, and 1-octene.

In some embodiments, the (a1) monomer component comprises from 0 to 10 wt % of diene monomers. For example, the (a1) monomer component may comprise from 0.5 to 8 wt %, or from 1 to 5 wt %, or from 1 to 3 wt % of diene monomers. In further embodiments, the (a1) monomer component may be substantially free of diene monomers. For example, in certain embodiments, the (a1) monomer component may comprise from 0 to 0.2 wt %, or from 0 to 0.01 wt %, or from 0 to 0.001 wt %, or from 0 to 0.0001 wt % of diene monomers.

The (b1) Chain Transfer Agent Component

The (b1) chain transfer agent component may comprise any chain transfer agent described herein or disclosed in U.S. provisional application Nos. 62/786,084, 62/786,100, 62/786119, and 62/786110.

The aluminum alkyl of the formula $Al(d)_3$ may be a tri($C_{1-8}$) alkyl aluminum. Non-limiting examples of the aluminum alkyl of the formula $Al(d)_3$ are triethyl aluminum, tri(i-propyl) aluminum, tri(i-butyl) aluminum, tri(n-hexyl) aluminum, and tri(n-octyl) aluminum.

Without being bound by any particular theory, the aluminum alkyl of the formula $Al(d)_3$ contributes to the formation of the unsaturated polyolefin of the formula $A^1L^1$ while organoaluminum compound of the formula $Al(CH_2CH(Y^2)A^2)_3$ contributes to the formation of the telechelic polyolefin of the formula $A^1L^1L^2A^2$.

In certain embodiments, the (b1) chain transfer agent component comprises an organoaluminum compound of the formula $Al(CH_2CH(Y^2)A^2)_3$, wherein: $Y^2$ at each occurrence independently is hydrogen or a $C_1$ to $C_{30}$ hydrocarbyl group; and $A^2$ at each occurrence independently is a hydrocarbyl group comprising a hindered double bond. In further embodiments, the (b1) chain transfer agent component is the organoaluminum compound of the formula $Al(CH_2CH(Y^2)A^2)_3$. $Y^2$ and $A^2$ may be any of the previously described embodiments. In certain embodiments, $Y^2$ of the organoaluminum compound of the formula $Al(CH_2CH(Y^2)A^2)_3$ may be selected from the group consisting of hydrogen, a methyl group, and an ethyl group. In certain embodiments, $A^2$ of the organoaluminum compound of the formula $Al(CH_2CH(Y^2)A^2)_3$ may be selected from among (AA) to (AZ) and (AZ1) discussed previously. In further embodiments, $A^2$ of the organoaluminum compound of the formula $Al(CH_2CH(Y^2)A^2)_3$ is selected from the group consisting of (AC), (AF), (AM), (AO), (AP), (AS), and (AZ1). The pendant methyl group of (AF) may be connected to any carbon atom that is a ring member.

The organoaluminum compound of the formula $Al(CH_2CH(Y^2)A^2)_3$ may be prepared by a thermal process comprising: (a) combining starting materials comprising a hydrocarbon of the formula $CH_2=C(Y^2)A^2$, an aluminum alkyl of the formula $Al(d)_3$, and an optional solvent to form an organoaluminum solution, (b) heating the organoaluminum solution to a temperature from 60 to 200° C., or from 80 to 180° C., or from 100 to 150° C., or from 110 to 130° C. and holding the organo-aluminum solution at the temperature of from 60 to 200° C., or from 80 to 180° C., or from 100 to 150° C., or from 110 to 130° C. for a time from 30 minutes to 200 hours, or from 30 minutes to 100 hours, or from 30 minutes to 50 hours, or from 30 minutes to 25 hours, or from 1 hour to 10 hours, or from 1 hour to 5 hours, or from 3 hours to 5 hours, and (c) recovering a product comprising the organoaluminum compound of the formula $Al(CH_2CH(Y^2)A^2)_3$, wherein: d at each occurrence independently is a $C_1$ to $C_{10}$ alkyl group; $Y^2$ at each occurrence independently is hydrogen or a $C_1$ to $C_{30}$ hydrocarbyl group; and $A^2$ at each occurrence independently is a hydrocarbyl group comprising a hindered double bond. In certain embodiments, the carbon of d that is attached to Al is a carbon that is connected to a tertiary carbon. For example, in certain embodiments, the aluminum alkyl of the formula $Al(d)_3$ is triisobutylaluminum. In certain embodiments, in step (b), the organoaluminum solution is heated at a temperature from 60 to 200° C., or from 80 to 180° C., or from 100 to 150° C., or from 110 to 130° C. In further embodiments, in step (b), the organoaluminum solution is heated at a temperature from 60 to 200° C., or from 80 to 180° C., or from 100 to 150° C., or from 110 to 130° C. for a time from 30 minutes to 200 hours, or from 30 minutes to 100 hours, or from 30 minutes to 50 hours, or from 30 minutes to 25 hours, or from 1 hour to 10 hours, or from 1 hour to 5 hours, or from 3 hours to 5 hours.

For the thermal process of preparing the organoaluminum compound of the formula $Al(CH_2CH(Y^2)A^2)_3$, $Y^2$ and $A^2$ may be any of the previously described embodiments. The optional solvent may be any discussed herein. The starting materials in step (a) may comprise a ratio of the aluminum alkyl of the formula $Al(d)_3$ to the hydrocarbon of the formula $CH_2=C(Y^2)A^2$ of 1:10, or 1:5, or 1:3. The starting materials in step (a) may comprise one or more hydrocarbons of the formula $CH_2=C(Y^2)A^2$, wherein: $Y^2$ at each occurrence of each hydrocarbon independently is hydrogen or a $C_1$ to $C_{30}$ hydrocarbyl group; $A^2$ at each of occurrence of each hydrocarbon independently is a hydrocarbyl group comprising a hindered double bond; and the starting materials comprise a ratio of the aluminum alkyl of the formula $Al(d)_3$ to the one or more hydrocarbons of the formula $CH_2=C(Y^2)A^2$ of 1:10, or 1:5, or 1:3. In certain embodiments, $Y^2$ may be selected from the group consisting of hydrogen, a methyl group, and an ethyl group, and $A^2$ may be selected from among (AA) to (AZ) and (AZ1) discussed previously. In further embodiments, $A^2$ may be selected from the group consisting of (AC), (AF), (AM), (AO), (AP), (AS), and (AZ1). The pendant methyl group of (AF) may be connected to any carbon atom that is a ring member. In this process of preparing the organoaluminum compound of the formula $Al(CH_2CH(Y^2)A^2)_3$, any excess hydrocarbon of the formula $CH_2=C(Y^2)A^2$ may be removed through the use of vacuum and optional heating.

Alternatively, the organoaluminum compound of the formula $Al(CH_2CH(Y^2)A^2)_3$ may be prepared a catalytic process comprising: (a) combining starting materials comprising a hydrocarbon of the formula $CH_2=CHA^2$, an aluminum alkyl of the formula $Al(Y^2)_3$, a procatalyst, an optional co-catalyst, and an optional solvent, and (b) recovering a product comprising the organoaluminum compound of the formula $Al(CH_2CH(Y^2)A^2)_3$, wherein step (a) is conducted at a temperature from 1° C. to 50° C., or from 10° C. to 40° C., or from 20° C. to 30° C. for a time of 1 to 50 hours, or from 10 to 40 hours, or from 15 to 25 hours, and wherein: $Y^2$ at each occurrence independently is a $C_1$ to $C_{30}$ hydrocarbyl group; and $A^2$ at each occurrence independently is a hydrocarbyl group comprising a hindered double bond.

For the catalytic process of preparing the organoaluminum compound of the formula $Al(CH_2CH(Y^2)A^2)_3$, $Y^2$ will be a $C_1$ to $C_{30}$ hydrocarbyl group while $A^2$ may be any of the previously described embodiments. Each of the procatalyst, the optional co-catalyst, and the optional solvent may be any disclosed herein. The starting materials in step (a) may comprise a ratio of the aluminum alkyl of the formula $Al(Y^2)_3$ to the hydrocarbon of the formula $CH_2=CHA^2$ of from 1:10, or 1:5, or 1:3. The starting materials in step (a) may comprise one or more hydrocarbons of the formula $CH_2=CHA^2$, wherein: $A^2$ at each occurrence of each hydrocarbon independently is a hydrocarbyl group comprising a hindered double bond; and the starting materials comprise a ratio of the aluminum alkyl of the formula $Al(Y^2)_3$ to the one or more hydrocarbons of the formula $CH_2\!\!=\!\!C(Y^2)A^2$ of from 1:10, or 1:5, or 1:3. In certain embodiments, $Y^2$ may be a $C_1$ to $C_{10}$ alkyl group, and $A^2$ may be selected from among (AA) to (AZ) and (AZ1) discussed previously. In further embodiments, $A^2$ may be selected from the group consisting of (AC), (AF), (AM), (AO), (AP), (AS), and (AZ1). The pendant methyl group of (AF) may be connected to any carbon atom that is a ring member.

The (c1) Catalyst Component

In certain embodiments, the (c1) catalyst component comprises a procatalyst. In these embodiments, the procatalyst becomes an active catalyst to polymerize unsaturated monomers without a co-catalyst. In further embodiments, the (c1) catalyst component comprises a procatalyst and a co-catalyst, whereby an active catalyst is formed by the combination of the procatalyst and the co-catalyst. In these embodiments, the (c1) active catalyst component may comprise a ratio of the procatalyst to the co-catalyst of 1:2, or 1:1.5, or 1:1.2.

Suitable procatalysts include but are not limited to those disclosed in WO 2005/090426, WO 2005/090427, WO 2007/035485, WO 2009/012215, WO 2014/105411, WO 2017/173080, U.S. Patent Publication Nos. 2006/0199930, 2007/0167578, 2008/0311812, and U.S. Pat. Nos. 7,858,706 B2, 7,355,089 B2, 8,058,373 B2, and 8,785,554 B2. With reference to the paragraphs below, the term "procatalyst" is interchangeable with the terms "catalyst," "precatalyst," "catalyst precursor," "transition metal catalyst," "transition metal catalyst precursor," "polymerization catalyst," "polymerization catalyst precursor," "transition metal complex," "transition metal compound," "metal complex," "metal compound," "complex," and "metal-ligand complex," and like terms.

Both heterogeneous and homogeneous catalysts may be employed. Examples of heterogeneous catalysts include the well known Ziegler-Natta compositions, especially Group 4 metal halides supported on Group 2 metal halides or mixed halides and alkoxides and the well known chromium or vanadium based catalysts. Preferably, the catalysts for use herein are homogeneous catalysts comprising a relatively pure organometallic compound or metal complex, especially compounds or complexes based on metals selected from Groups 3-10 or the Lanthanide series of the Periodic Table of the Elements.

Metal complexes for use herein may be selected from Groups 3 to 15 of the Periodic Table of the Elements containing one or more delocalized, π-bonded ligands or polyvalent Lewis base ligands. Examples include metallocene, half-metallocene, constrained geometry, and polyvalent pyridylamine, or other polychelating base complexes. The complexes are generically depicted by the formula: $MK_kX_xZ_z$, or a dimer thereof, wherein M is a metal selected from Groups 3-15, preferably 3-10, more preferably 4-10, and most preferably Group 4 of the Periodic Table of the Elements;

K independently at each occurrence is a group containing delocalized π-electrons or one or more electron pairs through which K is bound to M, said K group containing up to 50 atoms not counting hydrogen atoms, optionally two or more K groups may be joined together forming a bridged structure, and further optionally one or more K groups may be bound to Z, to X or to both Z and X;

X independently at each occurrence is a monovalent, anionic moiety having up to 40 non-hydrogen atoms, optionally one or more X groups may be bonded together thereby forming a divalent or polyvalent anionic group, and, further optionally, one or more X groups and one or more Z groups may be bonded together thereby forming a moiety that is both covalently bound to M and coordinated thereto; or two X groups together form a divalent anionic ligand group of up to 40 non-hydrogen atoms or together are a conjugated diene having from 4 to 30 non-hydrogen atoms bound by means of delocalized π-electrons to M, whereupon M is in the +2 formal oxidation state, and Z independently at each occurrence is a neutral, Lewis base donor ligand of up to 50 non-hydrogen atoms containing at least one unshared electron pair through which Z is coordinated to M;

k is an integer from 0 to 3; x is an integer from 1 to 4; z is a number from 0 to 3; and the sum, k+x, is equal to the formal oxidation state of M.

Suitable metal complexes include those containing from 1 to 3 π-bonded anionic or neutral ligand groups, which may be cyclic or non-cyclic delocalized π-bonded anionic ligand groups. Exemplary of such π-bonded groups are conjugated or nonconjugated, cyclic or non-cyclic diene and dienyl groups, allyl groups, boratabenzene groups, phosphole, and arene groups. By the term "π-bonded" is meant that the ligand group is bonded to the transition metal by a sharing of electrons from a partially delocalized π-bond.

Each atom in the delocalized π-bonded group may independently be substituted with a radical selected from the group consisting of hydrogen, halogen, hydrocarbyl, halohydrocarbyl, hydrocarbyl-substituted heteroatoms wherein the heteroatom is selected from Group 14-16 of the Periodic Table of the Elements, and such hydrocarbyl-substituted heteroatom radicals further substituted with a Group 15 or 16 hetero atom containing moiety. In addition, two or more such radicals may together form a fused ring system, including partially or fully hydrogenated fused ring systems, or they may form a metallocycle with the metal. Included within the term "hydrocarbyl" are $C_{1-20}$ straight, branched and cyclic alkyl radicals, $C_{6-20}$ aromatic radicals, $C_{7-20}$ alkyl-substituted aromatic radicals, and $C_{7-20}$ aryl-substituted alkyl radicals. Suitable hydrocarbyl-substituted heteroatom radicals include mono-, di- and tri-substituted radicals of boron, silicon, germanium, nitrogen, phosphorus or oxygen wherein each of the hydrocarbyl groups contains from 1 to 20 carbon atoms. Examples include N,N-dimethylamino, pyrrolidinyl, trimethylsilyl, triethylsilyl, t-butyldimethylsilyl, methyldi(t-butyl)silyl, triphenylgermyl, and trimethylgermyl groups. Examples of Group 15 or 16 hetero atom containing moieties include amino, phosphino, alkoxy, or alkylthio moieties or divalent derivatives thereof, for example, amide, phosphide, alkyleneoxy or alkylenethio groups bonded to the transition metal or Lanthanide metal, and bonded to the hydrocarbyl group, π-bonded group, or hydrocarbyl-substituted heteroatom.

Examples of suitable anionic, delocalized π-bonded groups include cyclopentadienyl, indenyl, fluorenyl, tetrahydroindenyl, tetrahydrofluorenyl, octahydrofluorenyl, pentadienyl, cyclohexadienyl, dihydroanthracenyl, hexahydroanthracenyl, decahydroanthracenyl groups, phosphole, and boratabenzyl groups, as well as inertly substituted derivatives thereof, especially $C_{1-10}$ hydrocarbyl-substituted or tris($C_{1-10}$ hydrocarbyl)silyl-substituted derivatives thereof.

Preferred anionic delocalized π-bonded groups are cyclopentadienyl, pentamethylcyclopentadienyl, tetramethylcyclopentadienyl, tetramethylsilylcyclopentadienyl, indenyl, 2,3-dimethylindenyl, fluorenyl, 2-methylindenyl, 2-methyl-4-phenylindenyl, tetrahydrofluorenyl, octahydrofluorenyl, 1-indacenyl, 3-pyrrolidinoinden-1-yl, 3,4-(cyclopenta(1)phenanthren-1-yl, and tetrahydroindenyl.

The boratabenzenyl ligands are anionic ligands which are boron containing analogues to benzene. They are previously known in the art having been described by G. Herberich, et al., in *Organometallics*, 14,1, 471-480 (1995). Preferred boratabenzenyl ligands correspond to the formula:

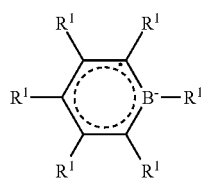

wherein $R^1$ is an inert substituent, preferably selected from the group consisting of hydrogen, hydrocarbyl, silyl, halo or germyl, said $R^1$ having up to 20 atoms not counting hydrogen, and optionally two adjacent $R^1$ groups may be joined together. In complexes involving divalent derivatives of such delocalized π-bonded groups one atom thereof is bonded by means of a covalent bond or a covalently bonded divalent group to another atom of the complex thereby forming a bridged system.

Phospholes are anionic ligands that are phosphorus containing analogues to a cyclopentadienyl group. They are previously known in the art having been described by WO 98/50392, and elsewhere. Preferred phosphole ligands correspond to the formula:

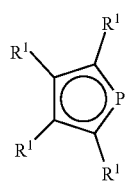

wherein $R^1$ is as previously defined.

Suitable transition metal complexes for use herein correspond to the formula: $MK_kX_xZ_z$, or a dimer thereof, wherein:
M is a Group 4 metal;
K is a group containing delocalized π-electrons through which K is bound to M, said K group containing up to 50 atoms not counting hydrogen atoms, optionally two K groups may be joined together forming a bridged structure, and further optionally one K may be bound to X or Z;
X at each occurrence is a monovalent, anionic moiety having up to 40 non-hydrogen atoms, optionally one or more X and one or more K groups are bonded together to form a metallocycle, and further optionally one or more X and one or more Z groups are bonded together thereby forming a moiety that is both covalently bound to M and coordinated thereto;
Z independently at each occurrence is a neutral, Lewis base donor ligand of up to 50 non-hydrogen atoms containing at least one unshared electron pair through which Z is coordinated to M;
k is an integer from 0 to 3; x is an integer from 1 to 4; z is a number from 0 to 3; and the sum, k+x, is equal to the formal oxidation state of M.

Suitable complexes include those containing either one or two K groups. The latter complexes include those containing a bridging group linking the two K groups. Suitable bridging groups are those corresponding to the formula $(ER'_2)_e$ wherein E is silicon, germanium, tin, or carbon, R' independently at each occurrence is hydrogen or a group selected from silyl, hydrocarbyl, hydrocarbyloxy and combinations thereof, said R' having up to 30 carbon or silicon atoms, and e is 1 to 8. Illustratively, R' independently at each occurrence is methyl, ethyl, propyl, benzyl, tert-butyl, phenyl, methoxy, ethoxy or phenoxy.

Examples of the complexes containing two K groups are compounds corresponding to the formula:

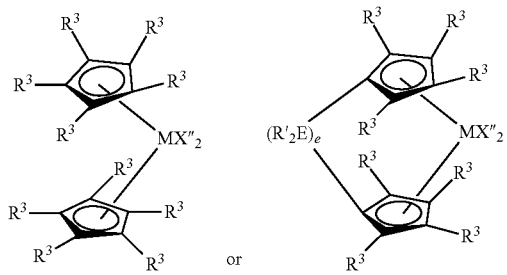

wherein:
M is titanium, zirconium or hafnium, preferably zirconium or hafnium, in the +2 or +4 formal oxidation state; $R^3$ at each occurrence independently is selected from the group consisting of hydrogen, hydrocarbyl, silyl, germyl, cyano, halo and combinations thereof, said $R^3$ having up to 20 non-hydrogen atoms, or adjacent $R^3$ groups together form a divalent derivative (that is, a hydrocarbadiyl, siladiyl or germadiyl group) thereby forming a fused ring system, and
X" independently at each occurrence is an anionic ligand group of up to 40 non-hydrogen atoms, or two X" groups together form a divalent anionic ligand group of up to 40 non-hydrogen atoms or together are a conjugated diene having from 4 to 30 non-hydrogen atoms bound by means of delocalized π-electrons to M, whereupon M is in the +2 formal oxidation state, and R', E and e are as previously defined.

Exemplary bridged ligands containing two π-bonded groups are: dimethylbis(cyclopentadienyl)silane, dimethylbis(tetramethylcyclopentadienyl)silane, dimethylbis(2-ethylcyclopentadien-1-yl)silane, dimethylbis(2-t-butylcyclopentadien-1-yl)silane, 2,2-bis(tetramethylcyclopentadienyl)propane, dimethylbis(inden-1-yl)silane, dimethylbis(tetrahydroinden-1-yl)silane, dimethylbis(fluoren-1-yl)silane, dimethylbis(tetrahydrofluoren-1-yl)silane, dimethylbis(2-methyl-4-phenylinden-1-yl)-silane, dimethylbis(2-methylinden-1-yl)silane, dimethyl(cyclopentadienyl)(fluoren-1-yl)silane, dimethyl(cyclopentadienyl)(octahydrofluoren-1-yl)silane, dimethyl(cyclopentadienyl)(tetrahydrofluoren-1-yl)silane, (1,1,2,2-tetramethy)-1,2-bis(cyclopentadienyl)disilane, (1,2-bis(cyclopentadienyl)ethane, and dimethyl(cyclopentadienyl)-1-(fluoren-1-yl)methane.

Suitable X" groups are selected from hydride, hydrocarbyl, silyl, germyl, halohydrocarbyl, halosilyl, silylhydrocarbyl and aminohydrocarbyl groups, or two X" groups together form a divalent derivative of a conjugated diene or else together they form a neutral, π-bonded, conjugated diene. Exemplary X" groups are $C_1$-20 hydrocarbyl groups.

A further class of metal complexes utilized in the present disclosure corresponds to the preceding formula: $MKZ_zX_x$, or a dimer thereof, wherein M, K, X, x and z are as previously defined, and Z is a substituent of up to 50 non-hydrogen atoms that together with K forms a metallocycle with M.

Suitable Z substituents include groups containing up to 30 non-hydrogen atoms comprising at least one atom that is oxygen, sulfur, boron or a member of Group 14 of the Periodic Table of the Elements directly attached to K, and a different atom, selected from the group consisting of nitrogen, phosphorus, oxygen or sulfur that is covalently bonded to M.

More specifically this class of Group 4 metal complexes used according to the present invention includes "constrained geometry catalysts" corresponding to the formula:

wherein: M is titanium or zirconium, preferably titanium in the +2, +3, or +4 formal oxidation state;

$K^1$ is a delocalized, π-bonded ligand group optionally substituted with from 1 to 5 $R^2$ groups, $R^2$ at each occurrence independently is selected from the group consisting of hydrogen, hydrocarbyl, silyl, germyl, cyano, halo and combinations thereof, said $R^2$ having up to 20 non-hydrogen atoms, or adjacent $R^2$ groups together form a divalent derivative (that is, a hydrocarbadiyl, siladiyl or germadiyl group) thereby forming a fused ring system, each X is a halo, hydrocarbyl, heterohydrocarbyl, hydrocarbyloxy or silyl group, said group having up to 20 non-hydrogen atoms, or two X groups together form a neutral $C_5$-30 conjugated diene or a divalent derivative thereof;

x is 1 or 2;

Y is —O—, —S—, —NR'—, —PR'—;

and X' is $SiR'_2$, $CR'_2$, $SiR'_2SiR'_2$, $CR'_2CR'_2$, CR'=CR', $CR'_2SiR'_2$, or $GeR'_2$, wherein R' independently at each occurrence is hydrogen or a group selected from silyl, hydrocarbyl, hydrocarbyloxy and combinations thereof, said R' having up to 30 carbon or silicon atoms.

Specific examples of the foregoing constrained geometry metal complexes include compounds corresponding to the formula:

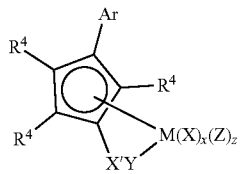

wherein,

Ar is an aryl group of from 6 to 30 atoms not counting hydrogen;

$R^4$ independently at each occurrence is hydrogen, Ar, or a group other than Ar selected from hydrocarbyl, trihydrocarbylsilyl, trihydrocarbylgermyl, halide, hydrocarbyloxy, trihydrocarbylsiloxy, bis(trihydrocarbylsilyl) amino, di(hydrocarbyl)amino, hydrocarbadiylamino, hydrocarbylimino, di(hydrocarbyl)phosphino, hydrocarbadiylphosphino, hydrocarbylsulfido, halo-substituted hydrocarbyl, hydrocarbyloxy-substituted hydrocarbyl, trihydrocarbylsilyl-substituted hydrocarbyl, trihydrocarbylsiloxy-substituted hydrocarbyl, bis(trihydrocarbylsilyl)amino-substituted hydrocarbyl, di(hydrocarbyl)amino-substituted hydrocarbyl, hydrocarbyleneamino-substituted hydrocarbyl, di(hydrocarbyl) phosphino-substituted hydrocarbyl, hydrocarbylenephosphino-substituted hydrocarbyl, or hydrocarbylsulfido-substituted hydrocarbyl, said R group having up to 40 atoms not counting hydrogen atoms, and optionally two adjacent $R^4$ groups may be joined together forming a polycyclic fused ring group;

M is titanium;

X' is $SiR^6_2$, $CR^6_2$, $SiR^6_2SiR^6_2$, $CR^6_2CR^6_2$, $CR^6=CR^6$, $CR^6_2SiR^6_2$, $BR^6$, $BR^6L"$, or $GeR^6_2$;

Y is —O—, —S—, —$NR^5$—, —$PR^5$—; —$NR^5_2$, or —$PR^5_2$;

$R^5$, independently at each occurrence is hydrocarbyl, trihydrocarbylsilyl, or trihydrocarbylsilylhydrocarbyl, said $R^5$ having up to 20 atoms other than hydrogen, and optionally two $R^5$ groups or $R^5$ together with Y or Z form a ring system; $R^6$, independently at each occurrence, is hydrogen, or a member selected from hydrocarbyl, hydrocarbyloxy, silyl, halogenated alkyl, halogenated aryl, —$NR^5_2$, and combinations thereof, said $R^6$ having up to 20 non-hydrogen atoms, and optionally, two $R^6$ groups or $R^6$ together with Z forms a ring system;

Z is a neutral diene or a monodentate or polydentate Lewis base optionally bonded to $R^5$, $R^6$, or X;

X is hydrogen, a monovalent anionic ligand group having up to 60 atoms not counting hydrogen, or two X groups are joined together thereby forming a divalent ligand group;

x is 1 or 2; and z is 0, 1 or 2.

Additional examples of suitable metal complexes herein are polycyclic complexes corresponding to the formula:

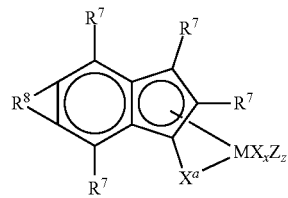

where M is titanium in the +2, +3 or +4 formal oxidation state;

$R^7$ independently at each occurrence is hydride, hydrocarbyl, silyl, germyl, halide, hydrocarbyloxy, hydrocarbylsiloxy, hydrocarbylsilylamino, di(hydrocarbyl)amino, hydrocarbyleneamino, di(hydrocarbyl)phosphino, hydrocarbylene-phosphino, hydrocarbylsulfido, halo-substituted hydrocarbyl, hydrocarbyloxy-substituted hydrocarbyl, silyl-substituted hydrocarbyl, hydrocarbylsiloxy-substituted hydrocarbyl, hydrocarbylsilylamino-substituted hydrocarbyl, di(hydrocarbyl)amino-substituted hydrocarbyl, hydrocarbyleneamino-substituted hydrocarbyl, di(hydrocarbyl) phosphino-substituted hydrocarbyl, hydrocarbylenephosphino-substituted hydrocarbyl, or hydrocarbylsulfido-substituted hydrocarbyl, said $R^7$ group having up to 40 atoms not counting hydrogen, and optionally two or more of the foregoing groups may together form a divalent derivative;

$R^8$ is a divalent hydrocarbylene- or substituted hydrocarbylene group forming a fused system with the remainder of the metal complex, said $R^8$ containing from 1 to 30 atoms not counting hydrogen;

$X^a$ is a divalent moiety, or a moiety comprising one π-bond and a neutral two electron pair able to form a coordinate-covalent bond to M, said $X^a$ comprising boron, or a member of Group 14 of the Periodic Table of the Elements, and also comprising nitrogen, phosphorus, sulfur or oxygen;

X is a monovalent anionic ligand group having up to 60 atoms exclusive of the class of ligands that are cyclic, delocalized, π-bound ligand groups and optionally two X groups together form a divalent ligand group;

Z independently at each occurrence is a neutral ligating compound having up to 20 atoms;

x is 0, 1 or 2; and z is zero or 1.

Additional examples of metal complexes that are usefully employed as catalysts are complexes of polyvalent Lewis bases, such as compounds corresponding to the formula:

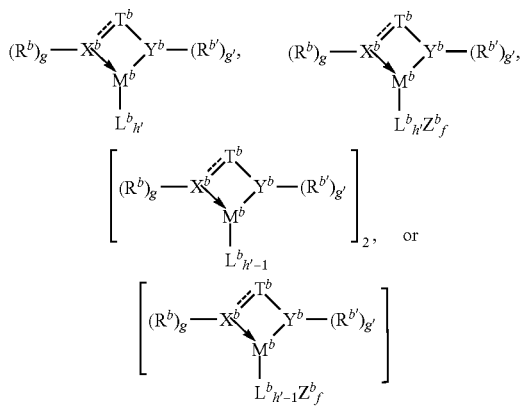

wherein $T^b$ is a bridging group, preferably containing 2 or more atoms other than hydrogen, $X^b$ and $Y^b$ are each independently selected from the group consisting of nitrogen, sulfur, oxygen and phosphorus; more preferably both $X^b$ and $Y^b$ are nitrogen, $R^b$ and $R^{b'}$ independently each occurrence are hydrogen or $C_{1-50}$ hydrocarbyl groups optionally containing one or more heteroatoms or inertly substituted derivative thereof. Non-limiting examples of suitable $R^b$ and $R^{b'}$ groups include alkyl, alkenyl, aryl, aralkyl, (poly)alkylaryl and cycloalkyl groups, as well as nitrogen, phosphorus, oxygen and halogen substituted derivatives thereof. Specific examples of suitable $R^b$ and $R^{b'}$ groups include methyl, ethyl, isopropyl, octyl, phenyl, 2,6-dimethylphenyl, 2,6-di(isopropyl)phenyl, 2,4,6-trimethylphenyl, pentafluorophenyl, 3,5-trifluoromethylphenyl, and benzyl;

g and g' are each independently 0 or 1;

$M^b$ is a metallic element selected from Groups 3 to 15, or the Lanthanide series of the Periodic Table of the Elements. Preferably, $M^b$ is a Group 3-13 metal, more preferably $M^b$ is a Group 4-10 metal;

$L^b$ is a monovalent, divalent, or trivalent anionic ligand containing from 1 to 50 atoms, not counting hydrogen. Examples of suitable $L^b$ groups include halide; hydride; hydrocarbyl, hydrocarbyloxy; di(hydrocarbyl)amido, hydrocarbyleneamido, di(hydrocarbyl)phosphido; hydrocarbylsulfido; hydrocarbyloxy, tri(hydrocarbylsilyl)alkyl; and carboxylates. More preferred $L^b$ groups are C1-20 alkyl, $C_{7-20}$ aralkyl, and chloride;

h and h' are each independently an integer from 1 to 6, preferably from 1 to 4, more preferably from 1 to 3, and j is 1 or 2, with the value h x j selected to provide charge balance;

$Z^b$ is a neutral ligand group coordinated to $M^b$, and containing up to 50 atoms not counting hydrogen. Preferred $Z^b$ groups include aliphatic and aromatic amines, phosphines, and ethers, alkenes, alkadienes, and inertly substituted derivatives thereof. Suitable inert substituents include halogen, alkoxy, aryloxy, alkoxycarbonyl, aryloxycarbonyl, di(hydrocarbyl)amine, tri(hydrocarbyl)silyl, and nitrile groups. Preferred $Z^b$ groups include triphenylphosphine, tetrahydrofuran, pyridine, and 1,4-diphenylbutadiene;

f is an integer from 1 to 3;

two or three of $T^b$, $R^b$ and $R^{b'}$ may be joined together to form a single or multiple ring structure;

h is an integer from 1 to 6, preferably from 1 to 4, more preferably from 1 to 3;

In one embodiment, it is preferred that $R^b$ have relatively low steric hindrance with respect to $X^b$. In this embodiment, most preferred $R^b$ groups are straight chain alkyl groups, straight chain alkenyl groups, branched chain alkyl groups wherein the closest branching point is at least 3 atoms removed from $X^b$, and halo, dihydrocarbylamino, alkoxy or trihydrocarbylsilyl substituted derivatives thereof. Highly preferred $R^b$ groups in this embodiment are C1-8 straight chain alkyl groups.

At the same time, in this embodiment $R^{b'}$ preferably has relatively high steric hindrance with respect to $Y^b$. Non-limiting examples of suitable $R^{b'}$ groups for this embodiment include alkyl or alkenyl groups containing one or more secondary or tertiary carbon centers, cycloalkyl, aryl, alkaryl, aliphatic or aromatic heterocyclic groups, organic or inorganic oligomeric, polymeric or cyclic groups, and halo, dihydrocarbylamino, alkoxy or trihydrocarbylsilyl substituted derivatives thereof. Preferred $R^{b'}$ groups in this embodiment contain from 3 to 40, more preferably from 3 to 30, and most preferably from 4 to 20 atoms not counting hydrogen and are branched or cyclic. Examples of preferred $T^b$ groups are structures corresponding to the following formulas:

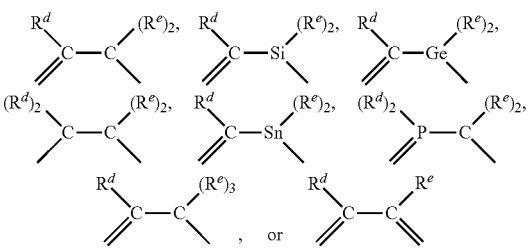

wherein

Each $R^d$ is C1-10 hydrocarbyl group, preferably methyl, ethyl, n-propyl, i-propyl, t-butyl, phenyl, 2,6-dimethylphenyl, benzyl, or tolyl. Each $R^e$ is C1-10 hydrocarbyl, preferably methyl, ethyl, n-propyl, i-propyl, t-butyl, phenyl, 2,6-dimethylphenyl, benzyl, or tolyl. In addition, two or more $R^d$ or $R^e$ groups, or mixtures of Rd and Re groups may together form a divalent or polyvalent derivative of a hydrocarbyl group, such as, 1,4-butylene, 1,5-pentylene, or a cyclic ring, or a multicyclic fused ring, polyvalent hydrocarbyl- or heterohydrocarbyl-group, such as naphthalene-1,8-diyl.

Suitable examples of the foregoing polyvalent Lewis base complexes include:

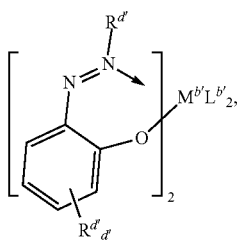

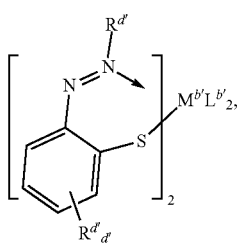

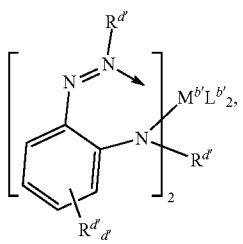

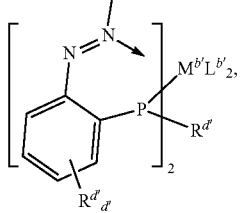

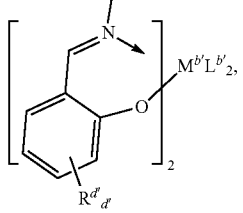

-continued

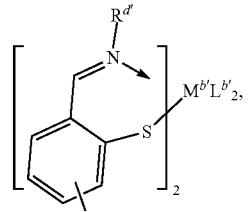

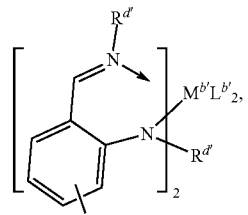

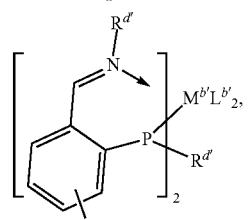

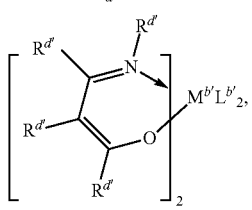

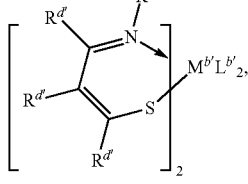

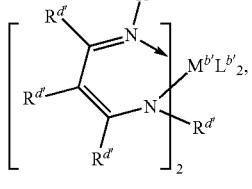

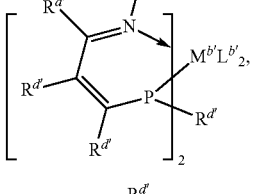

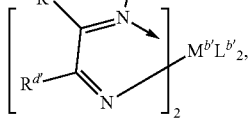

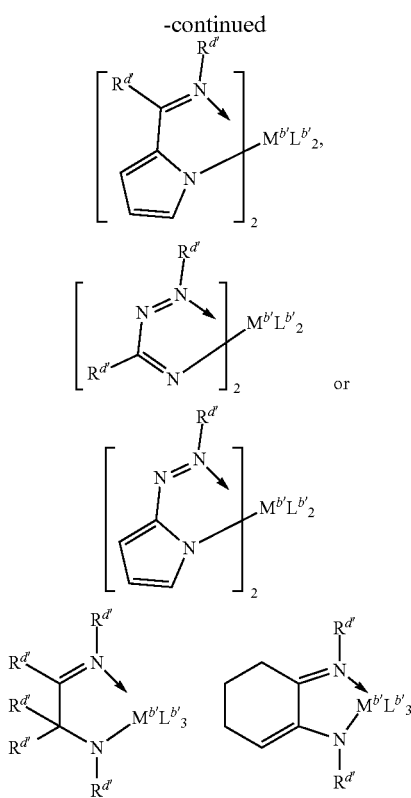

wherein $R^{d'}$ at each occurrence is independently selected from the group consisting of hydrogen and C1-50 hydrocarbyl groups optionally containing one or more heteroatoms, or inertly substituted derivative thereof, or further optionally, two adjacent $R^{d'}$ groups may together form a divalent bridging group;

d' is 4;

$M^{b'}$ is a Group 4 metal, preferably titanium or hafnium, or a Group 10 metal, preferably Ni or Pd;

$L^{b'}$ is a monovalent ligand of up to 50 atoms not counting hydrogen, preferably halide or hydrocarbyl, or two $L^{b'}$ groups together are a divalent or neutral ligand group, preferably a $C_{2-50}$ hydrocarbylene, hydrocarbadiyl or diene group.

The polyvalent Lewis base complexes for use in the present invention especially include Group 4 metal derivatives, especially hafnium derivatives of hydrocarbylamine substituted heteroaryl compounds corresponding to the formula:

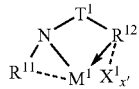

wherein:

$R^{11}$ is selected from alkyl, cycloalkyl, heteroalkyl, cycloheteroalkyl, aryl, and inertly substituted derivatives thereof containing from 1 to 30 atoms not counting hydrogen or a divalent derivative thereof;

$T^1$ is a divalent bridging group of from 1 to 41 atoms other than hydrogen, preferably 1 to 20 atoms other than hydrogen, and most preferably a mono- or di-$C_{1}$-20 hydrocarbyl substituted methylene or silane group; and $R^{12}$ is a $C_{5-20}$ heteroaryl group containing Lewis base functionality, especially a pyridin-2-yl- or substituted pyridin-2-yl group or a divalent derivative thereof;

$M^1$ is a Group 4 metal, preferably hafnium;

$X^1$ is an anionic, neutral or dianionic ligand group;

x' is a number from 0 to 5 indicating the number of such $X^1$ groups; and bonds, optional bonds and electron donative interactions are represented by lines, dotted lines and arrows respectively.

Suitable complexes are those wherein ligand formation results from hydrogen elimination from the amine group and optionally from the loss of one or more additional groups, especially from $R^{12}$. In addition, electron donation from the Lewis base functionality, preferably an electron pair, provides additional stability to the metal center. Suitable metal complexes correspond to the formula:

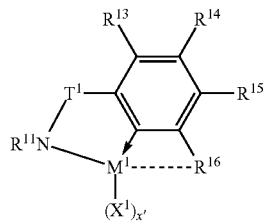

wherein $M^1$, $X^1$, x', $R^{11}$ and $T^1$ are as previously defined, $R^{13}$, $R^{14}$, $R^{15}$ and $R^{16}$ are hydrogen, halo, or an alkyl, cycloalkyl, heteroalkyl, heterocycloalkyl, aryl, or silyl group of up to 20 atoms not counting hydrogen, or adjacent $R^{13}$, $R^{14}$, $R^{15}$ or $R^{16}$ groups may be joined together thereby forming fused ring derivatives, and bonds, optional bonds and electron pair donative interactions are represented by lines, dotted lines and arrows respectively. Suitable examples of the foregoing metal complexes correspond to the formula:

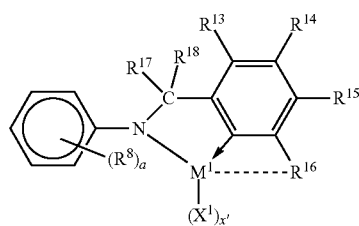

wherein $M^1$, $X^1$, and x' are as previously defined, $R^{13}$, $R^{14}$, $R^{15}$ and $R^{16}$ are as previously defined, preferably $R^{13}$, $R^{14}$, and $R^{15}$ are hydrogen, or C1-4 alkyl, and $R^{16}$ is $C_{6-20}$ aryl, most preferably naphthalenyl;

$R^a$ independently at each occurrence is $C_{1-4}$ alkyl, and a is 1-5, most preferably Rain two ortho-positions to the nitrogen is isopropyl or t-butyl;

$R^{17}$ and $R^{18}$ independently at each occurrence are hydrogen, halogen, or a $C_{1-20}$ alkyl or aryl group, most preferably one of $R^{17}$ and $R^{18}$ is hydrogen and the other is a C6-20 aryl group, especially 2-isopropyl, phenyl or a fused polycyclic aryl group, most preferably an anthracenyl group, and bonds, optional bonds and electron pair donative interactions are represented by lines, dotted lines and arrows respectively.

Exemplary metal complexes for use herein as catalysts correspond to the formula:

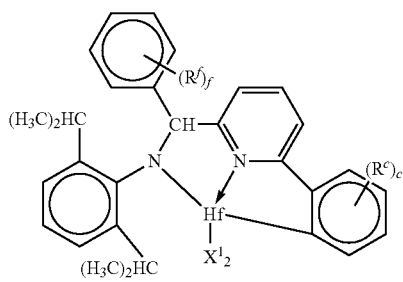

wherein X¹ at each occurrence is halide, N,N-dimethylamido, or $C_{1-4}$ alkyl, and preferably at each occurrence X¹ is methyl;

$R^f$ independently at each occurrence is hydrogen, halogen, C1-20 alkyl, or C6-20 aryl, or two adjacent $R^f$ groups are joined together thereby forming a ring, and f is 1-5; and $R^c$ independently at each occurrence is hydrogen, halogen, $C_{1-20}$ alkyl, or $C_{6-20}$ aryl, or two adjacent $R^c$ groups are joined together thereby forming a ring, and c is 1-5.

Suitable examples of metal complexes for use as catalysts according to the present invention are complexes of the following formulas:

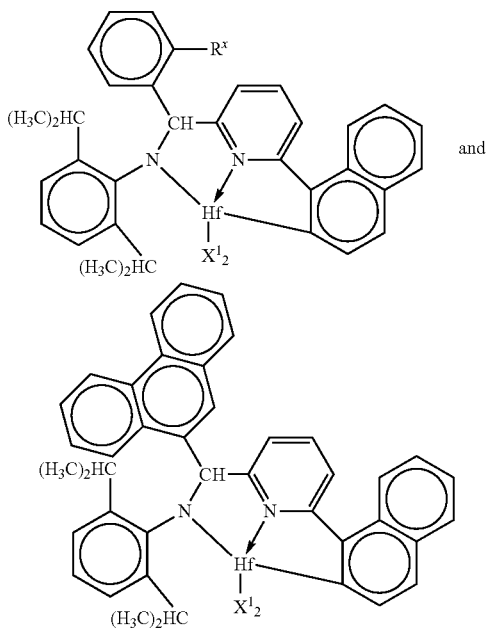

and wherein $R^x$ is C1-4 alkyl or cycloalkyl, preferably methyl, isopropyl, t-butyl or cyclohexyl; and X¹ at each occurrence is halide, N,N-dimethylamido, or C1-4 alkyl, preferably methyl.

Examples of metal complexes usefully employed as catalysts according to the present invention include:

[N-(2,6-di(1-methylethyl)phenyl)amido)(o-tolyl)(α-naphthalen-2-diyl(6-pyridin-2-diyl)methane)]hafnium dimethyl;

[N-(2,6-di(1-methylethyl)phenyl)amido)(o-tolyl)(α-naphthalen-2-diyl(6-pyridin-2-diyl)methane)]hafnium di(N,N-dimethylamido);

[N-(2,6-di(1-methylethyl)phenyl)amido)(o-tolyl)(α-naphthalen-2-diyl(6-pyridin-2-diyl)methane)]hafnium dichloride;

[N-(2,6-di(1-methylethyl)phenyl)amido)(2-isopropylphenyl)(α-naphthalen-2-diyl(6-pyridin-2-diyl)methane)]hafnium dimethyl;

[N-(2,6-di(1-methylethyl)phenyl)amido)(2-isopropylphenyl)(α-naphthalen-2-diyl(6-pyridin-2-diyl)methane)]hafnium di(N,N-dimethylamido);

[N-(2,6-di(1-methylethyl)phenyl)amido)(2-isopropylphenyl)(α-naphthalen-2-diyl(6-pyridin-2-diyl)methane)]hafnium dichloride;

[N-(2,6-di(1-methylethyl)phenyl)amido)(phenanthren-5-yl)(α-naphthalen-2-diyl(6-pyridin-2-diyl)methane)]hafhium dimethyl;

[N-(2,6-di(1-methylethyl)phenyl)amido)(phenanthren-5-yl)(α-naphthalen-2-diyl(6-pyridin-2-diyl)methane)]hafhium di(N,N-dimethylamido); and

[N-(2,6-di(1-methylethyl)phenyl)amido)(phenanthren-5-yl)(α-naphthalen-2-diyl(6-pyridin-2-diyl)methane)]hafnium dichloride.

Under the reaction conditions used to prepare the metal complexes used in the present disclosure, the hydrogen of the 2-position of the α-naphthalene group substituted at the 6-position of the pyridin-2-yl group is subject to elimination, thereby uniquely forming metal complexes wherein the metal is covalently bonded to both the resulting amide group and to the 2-position of the α-naphthalenyl group, as well as stabilized by coordination to the pyridinyl nitrogen atom through the electron pair of the nitrogen atom.

Further procatalysts that are suitable include imidazole-amine compounds corresponding to those disclosed in WO 2007/130307A2, WO 2007/130306A2, and U.S. Patent Application Publication No. 20090306318A1, which are incorporated herein by reference in their entirety. Such imidazole-amine compounds include those corresponding to the formula:

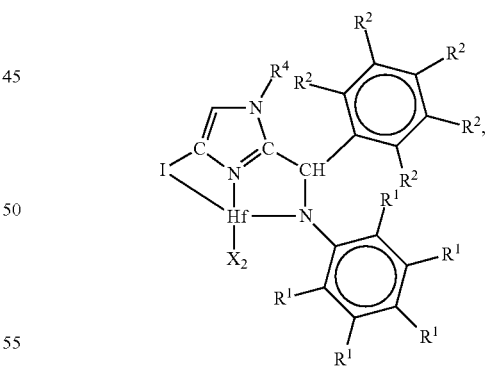

wherein

X independently each occurrence is an anionic ligand, or two X groups together form a dianionic ligand group, or a neutral diene; T is a cycloaliphatic or aromatic group containing one or more rings; $R^1$ independently each occurrence is hydrogen, halogen, or a univalent, polyatomic anionic ligand, or two or more $R^1$ groups are joined together thereby forming a polyvalent fused ring system; $R^2$ independently each occurrence is hydrogen, halogen, or a univalent, polyatomic anionic ligand, or two or more $R^2$ groups are joined together thereby forming a polyvalent fused ring system; and $R^4$ is hydrogen, alkyl, aryl, aralkyl, trihydrocarbylsilyl, or trihydrocarbylsilylmethyl of from 1 to 20 carbons.

Further examples of such imidazole-amine compounds include but are not limited to the following:

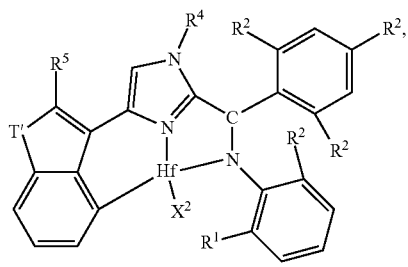

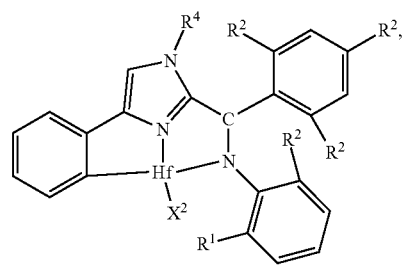

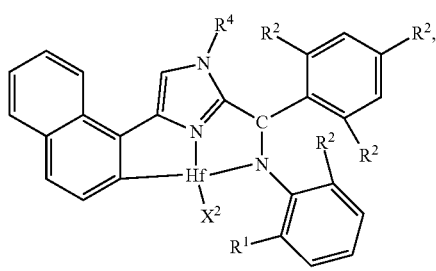

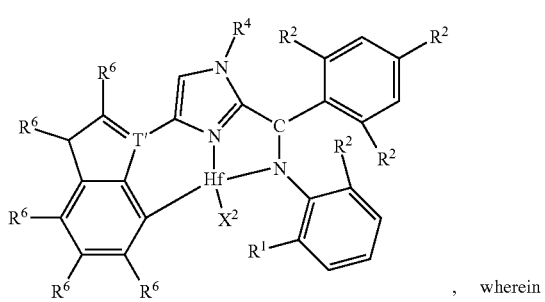

, wherein wherein:
$R^1$ independently each occurrence is a $C_{3-12}$ alkyl group wherein the carbon attached to the phenyl ring is secondary or tertiary substituted; $R^2$ independently each occurrence is hydrogen or a $C_{1-2}$ alkyl group; $R^4$ is methyl or isopropyl; $R^5$ is hydrogen or $C_{1-6}$ alkyl; $R^6$ is hydrogen, $C_{1-6}$ alkyl or cycloalkyl, or two adjacent $R^6$ groups together form a fused aromatic ring; T' is oxygen, sulfur, or a $C_{1-20}$ hydrocarbyl-substituted nitrogen or phosphorus group; T'' is nitrogen or phosphorus; and X is methyl or benzyl.

Additional suitable metal complexes of polyvalent Lewis bases for use herein include compounds corresponding to the formula:

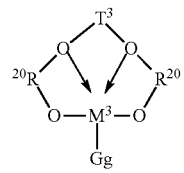

wherein:
$R^{20}$ is an aromatic or inertly substituted aromatic group containing from 5 to 20 atoms not counting hydrogen, or a polyvalent derivative thereof;

$T^3$ is a hydrocarbylene or hydrocarbyl silane group having from 1 to 20 atoms not counting hydrogen, or an inertly substituted derivative thereof;

$M^3$ is a Group 4 metal, preferably zirconium or hafnium;

G is an anionic, neutral or dianionic ligand group; preferably a halide, hydrocarbyl, silane, trihydrocarbylsilylhydrocarbyl, trihydrocarbylsilyl, or dihydrocarbylamide group having up to 20 atoms not counting hydrogen;

g is a number from 1 to 5 indicating the number of such G groups; and bonds and electron donative interactions are represented by lines and arrows respectively.

Illustratively, such complexes correspond to the formula:

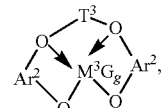

wherein:
$T^3$ is a divalent bridging group of from 2 to 20 atoms not counting hydrogen, preferably a substituted or unsubstituted, C3-6 alkylene group;

and $Ar^2$ independently at each occurrence is an arylene or an alkyl- or aryl-substituted arylene group of from 6 to 20 atoms not counting hydrogen;

$M^3$ is a Group 4 metal, preferably hafnium or zirconium;

G independently at each occurrence is an anionic, neutral or dianionic ligand group;

g is a number from 1 to 5 indicating the number of such X groups; and electron donative interactions are represented by arrows.

Suitable examples of metal complexes of foregoing formula include the following compounds

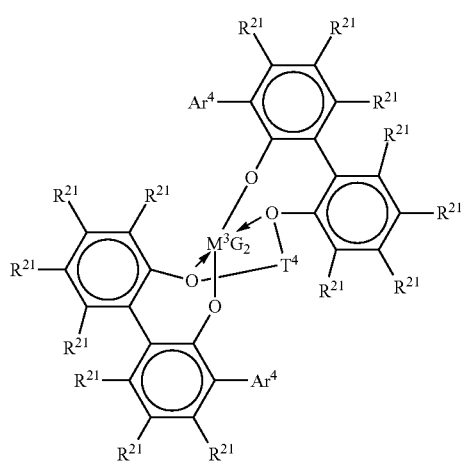

where $M^3$ is Hf or Zr;

Ar$^4$ is $C_{6-20}$ aryl or inertly substituted derivatives thereof, especially 3,5-di(isopropyl)phenyl, 3,5-di(isobutyl) phenyl, dibenzo-1H-pyrrole-1-yl, or anthracen-5-yl, and $T^4$ independently at each occurrence comprises a $C_{3-6}$ alkylene group, a $C_{3-6}$ cycloalkylene group, or an inertly substituted derivative thereof;

$R^{21}$ independently at each occurrence is hydrogen, halo, hydrocarbyl, trihydrocarbylsilyl, or trihydrocarbylsilylhydrocarbyl of up to 50 atoms not counting hydrogen; and G, independently at each occurrence is halo or a hydrocarbyl or trihydrocarbylsilyl group of up to 20 atoms not counting hydrogen, or 2 G groups together are a divalent derivative of the foregoing hydrocarbyl or trihydrocarbylsilyl groups.

Suitable compounds are compounds of the formulas:

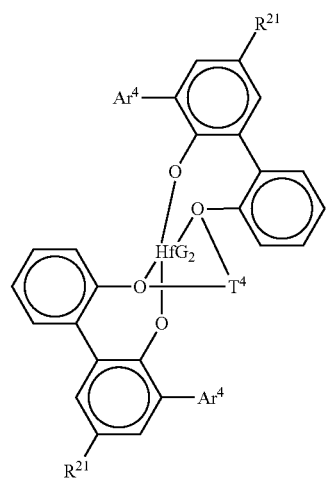

wherein Ar$^4$ is 3,5-di(isopropyl)phenyl, 3,5-di(isobutyl) phenyl, dibenzo-1H-pyrrole-1-yl, or anthracen-5-yl,
$R^{21}$ is hydrogen, halo, or C1-4 alkyl, especially methyl
$T^4$ is propan-1,3-diyl or butan-1,4-diyl, and
G is chloro, methyl or benzyl.

Exemplary metal complexes of the foregoing formula are:

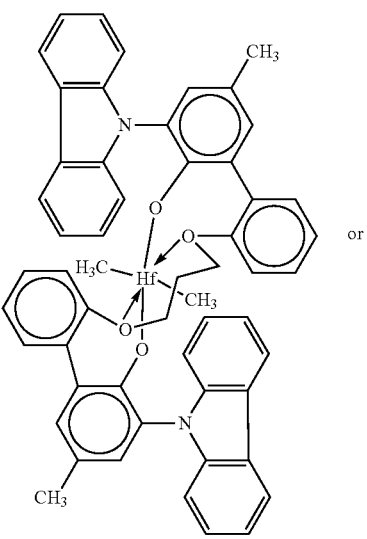

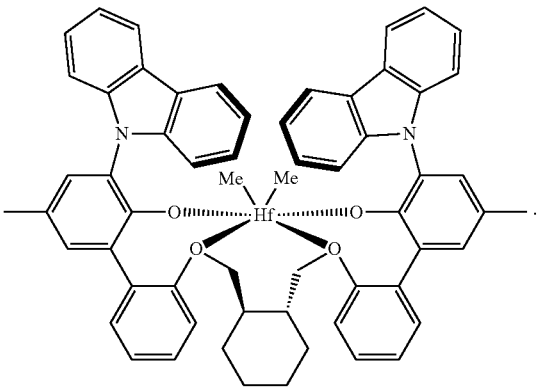

Suitable metal complexes for use according to the present disclosure further include compounds corresponding to the formula:

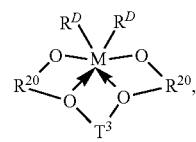

where:

M is zirconium or hafnium;

$R^{20}$ independently at each occurrence is a divalent aromatic or inertly substituted aromatic group containing from 5 to 20 atoms not counting hydrogen;

$T^3$ is a divalent hydrocarbon or silane group having from 3 to 20 atoms not counting hydrogen, or an inertly substituted derivative thereof; and $R^D$ independently at each occurrence is a monovalent ligand group of from 1 to 20 atoms, not counting hydrogen, or two $R^D$ groups together are a divalent ligand group of from 1 to 20 atoms, not counting hydrogen.

Such complexes may correspond to the formula:

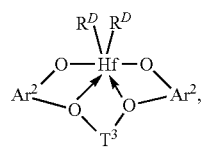

wherein:
- $Ar^2$ independently at each occurrence is an arylene or an alkyl-, aryl-, alkoxy- or amino-substituted arylene group of from 6 to 20 atoms not counting hydrogen or any atoms of any substituent;
- $T^3$ is a divalent hydrocarbon bridging group of from 3 to 20 atoms not counting hydrogen, preferably a divalent substituted or unsubstituted $C_{3-6}$ aliphatic, cycloaliphatic, or bis(alkylene)-substituted cycloaliphatic group having at least 3 carbon atoms separating oxygen atoms; and
- $R^D$ independently at each occurrence is a monovalent ligand group of from 1 to 20 atoms, not counting hydrogen, or two $R^D$ groups together are a divalent ligand group of from 1 to 40 atoms, not counting hydrogen.

Further examples of metal complexes suitable for use herein include compounds of the formula:

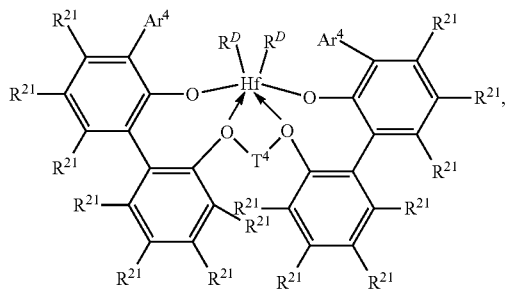

where
- $Ar^4$ independently at each occurrence is $C_{6-20}$ aryl or inertly substituted derivatives thereof, especially 3,5-di(isopropyl)phenyl, 3,5-di(isobutyl)phenyl, dibenzo-1H-pyrrole-1-yl, naphthyl, anthracen-5-yl, 1,2,3,4,6,7,8,9-octahydroanthracen-5-yl;
- $T^4$ independently at each occurrence is a propylene-1,3-diyl group, a bis(alkylene)cyclohexan-1,2-diyl group, or an inertly substituted derivative thereof substituted with from 1 to 5 alkyl, aryl or aralkyl substituents having up to 20 carbons each;
- $R^{21}$ independently at each occurrence is hydrogen, halo, hydrocarbyl, trihydrocarbylsilyl, trihydrocarbylsilylhydrocarbyl, alkoxy or amino of up to 50 atoms not counting hydrogen; and
- $R^D$, independently at each occurrence is halo or a hydrocarbyl or trihydrocarbylsilyl group of up to 20 atoms not counting hydrogen, or 2 $R^D$ groups together are a divalent hydrocarbylene, hydrocarbadiyl or trihydrocarbylsilyl group of up to 40 atoms not counting hydrogen.

Exemplary metal complexes are compounds of the formula:

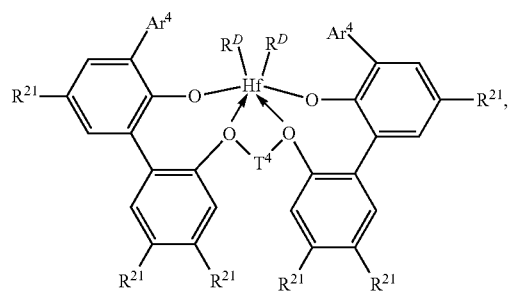

where, $Ar^4$, independently at each occurrence, is 3,5-di(isopropyl)phenyl, 3,5-di(isobutyl)phenyl, dibenzo-1H-pyrrole-1-yl, or anthracen-5-yl,
- $R^{21}$ independently at each occurrence is hydrogen, halo, hydrocarbyl, trihydrocarbylsilyl, trihydrocarbylsilylhydrocarbyl, alkoxy or amino of up to 50 atoms not counting hydrogen;
- $T^4$ is propan-1,3-diyl or bis(methylene)cyclohexan-1,2-diyl; and
- $R^D$, independently at each occurrence is halo or a hydrocarbyl or trihydrocarbylsilyl group of up to 20 atoms not counting hydrogen, or 2 $R^D$ groups together are a hydrocarbylene, hydrocarbadiyl or hydrocarbylsilanediyl group of up to 40 atoms not counting hydrogen.

Suitable metal complexes according to the present disclosure correspond to the formulas:

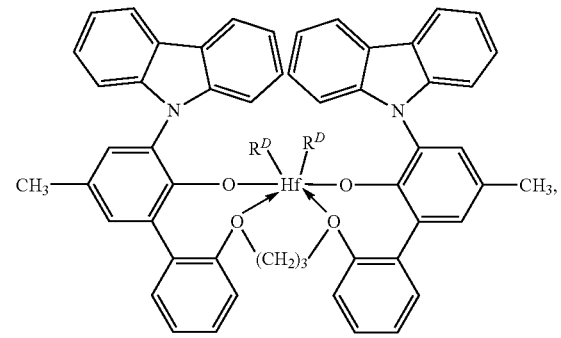

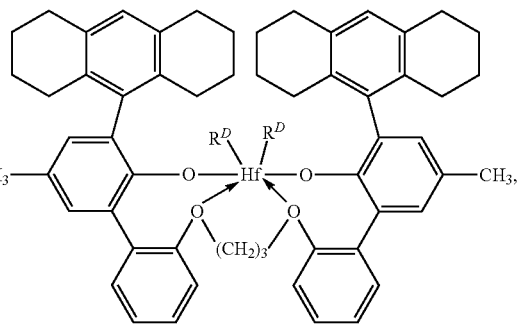

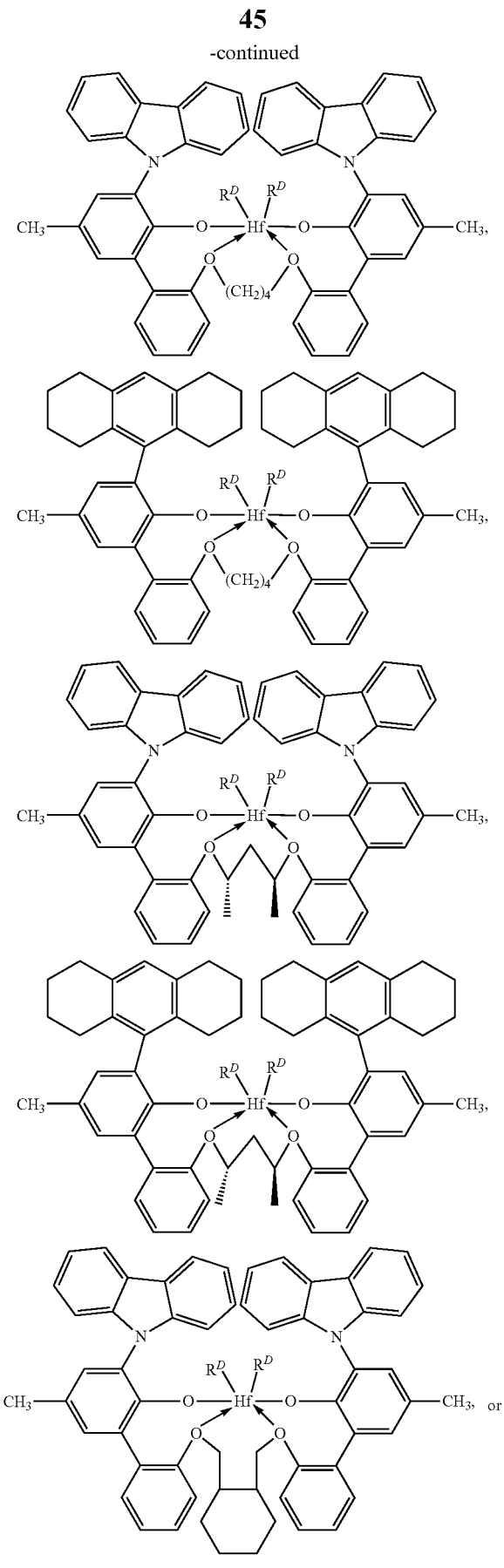
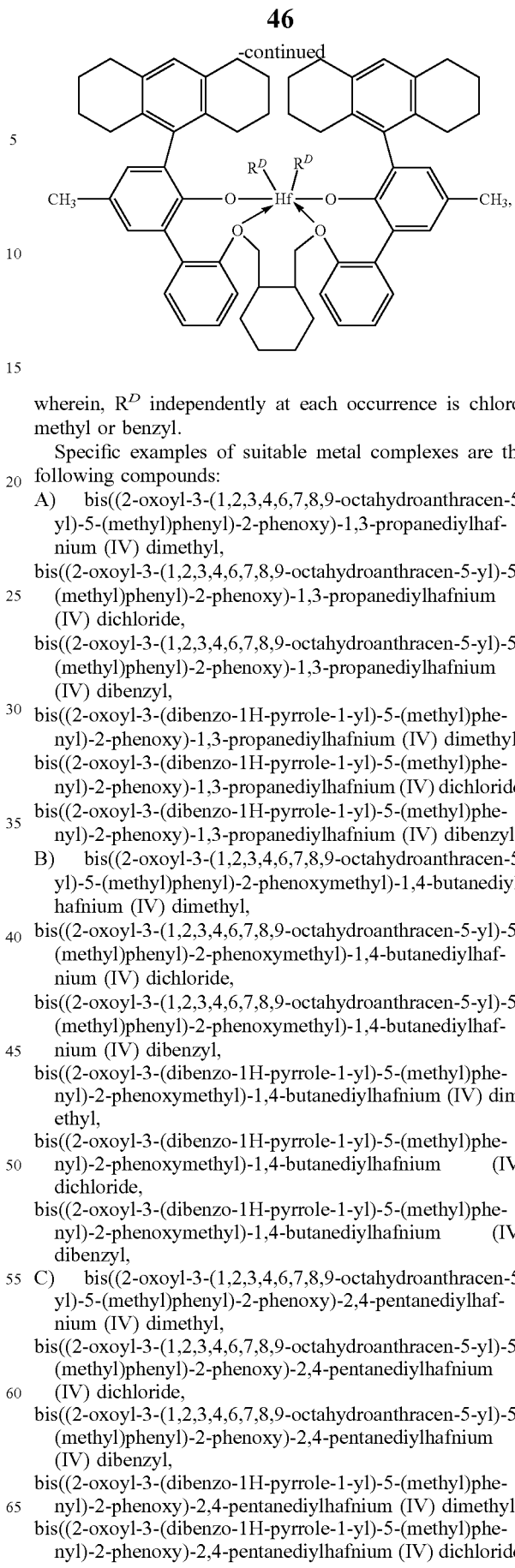

wherein, $R^D$ independently at each occurrence is chloro, methyl or benzyl.

Specific examples of suitable metal complexes are the following compounds:
A) bis((2-oxoyl-3-(1,2,3,4,6,7,8,9-octahydroanthracen-5-yl)-5-(methyl)phenyl)-2-phenoxy)-1,3-propanediylhafnium (IV) dimethyl,
bis((2-oxoyl-3-(1,2,3,4,6,7,8,9-octahydroanthracen-5-yl)-5-(methyl)phenyl)-2-phenoxy)-1,3-propanediylhafnium (IV) dichloride,
bis((2-oxoyl-3-(1,2,3,4,6,7,8,9-octahydroanthracen-5-yl)-5-(methyl)phenyl)-2-phenoxy)-1,3-propanediylhafnium (IV) dibenzyl,
bis((2-oxoyl-3-(dibenzo-1H-pyrrole-1-yl)-5-(methyl)phenyl)-2-phenoxy)-1,3-propanediylhafnium (IV) dimethyl,
bis((2-oxoyl-3-(dibenzo-1H-pyrrole-1-yl)-5-(methyl)phenyl)-2-phenoxy)-1,3-propanediylhafnium (IV) dichloride,
bis((2-oxoyl-3-(dibenzo-1H-pyrrole-1-yl)-5-(methyl)phenyl)-2-phenoxy)-1,3-propanediylhafnium (IV) dibenzyl,
B) bis((2-oxoyl-3-(1,2,3,4,6,7,8,9-octahydroanthracen-5-yl)-5-(methyl)phenyl)-2-phenoxymethyl)-1,4-butanediylhafnium (IV) dimethyl,
bis((2-oxoyl-3-(1,2,3,4,6,7,8,9-octahydroanthracen-5-yl)-5-(methyl)phenyl)-2-phenoxymethyl)-1,4-butanediylhafnium (IV) dichloride,
bis((2-oxoyl-3-(1,2,3,4,6,7,8,9-octahydroanthracen-5-yl)-5-(methyl)phenyl)-2-phenoxymethyl)-1,4-butanediylhafnium (IV) dibenzyl,
bis((2-oxoyl-3-(dibenzo-1H-pyrrole-1-yl)-5-(methyl)phenyl)-2-phenoxymethyl)-1,4-butanediylhafnium (IV) dimethyl,
bis((2-oxoyl-3-(dibenzo-1H-pyrrole-1-yl)-5-(methyl)phenyl)-2-phenoxymethyl)-1,4-butanediylhafnium (IV) dichloride,
bis((2-oxoyl-3-(dibenzo-1H-pyrrole-1-yl)-5-(methyl)phenyl)-2-phenoxymethyl)-1,4-butanediylhafnium (IV) dibenzyl,
C) bis((2-oxoyl-3-(1,2,3,4,6,7,8,9-octahydroanthracen-5-yl)-5-(methyl)phenyl)-2-phenoxy)-2,4-pentanediylhafnium (IV) dimethyl,
bis((2-oxoyl-3-(1,2,3,4,6,7,8,9-octahydroanthracen-5-yl)-5-(methyl)phenyl)-2-phenoxy)-2,4-pentanediylhafnium (IV) dichloride,
bis((2-oxoyl-3-(1,2,3,4,6,7,8,9-octahydroanthracen-5-yl)-5-(methyl)phenyl)-2-phenoxy)-2,4-pentanediylhafnium (IV) dibenzyl,
bis((2-oxoyl-3-(dibenzo-1H-pyrrole-1-yl)-5-(methyl)phenyl)-2-phenoxy)-2,4-pentanediylhafnium (IV) dimethyl,
bis((2-oxoyl-3-(dibenzo-1H-pyrrole-1-yl)-5-(methyl)phenyl)-2-phenoxy)-2,4-pentanediylhafnium (IV) dichloride, bis((2-oxoyl-3-(dibenzo-1H-pyrrole-1-yl)-5-(methyl)phenyl)-2-phenoxy)-2,4-pentanediylhafnium (IV) dibenzyl, D) bis((2-oxoyl-3-(1,2,3,4,6,7,8,9-octahydroanthracen-5-yl)-5-(methyl)phenyl)-2-phenoxymethyl)-methylenetrans-1,2-cyclohexanediylhafnium (IV) dimethyl, bis((2-oxoyl-3-(1,2,3,4,6,7,8,9-octahydroanthracen-5-yl)-5-(methyl)phenyl)-2-phenoxymethyl)-methylenetrans-1,2-cyclohexanediylhafnium (IV) dichloride, bis((2-oxoyl-3-(1,2,3,4,6,7,8,9-octahydroanthracen-5-yl)-5-(methyl)phenyl)-2-phenoxymethyl)-methylenetrans-1,2-cyclohexanediylhafnium (IV) dibenzyl, bis((2-oxoyl-3-(dibenzo-1H-pyrrole-1-yl)-5-(methyl)phenyl)-2-phenoxymethyl)-methylenetrans-1,2-cyclohexanediylhafnium (IV) dimethyl, bis((2-oxoyl-3-(dibenzo-1H-pyrrole-1-yl)-5-(methyl)phenyl)-2-phenoxymethyl)-methylenetrans-1,2-cyclohexanediylhafnium (IV) dichloride, and bis((2-oxoyl-3-(dibenzo-1H-pyrrole-1-yl)-5-(methyl)phenyl)-2-phenoxymethyl)-methylenetrans-1,2-cyclohexanediylhafnium (IV) dibenzyl.

The foregoing metal complexes may be conveniently prepared by standard metallation and ligand exchange procedures involving a source of the transition metal and a neutral polyfunctional ligand source. The techniques employed are the same as or analogous to those disclosed in U.S. Pat. No. 6,827,976 and US2004/0010103, and elsewhere.

The foregoing polyvalent Lewis base complexes are conveniently prepared by standard metallation and ligand exchange procedures involving a source of the Group 4 metal and the neutral polyfunctional ligand source. In addition, the complexes may also be prepared by means of an amide elimination and hydrocarbylation process starting from the corresponding Group 4 metal tetraamide and a hydrocarbylating agent, such as trimethylaluminum. Other techniques may be used as well. These complexes are known from the disclosures of, among others, U.S. Pat. Nos. 6,320,005, 6,103,657, WO 02/38628, WO 03/40195, and U.S. Ser. No. 04/022,0050.

Catalysts having high comonomer incorporation properties are also known to reincorporate in situ prepared long chain olefins resulting incidentally during the polymerization through β-hydride elimination and chain termination of growing polymer, or other process. The concentration of such long chain olefins is particularly enhanced by use of continuous solution polymerization conditions at high conversions, especially ethylene conversions of 95 percent or greater, more preferably at ethylene conversions of 97 percent or greater. Under such conditions a small but detectable quantity of olefin terminated polymer may be reincorporated into a growing polymer chain, resulting in the formation of long chain branches, that is, branches of a carbon length greater than would result from other deliberately added comonomer. Moreover, such chains reflect the presence of other comonomers present in the reaction mixture. That is, the chains may include short chain or long chain branching as well, depending on the comonomer composition of the reaction mixture. Long chain branching of olefin polymers is further described in U.S. Pat. Nos. 5,272,236, 5,278,272, and 5,665,800.

Alternatively, branching, including hyper-branching, may be induced in a particular segment of the present multi-block copolymers by the use of specific catalysts known to result in "chain-walking" in the resulting polymer. For example, certain homogeneous bridged bis indenyl- or partially hydrogenated bis indenyl-zirconium catalysts, disclosed by Kaminski, et al., *J. Mol. Catal. A: Chemical,* 102 (1995) 59-65; Zambelli, et al., *Macromolecules,* 1988, 21, 617-622; or Dias, et al., *J. Mol. Catal. A: Chemical,* 185 (2002) 57-64 may be used to prepare branched copolymers from single monomers, including ethylene.

Additional complexes suitable for use include Group 4-10 derivatives corresponding to the formula:

wherein
$M^2$ is a metal of Groups 4-10 of the Periodic Table of the elements, preferably Group 4 metals, Ni(II) or Pd(II), most preferably zirconium;
$T^2$ is a nitrogen, oxygen or phosphorus containing group;
$X^2$ is halo, hydrocarbyl, or hydrocarbyloxy;
t is one or two;
x" is a number selected to provide charge balance;
and $T^2$ and N are linked by a bridging ligand.

Such catalysts have been previously disclosed in *J. Am. Chem. Soc.,* 118, 267-268 (1996), *J. Am. Chem. Soc.,* 117, 6414-6415 (1995), and *Organometallics,* 16, 1514-1516, (1997), among other disclosures.

Suitable examples of the foregoing metal complexes for use as catalysts are aromatic diimine or aromatic dioxyimine complexes of Group 4 metals, especially zirconium, corresponding to the formula:

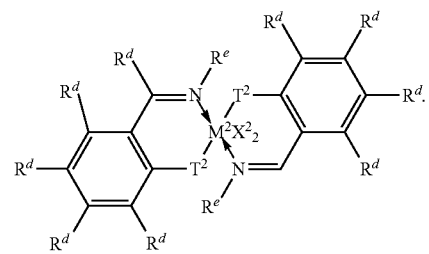

wherein;
$M^2$, $X^2$ and $T^2$ are as previously defined;
$R^d$ independently in each occurrence is hydrogen, halogen, or $R^e$; and
$R^e$ independently in each occurrence is C1-20 hydrocarbyl or a heteroatom-, especially a F, N, S or P-substituted derivative thereof, more preferably C1-20 hydrocarbyl or a F or N substituted derivative thereof, most preferably alkyl, dialkylaminoalkyl, pyrrolyl, piperidenyl, perfluorophenyl, cycloalkyl, (poly)alkylaryl, or aralkyl.

Suitable examples of the foregoing metal complexes for use as catalysts are aromatic dioxyimine complexes of zirconium, corresponding to the formula:

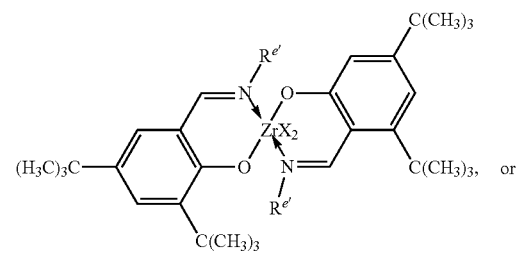

, or

-continued

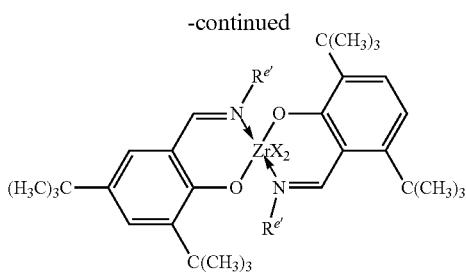

wherein;

X² is as previously defined, preferably C1-10 hydrocarbyl, most preferably methyl or benzyl; and $R^{e'}$ is methyl, isopropyl, t-butyl, cyclopentyl, cyclohexyl, 2-methylcyclohexyl, 2,4-dimethylcyclohexyl, 2-pyrrolyl, N-methyl-2-pyrrolyl, 2-piperidenyl, N-methyl-2-piperidenyl, benzyl, o-tolyl, 2,6-dimethylphenyl, perfluorophenyl, 2,6-di(isopropyl)phenyl, or 2,4,6-trimethylphenyl.

The foregoing complexes for use as also include certain phosphinimine complexes are disclosed in EP-A-890581. These complexes correspond to the formula: $[(R^f)_3\text{—P=N}]_f M(K^2)(R^f)_{3-f}$, wherein: $R^f$ is a monovalent ligand or two $R^f$ groups together are a divalent ligand, preferably $R^f$ is hydrogen or C1-4 alkyl;

M is a Group 4 metal, $K^2$ is a group containing delocalized π-electrons through which $K^2$ is bound to M, said $K^2$ group containing up to 50 atoms not counting hydrogen atoms, and f is 1 or 2.

Further suitable procatalysts include a those disclosed in WO 2017/173080 A1, which is incorporated by reference in its entirety. Such procatalysts include the metal-ligand complex of Formula (i):

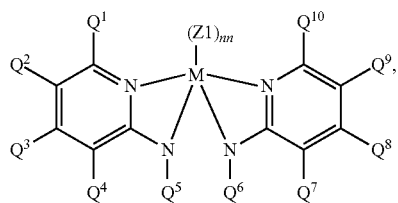

(i)

wherein M is titanium, zirconium, or hafnium;

wherein each Z1 is independently a monodentate or polydentate ligand that is neutral, monoanionic, or dianionic, wherein nn is an integer, and wherein Z1 and nn are chosen in such a way that the metal-ligand complex of Formula (i) is overall neutral;

wherein each $Q^1$ and $Q^{10}$ independently is selected from the group consisting of $(C_6-C_{40})$aryl, substituted $(C_6-C_{40})$aryl, $(C_3-C_{40})$heteroaryl, and substituted $(C_3-C_{40})$heteroaryl;

wherein each $Q^2$, $Q^3$, $Q^4$, $Q^7$, $Q^8$, and $Q^9$ independently is selected from a group consisting of hydrogen, $(C_1-C_{40})$ hydrocarbyl, substituted $(C_1-C_{40})$hydrocarbyl, $(C_1-C_{40})$heterohydrocarbyl, substituted $(C_1-C_{40})$heterohydrocarbyl, halogen, and nitro ($NO_2$);

wherein each $Q^5$ and $Q^6$ independently is selected from the group consisting of a $(C_1-C_{40})$alkyl, substituted $(C_1-C_{40})$alkyl, and $[(Si)_1\text{—}(C+Si)_{40}]$ substituted organosilyl;

wherein each N independently is nitrogen;

optionally, two or more of the $Q^{1-5}$ groups can combine together to form a ring structure, with such ring structure having from 5 to 16 atoms in the ring excluding any hydrogen atoms; and optionally, two or more of the $Q^{6-10}$ groups can combine together to form a ring structure, with such ring structure having from 5 to 16 atoms in the ring excluding any hydrogen atoms.

The metal ligand complex of Formula (i) above, and all specific embodiments thereof herein, is intended to include every possible stereoisomer, including coordination isomers, thereof.

The metal ligand complex of Formula (i) above provides for homoleptic as well as heteroleptic procatalyst components.

In an alternative embodiment, each of the $(C_1-C_{40})$ hydrocarbyl and $(C_1-C_{40})$ heterohydrocarbyl of any one or more of $Q^1$, $Q^2$, $Q^3$, $Q^4$, $Q^5$, $Q^6$, $Q^7$, $Q^8$, $Q^9$ and $Q^{10}$ each independently is unsubstituted or substituted with one or more $R^S$ substituents, and wherein each $R^S$ independently is a halogen atom, polyfluoro substitution, perfluoro substitution, unsubstituted $(C_1-C_{18})$alkyl, $(C_6-C_{18})$aryl, $F_3C$, $FCH_2O$, $F_2HCO$, $F_3CO$, $(R^{C1})_3Si$, $(R^{C1})_3Ge$, $(R^{C1})O$, $(R^{C1})S$, $(R^{C1})S(O)$, $(R^{C1})S(O)_2$, $(R^{C1})_2P$, $(R^{C1})_2N$, $(R^{C1})_2C$=N, NC, $NO_2$, $(R^{C1})C(O)O$, $(R^{C1})OC(O)$, $(R^{C1})C(O)N(R^{C1})$, or $(R^{C1})_2NC(O)$, or two of the $R^S$ are taken together to form an unsubstituted $(C_1-C_{18})$alkylene where each $R^S$ independently is an unsubstituted $(C_1-C_{18})$alkyl, and wherein independently each $R^{C1}$ is hydrogen, unsubstituted $(C_1-C_{18})$ hydrocarbyl or an unsubstituted $(C_1-C_{18})$heterohydrocarbyl, or absent (e.g., absent when N comprises —N=). In particular embodiments, $Q^5$ and $Q^6$ are each independently $(C_1-C_{40})$ primary or secondary alkyl groups with respect to their connection to the amine nitrogen of the parent ligand structure. The terms primary and secondary alkyl groups are given their usual and customary meaning herein; i.e., primary indicating that the carbon atom directly linked to the ligand nitrogen bears at least two hydrogen atoms and secondary indicates that the carbon atom directly linked to the ligand nitrogen bears only one hydrogen atom.

Optionally, two or more $Q^{1-5}$ groups or two or more $Q^{6-10}$ groups each independently can combine together to form ring structures, with such ring structures having from 5 to 16 atoms in the ring excluding any hydrogen atoms.

In preferred embodiments, $Q^5$ and $Q^6$ are each independently $(C_1-C_{40})$ primary or secondary alkyl groups and most preferably, $Q^5$ and $Q^6$ are each independently propyl, isopropyl, neopentyl, hexyl, isobutyl and benzyl.

In particular embodiments, $Q^1$ and $Q^{10}$ of the olefin polymerization procatalyst of Formula (i) are substituted phenyl groups; as shown in Formula (ii),

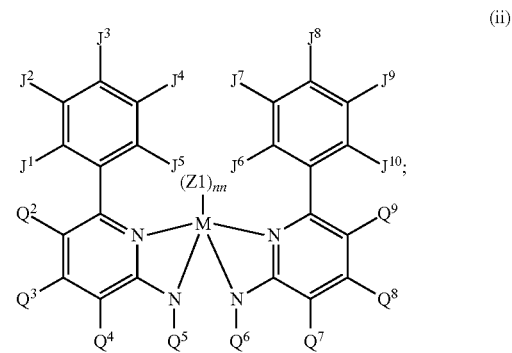

(ii)

wherein $J^1$-$J^{10}$ are each independently selected from the group consisting of $R^S$ substituents and hydrogen; and wherein each $R^S$ independently is a halogen atom, polyfluoro substitution, perfluoro substitution, unsubstituted $(C_1$-$C_{18})$alkyl, $(C_6$-$C_{18})$aryl, $F_3C$, $FCH_2O$, $F_2HCO$, $F_3CO$, $(R^{C1})_3Si$, $(R^{C1})_3Ge$, $(R^{C1})O$, $(R^{C1})S$, $(R^{C1})S(O)$, $(R^{C1})S(O)_2$, $(R^{C1})_2P$, $(R^{C1})_2N$, $(R^{C1})_2C$=N, NC, $NO_2$, $(R^{C1})C(O)O$, $(R^{C1})OC(O)$, $(R^{C1})C(O)N(R^{C1})$, or $(R^{C1})_2NC(O)$, or two of the $R^S$ are taken together to form an unsubstituted $(C_1$-$C_{18})$alkylene where each $R^S$ independently is an unsubstituted $(C_1$-$C_{18})$alkyl, and wherein independently each $R^{C1}$ is hydrogen, unsubstituted $(C_1$-$C_{18})$hydrocarbyl or an unsubstituted $(C_1$-$C_{18})$heterohydrocarbyl, or absent (e.g., absent when N comprises —N=). More preferably, $J^1$, $J^5$, $J^6$ and $J^{10}$ of Formula (ii) are each independently selected from the group consisting of halogen atoms, $(C_1$-$C_8)$ alkyl groups, and $(C_1$-$C_8)$ alkoxyl groups. Most preferably, $J^1$, $J^5$, $J^6$ and $J^{10}$ of Formula (ii) are each independently methyl; ethyl or isopropyl.

The term "[(Si)$_1$—(C+Si)$_{40}$] substituted organosilyl" means a substituted silyl radical with 1 to 40 silicon atoms and 0 to 39 carbon atoms such that the total number of carbon plus silicon atoms is between 1 and 40. Examples of [(Si)$_1$-(C+Si)$_{40}$] substituted organosilyl include trimethylsilyl, triisopropylsilyl, dimethylphenylsilyl, diphenylmethylsilyl, triphenylsilyl, and triethylsilyl.

Preferably, there are no O—O, S—S, or O—S bonds, other than O—S bonds in an S(O) or S(O)$_2$ diradical functional group, in the metal-ligand complex of Formula (i). More preferably, there are no O—O, P—P, S—S, or O—S bonds, other than O—S bonds in an S(O) or S(O)$_2$ diradical functional group, in the metal-ligand complex of Formula (i).

M is titanium, zirconium, or hafnium. In one embodiment, M is titanium. In another embodiment, M is zirconium. In another embodiment, M is hafnium. In some embodiments, M is in a formal oxidation state of +2, +3, or +4. Each Z1 independently is a monodentate or polydentate ligand that is neutral, monoanionic, or dianionic. Z1 and nn are chosen in such a way that the metal-ligand complex of Formula (i) is, overall, neutral. In some embodiments each Z1 independently is the monodentate ligand. In one embodiment when there are two or more Z1 monodentate ligands, each Z1 is the same. In some embodiments the monodentate ligand is the monoanionic ligand. The monoanionic ligand has a net formal oxidation state of −1. Each monoanionic ligand may independently be hydride, $(C_1$-$C_{40})$hydrocarbyl carbanion, $(C_1$-$C_{40})$heterohydrocarbyl carbanion, halide, nitrate, carbonate, phosphate, borate, borohydride, sulfate, HC(O)O$^-$, alkoxide or aryloxide (RO$^-$), $(C_1$-$C_{40})$hydrocarbylC(O)O$^-$, HC(O)N(H)$^-$, $(C_1$-$C_{40})$hydrocarbylC(O)N(H)$^-$, $(C_1$-$C_{40})$hydrocarbylC(O)N((C_1$-$C_{20})$hydrocarbyl)$^-$, $R^K R^L B^-$, $R^K R^L N^-$, $R^K O^-$, $R^K S^-$, $R^K R^L P^-$, or $R^M R^K R^L Si^-$, wherein each $R^K$, $R^L$, and $R^M$ independently is hydrogen, $(C_1$-$C_{40})$hydrocarbyl, or $(C_1$-$C_{40})$heterohydrocarbyl, or $R^K$ and $R^L$ are taken together to form a $(C_2$-$C_{40})$hydrocarbylene or $(C_1$-$C_{40})$heterohydrocarbylene and $R^M$ is as defined above.

In some embodiments at least one monodentate ligand of Z1 independently is the neutral ligand. In one embodiment, the neutral ligand is a neutral Lewis base group that is $R^{X1}NR^K R^L$, $R^K OR^L$, $R^K SR^L$, or $R^{X1}PR^K R^L$, wherein each $R^{X1}$ independently is hydrogen, $(C_1$-$C_{40})$hydrocarbyl, [(C$_1$-C$_{10}$)hydrocarbyl]$_3$Si, [(C$_1$-C$_{10}$)hydrocarbyl]$_3$Si(C$_1$-C$_{10}$)hydrocarbyl, or $(C_1$-$C_{40})$heterohydrocarbyl and each $R^K$ and $R^L$ independently is as defined above.

In some embodiments, each Z1 is a monodentate ligand that independently is a halogen atom, unsubstituted $(C_1$-$C_{20})$hydrocarbyl, unsubstituted $(C_1$-$C_{20})$hydrocarbylC(O)O—, or $R^K R^L N$— wherein each of $R^K$ and $R^L$ independently is an unsubstituted $(C_1$-$C_{20})$hydrocarbyl. In some embodiments each monodentate ligand Z1 is a chlorine atom, $(C_1$-$C_{10})$hydrocarbyl (e.g., $(C_1$-$C_6)$alkyl or benzyl), unsubstituted $(C_1$-$C_{10})$hydrocarbylC(O)O—, or $R^K R^L N$— wherein each of $R^K$ and $R^L$ independently is an unsubstituted $(C_1$-$C_{10})$hydrocarbyl.

In some embodiments there are at least two Z1s and the two Z1s are taken together to form the bidentate ligand. In some embodiments the bidentate ligand is a neutral bidentate ligand. In one embodiment, the neutral bidentate ligand is a diene of Formula $(R^{D1})_2C$=C(R^{D1})—C(R^{D1})=C(R^{D1})_2$, wherein each $R^{D1}$ independently is H, unsubstituted $(C_1$-$C_6)$alkyl, phenyl, or naphthyl. In some embodiments the bidentate ligand is a monoanionic-mono(Lewis base) ligand. The monoanionic-mono(Lewis base) ligand may be a 1,3-dionate of Formula (D): $R^{E1}$—C(O$^-$)=CH—C(=O)—$R^{E1}$ (D), wherein each $R^{E1}$ independently is H, unsubstituted $(C_1$-$C_6)$alkyl, phenyl, or naphthyl. In some embodiments the bidentate ligand is a dianionic ligand. The dianionic ligand has a net formal oxidation state of −2. In one embodiment, each dianionic ligand independently is carbonate, oxalate (i.e., $^-O_2CC(O)O^-$), $(C_2$-$C_{40})$hydrocarbylene dicarbanion, $(C_1$-$C_{40})$heterohydrocarbylene dicarbanion, phosphate, or sulfate.

As previously mentioned, number and charge (neutral, monoanionic, dianionic) of Z1 are selected depending on the formal oxidation state of M such that the metal-ligand complex of Formula (i) is, overall, neutral.

In some embodiments each Z1 is the same, wherein each Z1 is methyl; isobutyl; neopentyl; neophyl; trimethylsilylmethyl; phenyl; benzyl; or chloro. In some embodiments nn is 2 and each Z1 is the same.

In some embodiments at least two Z1 are different. In some embodiments, each Z1 is a different one of methyl; isobutyl; neopentyl; neophyl; trimethylsilylmethyl; phenyl; benzyl; and chloro.

In one embodiment, the metal-ligand complex of Formula (i) is a mononuclear metal complex.

Further suitable procatalysts include those disclosed in Acc. Chem. Res., 2015, 48 (8), pp 2209-2220, including but not limited to those of the following structures:

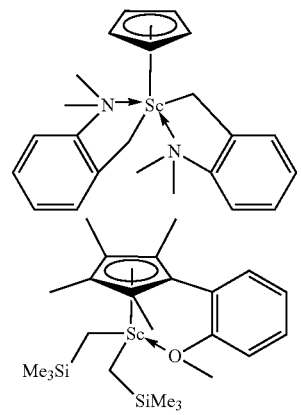

Suitable procatalyst further include "single-component catalysts" that can catalyze olefin polymerization without the use of a co-catalyst. Such simple-component catalysts include those disclosed in Watson, P. L. *J. Am. Chem. Soc.* 1982, 104, 337-339; Yasuda, H.; Ihara, E. *Adv. Polym. Sci.*

1997, 133, 53-101; Ihara, E.; Nodono, M.; Katsura, K.; Adachi, Y.; Yasuda, H.; Yamagashira, M.; Hashimoto, H.; Kanehisa, N.; and Kai, Y. *Organometallics* 1998, 17, 3945-3956; Long, D. P.; Bianconi, P. A. *J. Am. Chem. Soc.* 1996, 118, 12453-12454; Gilchrist, J. H.; Bercaw, J. E. *J. Am. Chem. Soc.* 1996, 118, 12021-12028; Mitchell, J. P.; Hajela, S.; Brookhart, S. K.; Hardcastle, K. I.; Henling, L. M.; Bercaw, J. E. *J. Am. Chem. Soc.* 1996,118, 1045-1053; Evans, W. J.; DeCoster, D. M.; Greaves, J.*Organometallics* 1996, 15, 3210-3221; Evans, W. J.; DeCoster, D. M.; Greaves, J. *Macromolecules* 1995, 28, 7929-7936; Shapiro, P. J.; Cotter, W. D.; Schaefer, W. P.; Labinger, J. A.; Bercaw, J. E. *J. Am. Chem. Soc.* 1994, 116, 4623-4640; Schaverien, C. J. *Organometallics* 1994, 13, 69-82; Coughlin, E. B. *J. Am. Chem. Soc.* 1992, 114, 7606-7607; Piers, W. E.; Bercaw, J. E. *J. Am. Chem. Soc.* 1990, 112, 9406-9407; Burger, B. J.; Thompson, M. E., Cotter, W. D.; Bercaw, J. E. *J. Am. Chem. Soc.* 1990,112, 1566-1577; Shapiro, P. J.; Bunel, E.; Schaefer, W. P. *Organometallics* 1990, 9, 867-869; Jeske, G.; Lauke, H.; Mauermann, H.; Swepston, P. N.; Schumann, H.; Marks, T. J. *J. Am. Chem. Soc.* 1985, 107, 8091-8103; Jeske, G.; Schock, L. E.; Swepston, P. N.; Schumann, H.; Marks, T. J. *J. Am. Chem. Soc.* 1985, 107, 8103-8110; and *Organometallics,* 2001, 20 (9), pp 1752-1761. Exemplary, non-limiting formulas of such simple-component catalysts include:

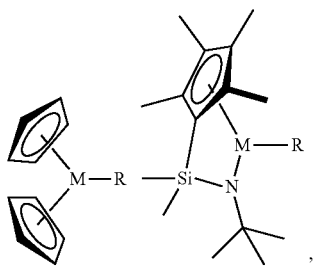

wherein:

M is Sm or Y; and R is a monovalent ligand of up to 50 atoms not counting hydrogen, preferably halide or hydrocarbyl.

Suitable procatalysts include but are not limited to the following named as (Cat 1) to (Cat 17).

(Cat 1) may be prepared according to the teachings of WO 03/40195 and U.S. Pat. No. 6,953,764 B2 and has the following structure:

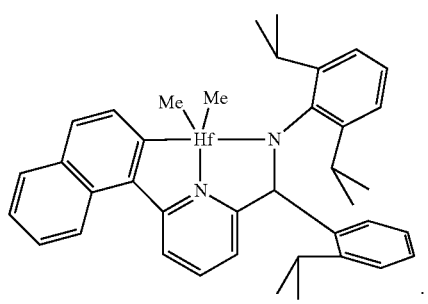

(Cat 1)

(Cat 2) may be prepared according to the teachings of WO 03/40195 and WO 04/24740 and has the following structure:

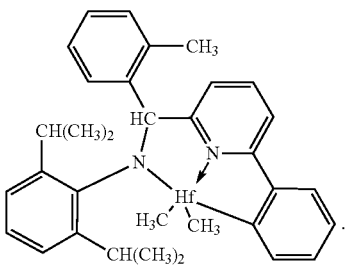

(Cat 2)

(Cat 3) may be prepared according to methods known in the art and has the following structure:

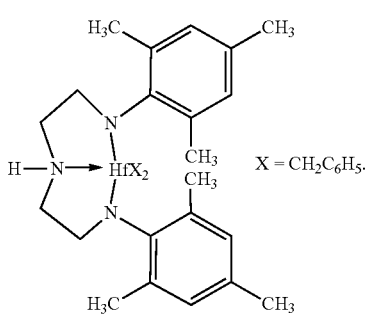

(Cat 3)

(Cat 4) may be prepared according to the teachings of U.S. Patent Application Publication No. 2004/0010103 and has the following structure:

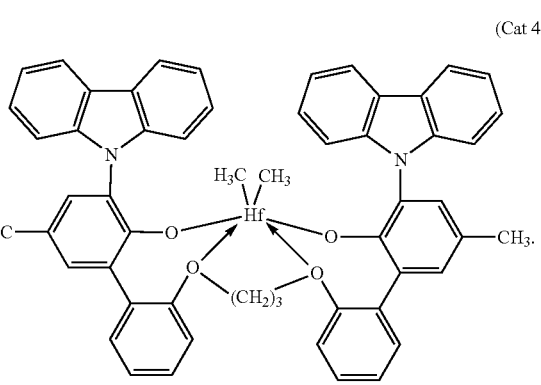

(Cat 4)

(Cat 5) may be prepared according to the teachings of U.S. Pat. No. 7,858,706 B2 and has the following structure:

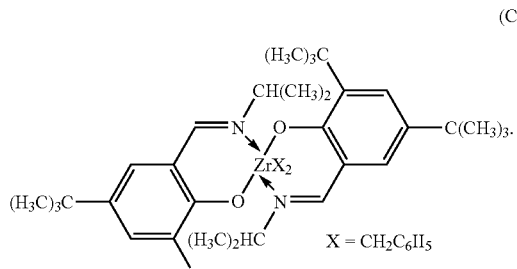
(Cat 5)

(Cat 6) may be prepared according to the teachings of U.S. Pat. No. 7,858,706 B2 and has the following structure:

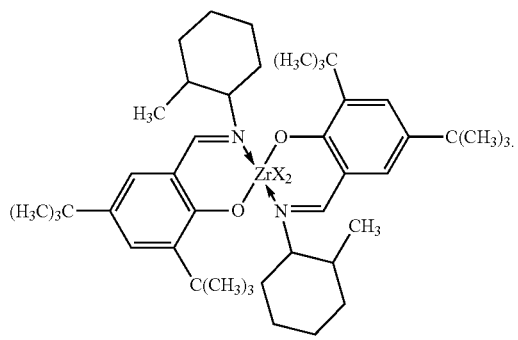
(Cat 6)

X = CH$_2$C$_6$H$_5$ (Cat 7) may be prepared by the teachings of U.S. Pat. No. 6,268,444 and has the following structure:

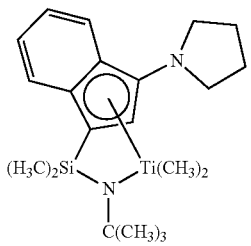
(Cat 7)

(Cat 8) may be prepared according to the teachings of U.S. Pat. Pub. No. 2003/004286 and has the following structure:

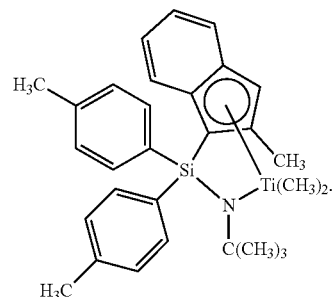
(Cat 8)

(Cat 9) may be prepared according to the teachings of U.S. Pat. Pub. No. 2003/004286 and has the following structure:

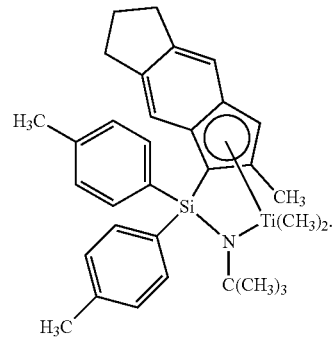
(Cat 9)

(Cat 10) is commercially available from Sigma-Aldrich and has the following structure:

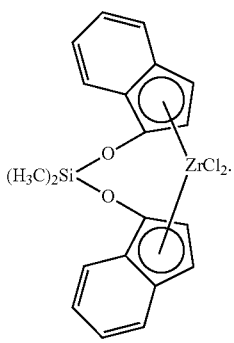
(Cat 10)

(Cat 11) may be prepared according to the teachings of WO 2017/173080 A1 and has the following structure:

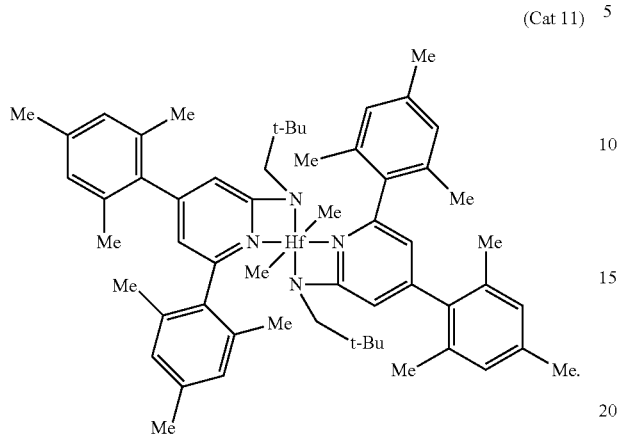

(Cat 12) may be prepared according to the teachings of WO 2017/173080 A1 and has the following structure:

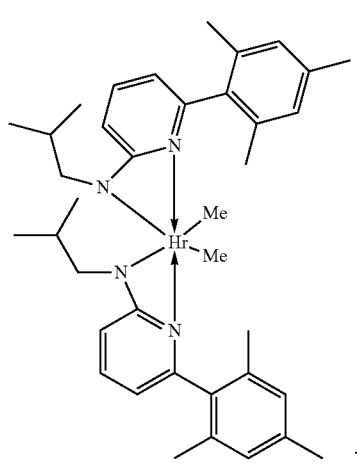

(Cat 13) may be prepared according to the teachings of Macromolecules (Washington, DC, United States), 43(19), 7903-7904 (2010) and has the following structure:

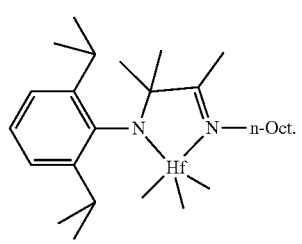

(Cat 14) may be prepared according to the teachings of WO 2011/102989 A1 and has the following structure:

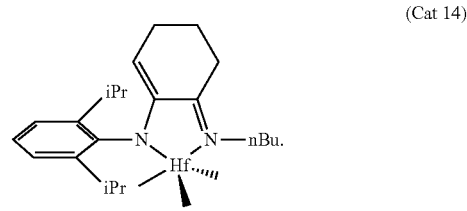

(Cat 15) may be prepared according to the teachings of U.S. Pat. No. 8,101,696 B2 and has the following structure:

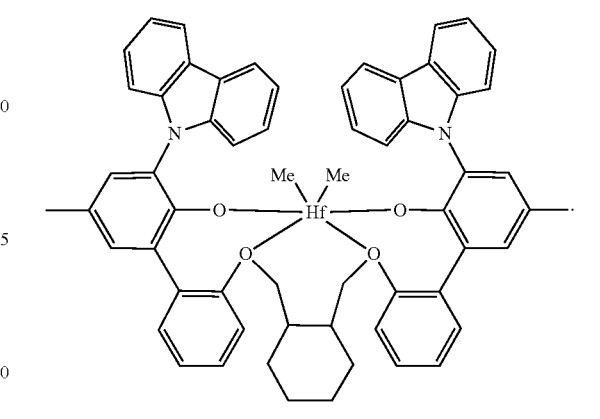

(Cat 16) may be prepared according to the teachings of WO 2018/170138 A1 and has the following structure:

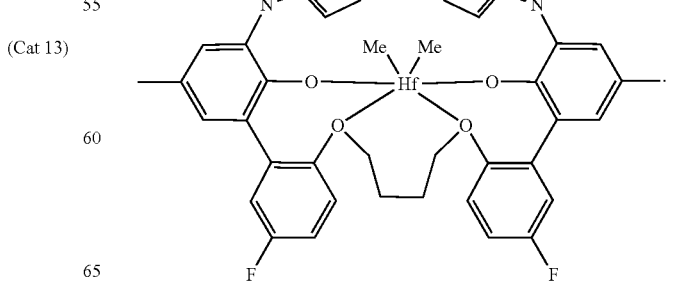

(Cat 17) may be prepared according to the teachings of WO 2018/170138 A1 and has the following structure:

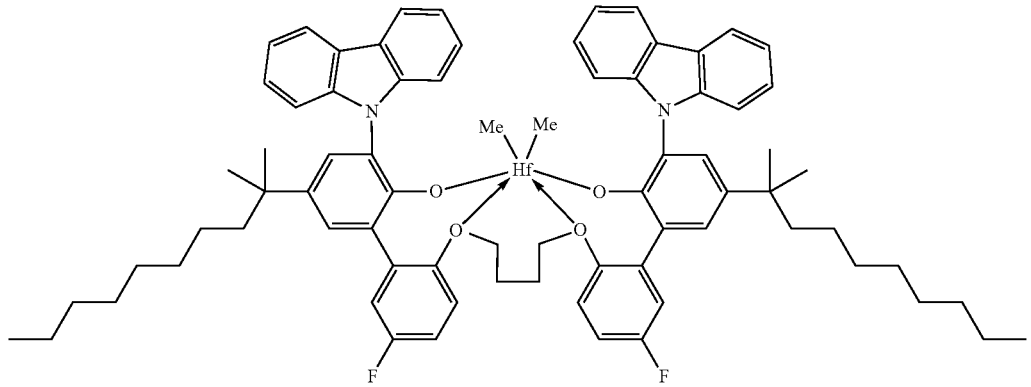

(Cat 17)

In certain embodiments, the (c1) catalyst component comprises a procatalyst and a co-catalyst. In these embodiments, the procatalyst may be activated to form an active catalyst by combination with a co-catalyst (activator), preferably a cation forming co-catalyst, a strong Lewis acid, or a combination thereof.

Suitable cation forming co-catalysts include those previously known in the art for metal olefin polymerization complexes. Examples include neutral Lewis acids, such as $C_{1-30}$ hydrocarbyl substituted Group 13 compounds, especially tri(hydrocarbyl)boron compounds and halogenated (including perhalogenated) derivatives thereof, having from 1 to 10 carbons in each hydrocarbyl or halogenated hydrocarbyl group, more especially perfluorinated tri(aryl)boron compounds, and most especially tris(pentafluoro-phenyl) borane; nonpolymeric, compatible, noncoordinating, ion forming compounds (including the use of such compounds under oxidizing conditions), especially the use of ammonium-, phosphonium-, oxonium-, carbonium-, silylium- or sulfonium-salts of compatible, noncoordinating anions, or ferrocenium-, lead- or silver salts of compatible, noncoordinating anions; and combinations of the foregoing cation forming cocatalysts and techniques. The foregoing activating co-catalysts and activating techniques have been previously taught with respect to different metal complexes for olefin polymerizations in the following references: EP-A-277,003; U.S. Pat. Nos. 5,153,157; 5,064,802; 5,321,106; 5,721,185; 5,350,723; 5,425,872; 5,625,087; 5,883,204; 5,919,983; 5,783,512; WO 99/15534, and WO99/42467.

Combinations of neutral Lewis acids, especially the combination of a trialkyl aluminum compound having from 1 to 4 carbons in each alkyl group and a halogenated tri(hydrocarbyl)boron compound having from 1 to 20 carbons in each hydrocarbyl group, especially tris(pentafluorophenyl)borane, further combinations of such neutral Lewis acid mixtures with a polymeric or oligomeric alumoxane, and combinations of a single neutral Lewis acid, especially tris (pentafluorophenyl)borane with a polymeric or oligomeric alumoxane may be used as activating cocatalysts. Exemplary molar ratios of metal complex:tris(pentafluorophenylborane:alumoxane are from 1:1:1 to 1:5:20, such as from 1:1:1.5 to 1:5:10.

Suitable ion forming compounds useful as co-catalysts in one embodiment of the present disclosure comprise a cation which is a Brønsted acid capable of donating a proton, and a compatible, noncoordinating anion, $A^-$. As used herein, the term "noncoordinating" refers to an anion or substance which either does not coordinate to the Group 4 metal containing precursor complex and the catalytic derivative derived there from, or which is only weakly coordinated to such complexes thereby remaining sufficiently labile to be displaced by a neutral Lewis base. A noncoordinating anion specifically refers to an anion which when functioning as a charge balancing anion in a cationic metal complex does not transfer an anionic substituent or fragment thereof to said cation thereby forming neutral complexes. "Compatible anions" are anions which are not degraded to neutrality when the initially formed complex decomposes and are noninterfering with desired subsequent polymerization or other uses of the complex.

Suitable anions are those containing a single coordination complex comprising a charge-bearing metal or metalloid core which anion is capable of balancing the charge of the active catalyst species (the metal cation) which may be formed when the two components are combined. Also, said anion should be sufficiently labile to be displaced by olefinic, diolefinic and acetylenically unsaturated compounds or other neutral Lewis bases such as ethers or nitriles. Suitable metals include, but are not limited to, aluminum, gold and platinum. Suitable metalloids include, but are not limited to, boron, phosphorus, and silicon. Compounds containing anions which comprise coordination complexes containing a single metal or metalloid atom are, of course, well known and many, particularly such compounds containing a single boron atom in the anion portion, are available commercially.

In one aspect, suitable cocatalysts may be represented by the following general formula:

$(L^*-H)_g^+(A)^{g-}$, wherein:

L* is a neutral Lewis base;
$(L^*-H)^+$ is a conjugate Brønsted acid of L*;
$A^{g-}$ is a noncoordinating, compatible anion having a charge of g−, and g is an integer from 1 to 3.

More particularly, $A^{g-}$ corresponds to the formula: $[M'Q_4]^-$; wherein:

M' is boron or aluminum in the +3 formal oxidation state; and

Q independently in each occurrence is selected from hydride, dialkyl-amido, halide, hydrocarbyl, hydrocarbyloxide, halosubstituted-hydrocarbyl, halosubstituted hydrocarbyloxy, and halo-substituted silylhydrocarbyl radicals (including perhalogenated hydrocarbyl-perhalogenated hydrocarbyloxy- and perhalogenated silylhydrocarbyl radicals), each Q having up to 20 carbons with the proviso that in not more than one occurrence is Q halide. Examples of suitable hydrocarbyloxide Q groups are disclosed in U.S. Pat. No. 5,296,433.

In an exemplary embodiment, g is one, that is, the counter ion has a single negative charge and is $A^-$. Activating cocatalysts comprising boron which are particularly useful in the preparation of catalysts of this disclosure may be represented by the following general formula:

$(L^*-H)^+(BQ_4)^-$; wherein:

$L^*$ is as previously defined;

B is boron in a formal oxidation state of 3; and

Q is a hydrocarbyl-, hydrocarbyloxy-, fluorinated hydrocarbyl-, fluorinated hydrocarbyloxy-, or fluorinated silylhydrocarbyl-group of up to 20 nonhydrogen atoms, with the proviso that in not more than one occasion is Q hydrocarbyl.

Especially useful Lewis base salts are ammonium salts, more preferably trialkyl-ammonium salts containing one or more $C_{12}$-40 alkyl groups. In this aspect, for example, Q in each occurrence can be a fluorinated aryl group, especially, a pentafluorophenyl group.

Illustrative, but not limiting, examples of boron compounds which may be used as an activating cocatalyst in the preparation of the improved catalysts of this disclosure include the tri-substituted ammonium salts such as:
trimethylammonium tetrakis(pentafluorophenyl)borate,
triethylammonium tetrakis(pentafluorophenyl)borate,
tripropylammonium tetrakis(pentafluorophenyl)borate,
tri(n-butyl)ammonium tetrakis(pentafluorophenyl)borate,
tri(sec-butyl)ammonium tetrakis(pentafluorophenyl)borate,
N,N-dimethylanilinium tetrakis(pentafluorophenyl)borate,
N,N-dimethylanilinium n-butyltris(pentafluorophenyl)borate,
N,N-dimethylanilinium benzyltris(pentafluorophenyl)borate,
N,N-dimethylanilinium tetrakis(4-(t-butyldimethylsilyl)-2,3,5,6 tetrafluorophenyl)borate,
N,N-dimethylanilinium tetrakis(4-(triisopropylsilyl)-2,3,5,6-tetrafluorophenyl)borate,
N,N-dimethylanilinium pentafluorophenoxytris(pentafluorophenyl)borate,
N,N-diethylanilinium tetrakis(pentafluorophenyl)borate,
N,N-dimethyl-2,4,6-trimethylanilinium tetrakis(pentafluorophenyl)borate,
dimethyloctadecylammonium tetrakis(pentafluorophenyl)borate,
methyldioctadecylammonium tetrakis(pentafluorophenyl)borate;
a number of dialkyl ammonium salts such as:
di-(i-propyl)ammonium tetrakis(pentafluorophenyl)borate,
methyloctadecylammonium tetrakis(pentafluorophenyl)borate,
methyloctadodecylammonium tetrakis(pentafluorophenyl)borate, and
dioctadecylammonium tetrakis(pentafluorophenyl)borate;
various tri-substituted phosphonium salts such as:
triphenylphosphonium tetrakis(pentafluorophenyl)borate,
methyldioctadecylphosphonium tetrakis(pentafluorophenyl)borate, and
tri(2,6-dimethylphenyl)phosphonium tetrakis(pentafluorophenyl)borate;
di-substituted oxonium salts such as:
diphenyloxonium tetrakis(pentafluorophenyl)borate,
di(o-tolyl)oxonium tetrakis(pentafluorophenyl)borate, and
di(octadecyl)oxonium tetrakis(pentafluorophenyl)borate; and
di-substituted sulfonium salts such as:
di(o-tolyl)sulfonium tetrakis(pentafluorophenyl)borate, and
methylcotadecylsulfonium tetrakis(pentafluorophenyl)borate.

Further to this aspect of the disclosure, examples of useful $(L^*-H)^+$cations include, but are not limited to, methyldioctadecylammonium cations, dimethyloctadecylammonium cations, and ammonium cations derived from mixtures of trialkyl amines containing one or two $C_{14-18}$ alkyl groups.

Another suitable ion forming, activating cocatalyst comprises a salt of a cationic oxidizing agent and a noncoordinating, compatible anion represented by the formula:

$(Ox^{h+})_g(A^{g-})_h$, wherein:

$Ox^{h+}$ is a cationic oxidizing agent having a charge of h+;

h is an integer from 1 to 3; and $A^{g-}$ and g are as previously defined.

Examples of cationic oxidizing agents include: ferrocenium, hydrocarbyl-substituted ferrocenium, $Ag^+$, or $Pb^{+2}$. Particularly useful examples of $A^{g-}$ are those anions previously defined with respect to the Bronsted acid containing activating cocatalysts, especially tetrakis(pentafluorophenyl)borate.

Another suitable ion forming, activating cocatalyst can be a compound which is a salt of a carbenium ion and a noncoordinating, compatible anion represented by the following formula: $[C]^+ A^-$ wherein:

$[C]^+$ is a $C_{1-20}$ carbenium ion; and is a noncoordinating, compatible anion having a charge of −1. For example, one carbenium ion that works well is the trityl cation, that is triphenylmethylium.

A further suitable ion forming, activating cocatalyst comprises a compound which is a salt of a silylium ion and a noncoordinating, compatible anion represented by the formula: $(Q^1_3Si)^+ A^-$ wherein:

$Q^1$ is $C_{1-10}$ hydrocarbyl, and $A^-$ is as previously defined.

Suitable silylium salt activating cocatalysts include trimethylsilylium tetrakispentafluorophenylborate, triethylsilylium tetrakispentafluorophenylborate, and ether substituted adducts thereof. Silylium salts have been previously generically disclosed in *J. Chem. Soc. Chem. Comm.* 1993, 383-384, as well as in Lambert, J. B., et al., *Organometallics* 1994, 13, 2430-2443. The use of the above silylium salts as activating cocatalysts for addition polymerization catalysts is also described in U.S. Pat. No. 5,625,087.

Certain complexes of alcohols, mercaptans, silanols, and oximes with tris(pentafluorophenyl)borane are also effective catalyst activators and may be used according to the present disclosure. Such cocatalysts are disclosed in U.S. Pat. No. 5,296,433.

Suitable activating cocatalysts for use herein also include polymeric or oligomeric alumoxanes (also called aluminoxanes), especially methylalumoxane (MAO), triisobutyl aluminum modified methylalumoxane (MMAO), or isobutylalumoxane; Lewis acid modified alumoxanes, especially perhalogenated tri(hydrocarbyl)aluminum- or perhalogenated tri(hydrocarbyl)boron modified alumoxanes, having from 1 to 10 carbons in each hydrocarbyl or halogenated hydrocarbyl group, and most especially tris(pentafluorophenyl)borane modified alumoxanes. Such co-catalysts are previously disclosed in U.S. Pat. Nos. 6,214,760, 6,160,146, 6,140,521, and 6,696,379.

A class of co-catalysts comprising non-coordinating anions generically referred to as expanded anions, further disclosed in U.S. Pat. No. 6,395,671, may be suitably employed to activate the metal complexes of the present disclosure for olefin polymerization. Generally, these co-catalysts (illustrated by those having imidazolide, substituted imidazolide, imidazolinide, substituted imidazolinide, benzimidazolide, or substituted benzimidazolide anions) may be depicted as follows:

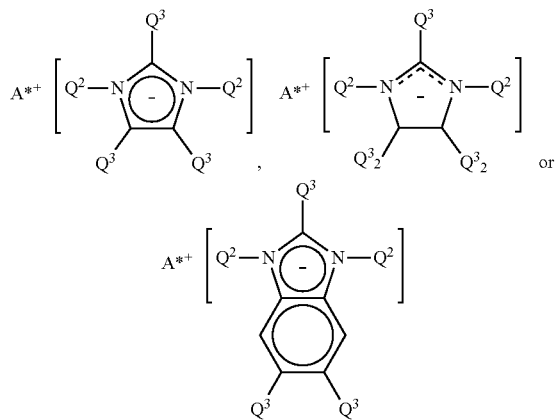

wherein:
A*+ is a cation, especially a proton containing cation, and can be trihydrocarbyl ammonium cation containing one or two $C_{10-40}$ alkyl groups, especially a methyldi($C_{14-20}$ alkyl)ammonium cation, $Q^3$, independently in each occurrence, is hydrogen or a halo, hydrocarbyl, halocarbyl, halohydrocarbyl, silylhydrocarbyl, or silyl, (including for example mono-, di- and tri(hydrocarbyl)silyl) group of up to 30 atoms not counting hydrogen, such as $C_{1-20}$ alkyl, and $Q^2$ is tris(pentafluorophenyl)borane or tris(pentafluorophenyl)alumane).

Examples of these catalyst activators include trihydrocarbylammonium-salts, especially, methyldi($C_{14-20}$ alkyl)ammonium-salts of:
bis(tris(pentafluorophenyl)borane)imidazolide,
bis(tris(pentafluorophenyl)borane)-2-undecylimidazolide,
bis(tris(pentafluorophenyl)borane)-2-heptadecylimidazolide,
bis(tris(pentafluorophenyl)borane)-4,5-bis(undecyl)imidazolide,
bis(tris(pentafluorophenyl)borane)-4,5-bis(heptadecyl) imidazolide,
bis(tris(pentafluorophenyl)borane)imidazolinide,
bis(tris(pentafluorophenyl)borane)-2-undecylimidazolinide,
bis(tris(pentafluorophenyl)borane)-2-heptadecylimidazolinide,
bis(tris(pentafluorophenyl)borane)-4,5-bis(undecyl)imidazolinide,
bis(tris(pentafluorophenyl)borane)-4,5-bis(heptadecyl) imidazolinide,
bis(tris(pentafluorophenyl)borane)-5,6-dimethylbenzimidazolide,
bis(tris(pentafluorophenyl)borane)-5,6-bis(undecyl)benzimidazolide,
bis(tris(pentafluorophenyl)alumane)imidazolide,
bis(tris(pentafluorophenyl)alumane)-2-undecylimidazolide,
bis(tris(pentafluorophenyl)alumane)-2-heptadecylimidazolide,
bis(tris(pentafluorophenyl)alumane)-4,5-bis(undecyl) imidazolide,
bis(tris(pentafluorophenyl)alumane)-4,5-bis(heptadecyl) imidazolide,
bis(tris(pentafluorophenyl)alumane)imidazolinide,
bis(tris(pentafluorophenyl)alumane)-2-undecylimidazolinide,
bis(tris(pentafluorophenyl)alumane)-2-heptadecylimidazolinide,
bis(tris(pentafluorophenyl)alumane)-4,5-bis(undecyl) imidazolinide,
bis(tris(pentafluorophenyl)alumane)-4,5-bis(heptadecyl) imidazolinide,
bis(tris(pentafluorophenyl)alumane)-5,6-dimethylbenzimidazolide, and
bis(tris(pentafluorophenyl)alumane)-5,6-bis(undecyl) benzimidazolide.

Other activators include those described in the PCT publication WO 98/07515, such as tris(2,2',2"-nonafluorobiphenyl)fluoroaluminate. Combinations of activators are also contemplated by the disclosure, for example, alumoxanes and ionizing activators in combinations, see for example, EP-A-0 573120, PCT publications WO 94/07928 and WO 95/14044, and U.S. Pat. Nos. 5,153,157 and 5,453, 410. For example, and in general terms, WO 98/09996 describes activating catalyst compounds with perchlorates, periodates and iodates, including their hydrates. WO 99/18135 describes the use of organoboroaluminum activators. WO 03/10171 discloses catalyst activators that are adducts of Brønsted acids with Lewis acids. Other activators or methods for activating a catalyst compound are described in, for example, U.S. Pat. Nos. 5,849,852, 5,859,653, and 5,869,723, in EP-A-615981, and in PCT publication WO 98/32775. All of the foregoing catalyst activators as well as any other known activator for transition metal complex catalysts may be employed alone or in combination according to the present disclosure. In one aspect, however, the co-catalyst can be alumoxane-free. In another aspect, for example, the co-catalyst can be free of any specifically-named activator or class of activators as disclosed herein.

In a further aspect, the molar ratio of procatalyst/co-catalyst employed generally ranges from 1:10,000 to 100:1, for example, from 1:5000 to 10:1, or from 1:1000 to 1:1. Alumoxane, when used by itself as an activating co-catalyst, can be employed in large quantity, generally at least 100 times the quantity of metal complex on a molar basis.

Tris(pentafluorophenyl)borane, where used as an activating co-catalyst can be employed generally in a molar ratio to the metal complex of from 0.5:1 to 10:1, such as from 1:1 to 6:1 and from 1:1 to 5:1. The remaining activating co-catalysts are generally employed in approximately equimolar quantity with the metal complex.

In exemplary embodiments of the present disclosure, the co-catalyst is [(C$_{16-18}$H$_{33-37}$)$_2$CH$_3$NH] tetrakis(pentafluorophenyl)borate salt.

Suitable co-catalysts also include those disclosed in U.S. Provisional Pat. App. Nos. 62/650,423, 62/650,412, and 62650453, which are incorporated herein by reference in their entirety. Such co-catalysts include those of the ionic complex comprising an anion and a countercation, the anion having the structure:

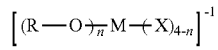

wherein: M is aluminum, boron, or gallium; n is 2, 3, or 4; each R is independently selected from the group consisting of: radical (II) and radical (III):

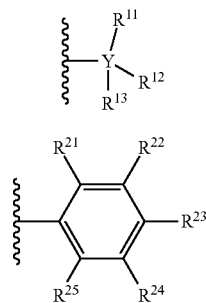

each Y is independently carbon or silicon; each R$^{11}$, R$^{12}$, R$^{13}$, R$^{21}$, R$^{22}$, R$^{23}$, R$^{24}$, and R$^{25}$ is independently chosen from (C$_1$-C$_{40}$)alkyl, (C$_6$-C$_{40}$)aryl, —OR$^C$, —O—, —SR$^C$, —H, or —F, wherein when R is a radical according to radical (III), at least one of R$^{21-25}$ is a halogen-substituted (C$_1$-C$_{40}$)alkyl, a halogen-substituted (C$_6$-C$_{40}$)aryl, or —F; and provided that: when each R is a radical (II) and Y is carbon, at least one of R$^{11-13}$ is a halogen-substituted (C$_1$-C$_{40}$)alkyl, a halogen-substituted (C$_6$-C$_{40}$)aryl, or —F; or when M is aluminum and n is 4 and each R is a radical (II), and each Y is carbon: each R$^{11}$, R$^{12}$, and R$^{13}$ of each R is a halogen-substituted (C$_1$-C$_{40}$)alkyl, a halogen-substituted (C$_6$-C$_{40}$)aryl, or —F; or a total number of halogen atoms in R$^{11}$, R$^{12}$, and R$^{13}$ of each R is at least six; each X is a monodentate ligand independently chosen from halogen-substituted (C$_1$-C$_{20}$)alkyl, (C$_1$-C$_{20}$)alkyl, halogen-substituted (C$_6$-C$_{40}$)aryl, (C$_6$-C$_{40}$)aryl, triflate, or —S(O)$_3$; optionally, two groups R are covalently connected; each R$^N$ and R$^C$ is independently (C$_1$-C$_{30}$) hydrocarbyl or —H.

Such co-catalysts further include the bimetallic activator complex comprising an anion and a countercation, the anion having a structure:

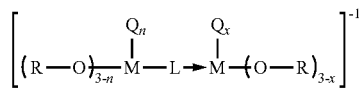

where: each M is independently aluminum, boron, or gallium; L is chosen from a species having at least two Lewis basic sites; each Q is independently a monodentate ligand; n is 0, 1, or 2, wherein when n is 0, Q is not present; x is 0, 1, or 2, wherein when x is 0, Q is not present; each R is independently selected from the group consisting of radical (II) and radical (III):

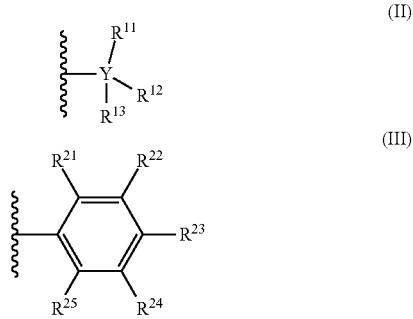

each Y is independently carbon or silicon; each R$^{11}$, R$^{12}$, R$^{13}$, R$^{21}$, R$^{22}$, R$^{23}$, R$^{24}$, and R$^{25}$, is independently chosen from (C$_1$-C$_{40}$)alkyl, (C$_6$-C$_{40}$)aryl, —H, —NR$^N$$_2$, —OR$^C$, —SR$^C$, or halogen, wherein when R is radical (II), at least one of R$^{11-13}$ is perhalogenated (C$_1$-C$_{40}$)alkyl, perhalogenated (C$_6$-C$_{40}$)aryl, or —F; and when R is radical (III), at least one of R$^{21-25}$ is perhalogenated (C$_1$-C$_{40}$)alkyl, perhalogenated (C$_6$-C$_{40}$)aryl, or —F; optionally, when n is 0 or 1, two R groups are covalently connected; and each R$^N$ or R$^C$ is independently (C$_1$-C$_{30}$)hydrocarbyl or —H.

Such co-catalysts further include the metallic activator comprising an anion and a countercation, the anion having a structure:

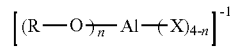

where: n is 0 or 1; each R is independently selected from the group consisting of radical (II) and radical (III):

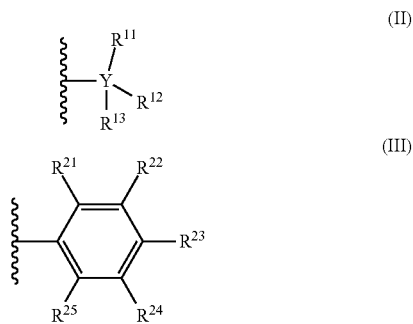

each Y is independently carbon or silicon; each R$^{11}$, R$^{12}$, R$^{13}$, R$^{21}$, R$^{22}$, R$^{23}$, R$^{24}$, and R$^{25}$ is independently chosen from (C$_1$-C$_{40}$)alkyl, halogen-substituted (C$_1$-C$_{40}$)alkyl, (C$_6$-C$_{40}$)aryl, halogen-substituted (C$_6$-C$_{40}$)aryl, —OR$^C$, —SR$^C$, —H, —F or Cl, wherein at least one of R$^{11-13}$ and one of R$^{21-25}$ is a halogen-substituted (C$_1$-C$_{40}$)alkyl, a halogen-substituted (C$_6$-C$_{40}$)aryl, or —F; and each X is a monodentate ligand independently chosen from halogen-substituted (C$_1$-C$_{20}$)alkyl or halogen-substituted (C$_6$-C$_{40}$)aryl; optionally, two X groups are covalently connected; each R$^c$ is independently halogen-substituted (C$_1$-C$_{30}$)hydrocarbyl; provided that when the countercation is (Ph)$_3$C$^+$, and the anion is Al(C$_6$F$_5$)$_4$.

(B) Curing Component

The curable composition further comprises a (B) curing component comprising a crosslinking agent. In certain embodiments, the curable composition of the present disclosure may comprise from 0.1 wt % to 10 wt % (or from 0.1 wt % to 7 wt %, or from 0.1 wt % to 5 wt %) of the (B) curing component comprising a crosslinking agent, based on the total weight of the curable composition.

In further embodiments, the (B) curing component contains only the crosslinking agent. In further embodiments, the crosslinking agent in the (B) curing component is present in an amount of less than or equal to 0.36 wt % (such as from zero to less than or equal to 0.36 wt %, or from 0.1 wt % to less than or equal to 0.36 wt %, or from 0.2 wt % to less than or equal to 0.36 wt %, or from 0.3 wt % to less than or equal to 0.36 wt %), based on the total weight of the curable composition.

In certain embodiments, the (B) curing component further comprises co-agents, curing additives, accelerators, and/or scorch inhibitors. In certain embodiments, the (B) curing component comprises a crosslinking agent and a co-agent. In further embodiments, the (B) curing component comprises a crosslinking agent, a co-agent, and a scorch inhibitor.

Non-limiting examples of suitable cross-linking agents include peroxides; phenols; azides; aldehyde-amine reaction products; substituted ureas; substituted guanidines; substituted xanthates; substituted dithiocarbamates; sulfur-containing compounds, such as thiazoles, sulfenamides, thiuramidisulfides, paraquinonedioxime, dibenzoparaquinonedioxime, sulfur; imidazoles; silanes; metal oxides, such as zinc, magnesium, and lead oxides; dinitroso compounds, such as p-quinone-dioxime and p,p'-dibenzoylquinone-dioxime; and phenol-formaldehyde resins containing hydroxymethyl or halomethyl functional groups and combinations thereof. The suitability of any of these cross-linking agents will be largely governed by the choice of polymers, as is well known to those skilled in the compounding art.

The crosslinking agent may include one or more organic peroxides including but not limited to alkyl peroxides, aryl peroxides, peroxyesters, peroxycarbonates, diacylperoxides, peroxyketals, cyclic peroxides, dialkyl peroxides, peroxy esters, peroxy dicarbonates, or combinations of two or more thereof. Examples of peroxides include but are not limited to di-tertbutyl peroxide, dicumyl peroxide, di(3,3,5-trimethyl hexanoyl)peroxide, t-butyl peroxypivalate, t-butyl peroxyneodecanoate, di(sec-butyl)peroxydicarbonate, t-amyl peroxyneodecanoate, 1,1-di-t-butyl peroxy-3,3,5-trimethylcyclohexane, t-butyl-cumyl peroxide, 2,5-dimethyl-2,5-di(tertiary-butyl-peroxyl)hexane, 1,3-bis(tertiary-butyl-peroxyl-isopropyl)benzene, or a combination thereof. An exemplary crosslinking agent is dicumyl peroxide commercially available under the tradename LUPEROX® from Arkema or the tradename TRIGONOX® from Akzo Nobel. A further exemplary crosslinking agent is VAROX® DBPH-50 from Vanderbilt Chemicals. When the cross-linking agent is a peroxide, certain processing aids and cure activators such as stearic acid and ZnO may also be used.

When peroxide based curing agents are used, co-activators or coagents may be used in combination therewith. Suitable coagents include but are not limited to trimethylolpropane triacrylate (TMPTA), trimethylolpropane trimethacrylate (TMPTMA), triallyl cyanurate (TAC), triallyl isocyanurate (TAIC), and 1,4-phenylenedimaleimide (available from TCI Chemicals).

Suitable coagents further include but are not limited to the alkenyl-functional monocyclic organosiloxanes disclosed in WO 2019/000311 and WO 2019/000654, which are incorporated herein by reference in their entirety. For example, the coagent may be a monocyclic organosiloxane of the formula [R1,R2SiO2/2]n, wherein subscript n is an integer greater than or equal to 3; each R1 is independently a (C2-C4)alkenyl or a H2C=C(R1a)-C(=O)—O—(CH2)m- wherein R1a is H or methyl and subscript m is an integer from 1 to 4; and each R2 is independently H, (C1-C4)alkyl, phenyl, or R1. Examples of such monocyclic organosiloxanes include but are not limited to 2,4,6,8-tetramethyl-2,4,6,8-tetravinyl cyclotetrasiloxane, 2,4,6-trimethyl-2,4,6-trivinyl-cyclotrisiloxane, or a combination thereof.

A scorch inhibitor/retardant is a molecule that inhibits premature curing, or a collection of such molecules. Examples of a scorch inhibitor/retardant are hindered phenols; semihindered phenols; TEMPO; TEMPO derivatives; 1,1-diphenylethylene; 2,4-diphenyl-4-methyl-1-pentene (also known as alpha-methyl styrene dimer or AMSD); and allyl-containing compounds described in U.S. Pat. No. 6,277,925B1, column 2, line 62, to column 3, line 46.

Suitable cross-linking agents include those that are sulfur based, such as elemental sulfur. When sulfur based curing agents are employed, accelerators and cure activators may be used as well, such as amines, disulfides, guanidines, thioureas, thiazoles, thiurams, sulfenamides, dithiocarbamates, xanthates, 4,4'-dithiodimorpholine, thiuram di- and polysulfides, alkylphenol disulfides, and 2-morpholino-dithiobenzothiazole, tetramethylthiuram disulfide (TMTD), dipentamethylenethiuram tetrasulfide (DPTT), 2-mercaptobenzothiazole (MBT), 2-mercaptobenzothiazolate disulfide (MBTS), zinc-2-mercaptobenozothiazolate (ZMBT), zinc diethyldithiocarbamatezinc (ZDEC), zinc dibutyldithiocarbamate (ZDBC), dipentamethylenethiuram tetrasulfide (DPTT), N-t-butylbenzothiazole-2-sulfanamide (TBBS), and mixtures thereof.

Additional crosslinking agents include, but are not limited to, phenolic resins, azides, aldehyde-amine reaction products, vinyl silanes, hydrosilylation agents, substituted ureas, substituted guanidines, substituted xanthates, substituted dithiocarbamates, and combinations thereof. The crosslinking agent may be a phenolic curing agent or a peroxide curing agent, with an optional co-agent, or hydrosilylation cross-linking agent with a hydrosilylation catalyst, or dibutyl tin dilaurate ("DBTDL"), with an optional co-agent alumina trihydrate ("ATH"). Popular industrial catalysts are "Speier's catalyst," H$_2$PtCl6, and Karstedt's catalyst, an alkene-stabilized platinum(0) catalyst.

When a cross-linking agent is used, the cross-linking can be induced by activating the cross-linking agent in the curable formulation. The cross-linking agent can be activated by exposing it to a temperature above its decomposition temperature. Temperatures range from 50° C. to 300° C., such as 80° C. to 275° C. Time can be determined by one of ordinary skill in the art depending on polymers and cure components selected.

Alternatively, the cross-linking agent can be activated by exposing it to a radiation that causes the generation of free radicals from the cross-linking agent. Non-limiting examples of suitable radiation include UV or visible radiation, electron beam or beta ray, gamma rays, X-rays, or neutron rays. Radiation is believed to activate the cross-linking by generating radicals in the polymer which may subsequently combine and cross-link. Radiation dosage depends upon many factors and can be determined by those skilled in the art. UV or visible radiation activiation can occur when the cross-linking agent is a peroxide photoinitiator, such as dibenzoyl peroxide, cumene hydroperoxide, di-t-butyl peroxide, diacetyl peroxide, hydrogen peroxide, peroxydisulfates, and 2,2-bis(terbutylperoxy)-2,5-dimethylhexane.

In some embodiments, dual cure systems, which comprises at least two activation methods, may be effectively employed, such as combinations selected from heat, moisture cure, and radiation. For instance, it may be desirable to employ a peroxide cross-linking agent in conjunction with a silane cross-linking agent, a peroxide cross-linking agent in conjunction with radiation, a sulfur-containing cross-linking agent in conjunction with a silane cross-linking agent, or the like. Those skilled in the art will be readily able to select the amount of cross-linking agent, based on the desired cross-linking level, the characteristics of the polymer such as molecular weight, molecular weight distribution, comonomer content, the presence of cross-linking enhancing coagents, other additives and the like.

When the (A) polyolefin component is at least partially crosslinked, the degree of crosslinking may be measured by dissolving the composition in a solvent for specified duration, and calculating the percent gel or unextractable component. The percent gel normally increases with increasing crosslinking levels. For cured articles according to the invention, the percent gel content may be from 5 to 100 percent, or from 10 to 95 percent, or from 20 to 90 percent, or from 30 to 85 percent, or from 40 to 80 percent.

Applications and End Uses

The compositions of the present disclosure can be employed in a variety of conventional fabrication processes to produce useful articles, including objects prepared by cast, blown, calendered, or extrusion processes; molded articles, such as blow molded, injection molded, or roto-molded articles; extrusions; fibers; and woven or non-woven fabrics. Compositions of the present disclosure can further include but are not limited to other natural or synthetic polymers, oils, UV stabilizers, pigments, tackifiers, fillers (such as talc, calcium carbonate, glass fiber, carbon fiber), additives, reinforcing agents such as calcium or magnesium carbonate, fatty acids and salts thereof, ignition resistant additives, scorch inhibitors, antioxdiants, stabilizers, colorants, extenders, carbon black, crosslinkers, blowing agents, activators such as zinc oxide or zinc stearate, silica, aluminum silicates, plasticizers such as dialkyl esters of dicarboxylic acids, antidegradants, softeners, waxes, (poly)alcohols, (poly)alcohol ethers, polyesters, metal salts, scavengers, nucleating agents, stability control agents, flame retardants, lubricants, processing aids, extrusion aids, and chemical protectors.

Fibers may be prepared from the present compositions. Fibers that may be prepared include staple fibers, tow, multicomponent, sheath/core, twisted, and monofilament. Suitable fiber forming processes include spinbonded, melt blown techniques, as disclosed in U.S. Pat. Nos. 4,430,563, 4,663,220, 4,668,566, and 4,322,027, gel spun fibers as disclosed in U.S. Pat. No. 4,413,110, woven and nonwoven fabrics, as disclosed in U.S. Pat. No. 3,485,706, or structures made from such fibers, including blends with other fibers, such as polyester, nylon or cotton, thermoformed articles, extruded shapes, including profile extrusions and co-extrusions, calendared articles, and drawn, twisted, or crimped yarns or fibers. The new polymers described herein are also useful for wire and cable coating operations, as well as in sheet extrusion for vacuum forming operations, and forming molded articles, including the use of injection molding, blow molding process, or rotomolding processes. Compositions can also be formed into fabricated articles such as those previously mentioned using conventional polyolefin processing techniques which are well known to those skilled in the art of polyolefin processing.

Dispersions (both aqueous and non-aqueous) can also be formed using the present formulations comprising the same.

Additives and adjuvants may be included in any formulation. Suitable additives include fillers, such as organic or inorganic particles, including clays, talc, titanium dioxide, zeolites, tree retardants, powdered metals, organic or inorganic fibers, including carbon fibers, silicon nitride fibers, steel wire or mesh, and nylon or polyester cording, nano-sized particles, organoclays, and so forth; tackifiers, oil extenders, including paraffinic or napthelenic oils; and other natural and synthetic polymers, including other polymers according to the invention.

Suitable polymers for blending (and for inclusion in the (A) polyolefin component) include thermoplastic and non-thermoplastic polymers including natural and synthetic polymers. Such polymers include unsaturated polyolefin thermoplastics (EPDM, polybutadiene, etc.), polyolefin thermoplastics with low or no unsaturations (PE, PP, ethylene/alpha-olefin interpolymers), other elastomers (SBCs, PVC, EVA, ionomers, etc.), and other engineering thermoplastics (styrenics, polyamides, polyesters, etc.). Exemplary polymers for blending include polypropylene, (both impact modifying polypropylene, isotactic polypropylene, atactic polypropylene, and random ethylene/propylene copolymers), various types of polyethylene, including high pressure, free-radical LDPE, Ziegler Natta LLDPE, metallocene PE, including multiple reactor PE ("in reactor" blends of Ziegler-Natta PE and metallocene PE, such as products disclosed in U.S. Pat. Nos. 6,545,088, 6,538,070, 6,566,446, 5,844,045, 5,869,575, and 6,448,341), etlhylene-vinyl acetate (EVA), ethylene/vinyl alcohol copolymers, polystyrene, impact modified polystyrene, ABS, styrene/butadiene block copolymers and hydrogenated derivatives thereof (SBS and SEBS), ethylene-based olefin block copolymers (such as those available under the trade name INFUSE™ available from the Dow Chemical Company), propylene-based olefin block copolymers (such as those available under the trade name INTUNE™ available from the Dow Chemical Company), and thermoplastic polyurethanes.

Homogeneous polymers such as olefin plastomers and elastomers, such as ethylene/alpha-olefin copolymers and propylene-based copolymers with low or no unsaturations (for example polymers available under the trade designation VERSIFY™ available from The Dow Chemical Company, ENGAGE™ from The Dow Chemical Company, TAFMER™ from Mitsui Chemicals, Exact™ from ExxonMobil, and VISTAMAXX™ available from ExxonMobil) can also be useful as components in blends comprising the present polymers.

Suitable end uses include crosslinkable or non-crosslinkable formulations for films; fibers; soft touch goods, such as tooth brush handles and appliance handles; gaskets and profiles; adhesives (functional adhesives, cross-linked adhesives, hot melt adhesives); footwear (including shoe soles and shoe liners); auto interior parts and profiles; foam goods (both open and closed cell); impact modifiers for other thermoplastic polymers such as high density polyethylene, isotactic polypropylene, or other olefin polymers; coated fabrics; hoses; tubing; weather stripping; cap liners; flooring; construction or building parts; woodworking; coatings (powder coatings, water-based coatings for beverage and food liners, solvent-based coatings for industrial metal coatings); waterproofing; photovoltaic applications; wire and cable applications; thermoplastic vulcanizates (TPV) applications; EPDM thermosets; seals, belts, conveyor belts, automotive timing belts and the like, gaskets, dampeners; tire compounds; highly filled compounds, sidewall and tread compounds; coagents for thermoset rubbers; crosslinked tubing; liquid (low viscosity) reaction injection molding; injection molded skins; 3D printing; and piping.

Compositions may also contain anti-ozonants or anti-oxidants that are known to a rubber chemist of ordinary skill. The anti-ozonants may be physical protectants such as waxy materials that come to the surface and protect the part from oxygen or ozone or they may be chemical protectors that react with oxygen or ozone. Suitable chemical protectors include styrenated phenols, butylated octylated phenol, butylated di(dimethylbenzyl) phenol, p-phenylenediamines, butylated reaction products of p-cresol and dicyclopentadiene (DCPD), polyphenolic anitioxidants, hydroquinone derivatives, quinoline, diphenylene antioxidants, thioester antioxidants, and blends thereof. Some representative trade names of such products are Wingstay™ S antioxidant, Polystay™ 100 antioxidant, Polystay™ 100 AZ antioxidant, Polystay™ 200 antioxidant, Wingstay™ L antioxidant, Wingstay™ LHLS antioxidant, Wingstay™ K antioxidant, Wingstay™ 29 antioxidant, Wingstay™ SN-1 antioxidant, and Irganox™ antioxidants. In some applications, the antioxidants and anti-ozonants used will preferably be non-staining and non-migratory.

For providing additional stability against UV radiation, hindered amine light stabilizers (HALS) and UV absorbers may be also used. Suitable examples include Tinuvin™ 123, Tinuvin™ 144, Tinuvin™ 622, Tinuvin™ 765, Tinuvin™ 770, and Tinuvin™ 780, available from Ciba Specialty Chemicals, and Chemisorb™ T944, available from Cytex Plastics, Houston Tex., USA. A Lewis acid may be additionally included with a HALS compound in order to achieve superior surface quality, as disclosed in U.S. Pat. No. 6,051,681.

For some compositions, additional mixing process may be employed to pre-disperse the anti-oxidants, anti-ozonants, carbon black, UV absorbers, and/or light stabilizers to form a masterbatch, and subsequently to form polymer blends there from.

Compositions according to the invention may also contain organic or inorganic fillers or other additives such as starch, talc, calcium carbonate, glass fibers, polymeric fibers (including nylon, rayon, cotton, polyester, and polyaramide), metal fibers, flakes or particles, expandable layered silicates, phosphates or carbonates, such as clays, mica, silica, alumina, aluminosilicates or aluminophosphates, carbon whiskers, carbon fibers, nanoparticles including nanotubes, wollastonite, graphite, zeolites, and ceramics, such as silicon carbide, silicon nitride or titanias. Silane based or other coupling agents may also be employed for better filler bonding. Non-limiting examples of suitable silane coupling agents include γ-chloropropyl trimethoxysilane, vinyl trimethoxysilane, vinyl triethoxysilane, vinyl-tris-(β-methoxy)silane, allyltrimethoxysilane, γ-methacryloxypropyl trimethoxysilane, β-(3,4-ethoxy-cyclohexyl)ethyl trimethoxysilane, γ-glycidoxypropyl trimethoxysilane, γ-mercaptopropyltrimethoxysilane, γ-aminopropyl trimethoxysilane, N-β-(aminoethyl)-γ-aminopropyl trimethoxysilane, and 3-(trimethoxysilyl)propylmethacrylate, vinyl triacetoxysilane, γ-(meth)acryloxy, propyl trimethoxysilane, and combinations thereof.

Suitable blowing agents include but are not limited to inorganic blowing agents, organic blow agents, chemical blowing agents, and combinations thereof. Non-limiting examples of suitable inorganic blowing agents include carbon dioxide, nitrogen, argon, water, air, nitrogen, and helium. Non-limiting examples of suitable organic blowing agents include aliphatic hydrocarbons having 1-6 carbon atoms, aliphatic alcohols having 1-3 carbon atoms, and fully and partially halogenated aliphatic hydrocarbons having 1-4 carbon atoms. Non-limiting examples of suitable aliphatic hydrocarbons include methane, ethane, propane, n-butane, isobutane, n-pentane, isopentane, neopentane, and the like. Non-limiting examples of suitable aliphatic alcohols include methanol, ethanol, n-propanol, and isopropanol. Non-limiting examples of suitable fully and partially halogenated aliphatic hydrocarbons include fluorocarbons, chlorocarbons, and chlorofluorocarbons. Non-limiting examples of suitable fluorocarbons include methyl fluoride, perfluoromethane, ethyl fluoride, 1,1-difluoroethane (HFC-152a), 1,1,1-trifluoroethane (HFC-143a), 1,1,1,2-tetrafluoro-ethane (HFC-134a), pentafluoroethane, difluoromethane, perfluoroethane, 2,2-difluoropropane, 1,1,1-trifluoropropane, perfluoropropane, dichloropropane, difluoropropane, perfluorobutane, perfluorocyclobutane. Non-limiting examples of suitable partially halogenated chlorocarbons and chlorofluorocarbons include methyl chloride, methylene chloride, ethyl chloride, 1,1,1-tricliloroethane, 1,1-dichloro-1-fluoroethane (HCFC-14 Ib), 1-chloro-1,1 difluoroethane (HCFC-142b), 1,1-dichloro-2,2,2-trifluoroethane (HCFC-123) and 1-chloro-1, 2,2,2-tetrafluoroethane(HCFC-124). Non-limiting examples of suitable fully halogenated chlorofluorocarbons include trichloromonofluoromethane (CFC-II), dichlorodifluoromethane (CFC-12), trichlorotrifluoroethane (CFC-113), 1,1,1-trifluoroethane, pentafluoroethane, dichlorotetrafluoroethane (CFC-114), chloroheptafluoropropane, and dichlorohexafluoropropane. Non-limiting examples of suitable chemical blowing agents include azodicarbonamide, azodiisobutyro-nitrile, benezenesulfonhydrazide, 4,4-oxybenzene sulfonyl-semicarbazide, p-toluene sulfonyl semi-carbazide, barium azodicarboxylate, N,N'-dimethyl-N, N'-dinitrosoterephthalamide, and trihydrazino triazine. In some embodiments, the blowing agent is azodicarbonamide isobutane, $CO_2$, or a mixture of thereof.

The (A) polyolefin component of the present disclosure can also be chemically modified, such as by grafting (for example by use of maleic anhydride (MAH), silanes, glycidyl methacrylate, or other grafting agent), halogenation, amination, sulfonation, or other chemical modification.

Specific Embodiments

Polyethylene-based power cable insulations generally require greater than 1 wt % peroxide to reach a sufficiently high degree of crosslinking. The most commonly used peroxide in cable applications is dicumyl peroxide; typical byproducts from peroxide decomposition from the cross-linking reaction include methane, acetophenone, cumyl alcohol, and alpha methylstyrene. These byproducts can have negative effects on the cable performance and must be removed via a time consuming and costly degassing process. It is generally accepted that the main concern is the methane level, and it is common to carry out degassing until the methane level is reduced to at or below 100 ppm. In order for a composition for a cable to not require degassing (i.e., to qualify as zero degassing), the level of dicumyl peroxide should be less than 0.36 wt %, since about 0.36 wt % of dicumyl peroxide generates approximately 100 ppm of methane. Currently, the best-in-class performance is described in WO 2019/000654 which is directed to compositions having sufficient crosslinking with 0.5 wt % dicumyl peroxide. Surprisingly, the present disclosure demonstrates further improvements with inventive curable compositions having improved crosslinking performance, zero degassing, and/or improved hot creep performance.

The following are non-limiting embodiments that exemplify the present invention and provide detailed disclosures for any claims in this application. Unless stated otherwise, any measured property or characterization in the following embodiments is accordance with the test methods disclosed herein.

1. A curable composition for a cable insulation layer, the curable composition comprising (A) a polyolefin component comprising an unsaturated polyolefin of the formula $A^1L^1$ and (B) a curing component comprising a cross-linking agent, wherein:
  $L^1$ is a polyolefin;
  $A^1$ is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$; and
  $Y^1$ at each occurrence independently is a $C_1$ to $C_{30}$ hydrocarbyl group.

2. A curable composition for a cable insulation layer, the curable composition comprising (A) a polyolefin component comprising a telechelic polyolefin of the formula $A^1L^1L^2A^2$ and (B) a curing component comprising a cross-linking agent, wherein:
  $L^1$ is a polyolefin;
  $A^1$ is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;
  $Y^1$ at each occurrence independently is a $C_1$ to $C_{30}$ hydrocarbyl group;
  $L^2$ is a $C_1$ to $C_{32}$ hydrocarbylene group; and
  $A^2$ is a hydrocarbyl group comprising a hindered double bond.

3. A curable composition for a cable insulation layer, the curable composition comprising (A) a polyolefin component comprising an unsaturated polyolefin of the formula $A^1L^1$ and a telechelic polyolefin of the formula $A^1L^1L^2A^2$ and (B) a curing component comprising a cross-linking agent, wherein:
  $L^1$ at each occurrence independently is a polyolefin;
  $A^1$ at each occurrence independently is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;
  $Y^1$ at each occurrence independently is a $C_1$ to $C_{30}$ hydrocarbyl group;
  $L^2$ is a $C_1$ to $C_{32}$ hydrocarbylene group; and
  $A^2$ is a hydrocarbyl group comprising a hindered double bond.

4. The curable composition of embodiment 3, wherein the (A) polyolefin component comprises a ratio of the unsaturated polyolefin of the formula $A^1L^1$ to the telechelic polyolefin of the formula $A^1L^1L^2A^2$ of from 10:90 to 90:10, or from 20:80 to 80:20, or from 40:60 to 60:40, or 50:50.

5. The curable composition of any of the previous embodiments, wherein the (A) polyolefin component further comprises an ethylene-based polymer.

6. The curable composition of embodiment 1, wherein the (A) polyolefin component further comprises an ethylene-based polymer, and wherein the (A) polyolefin component comprises a ratio of the unsaturated polyolefin of the formula $A^1L^1$ to the ethylene-based polymer of from 10:90 to 90:10, or from 20:80 to 80:20, or from 40:60 to 60:40, or 50:50.

7. The curable composition of embodiment 2, wherein the (A) polyolefin component further comprises an ethylene-based polymer, and wherein the (A) polyolefin component comprises a ratio of the telechelic polyolefin of the formula $A^1L^1L^2A^2$ to the ethylene-based polymer of from 10:90 to 90:10, or from 20:80 to 80:20, or from 40:60 to 60:40, or 50:50.

8. The curable composition of any of embodiments 5-7, wherein the ethylene-based polymer is a polyethylene polymer.

9. The curable composition of embodiment 8, wherein the ethylene-based polymer is a low-density polyethylene (LDPE) polymer.

10. The curable composition of any of embodiments 5-9, wherein the ethylene-based polymer has a density of from 0.860 to 0.970 g/cc, or from 0.875 to 0.960 g/cc, or from 0.890 to 0.950 g/cc, or from 0.900 to 0.940 g/cc, or from 0.910 to 0.930 g/cc.

11. The curable composition of any of embodiments 5-10, wherein the ethylene-based polymer has a melt index (I2) of from 0.01 to 500 g/10 minutes, or from 0.01 to 100 g/10 minutes, or from 0.5 to 50 g/10 minutes, or from 0.5 to 30 g/10 minutes, or from 1 to 5 g/10 minutes.

12. The curable composition of any of the previous embodiments, wherein the crosslinking agent is a peroxide.

13. The curable composition of any of the previous embodiments, wherein the crosslinking agent is dicumyl peroxide.

14. The curable composition of any of the previous embodiments, wherein the curable composition further comprises (C) an additive component comprising an antioxidant.

15. The curable composition of any of the previous embodiments, wherein the (B) curing component further comprises a coagent.

16. The curable composition of any of the previous embodiments, wherein the coagent is a monocyclic organosiloxane.

17. The curable composition of embodiment 15 or 16, wherein the coagent is 2,4,6,8-tetramethyl-2,4,6,8-tetravinyl cyclotetrasiloxane.

18. The curable composition of any of the previous embodiments, wherein the (B) curing component further comprises a scorch inhibitor.

19. The curable composition of embodiment 18, wherein the scorch inhibitor is an alpha-methyl styrene dimer.

20. The curable composition of any of the previous embodiments, wherein the curable composition comprises:
the (A) polyolefin component in an amount of from 5 wt % to 99.9 wt %, or from 25 wt % to 99.9 wt %, or from 50 wt % to 99.9 wt %, or from 80 wt % to 99.9 wt %, or from 90 wt % to 99.99 wt %, or from 95 wt % to 99.99 wt %, based on the total weight of the curable composition;
the (B) curing component in an amount of from 0.1 wt % to 10 wt %, or from 0.1 wt % to 7 wt %, or from 0.1 wt % to 5 wt %, based on the total weight of the curable composition; and
the (C) additive component in an amount of from 0 wt % to 10 wt %, or from 0.1 wt % to 5 wt %, or from 0.1 wt % to 3 wt %, based on the total weight of the curable composition.

21. The curable composition of any of the previous embodiments, wherein the (B) curing component comprising the crosslinking agent is present in an amount of from 0.1 wt % to less than or equal to 5 wt %, or from 0.1 wt % to less than or equal to 2 wt % or from 0.3 wt % to less than or equal to 2 wt %, based on the total weight of the curable composition.

22. The curable composition of any of the previous embodiments, wherein the crosslinking agent is present in an amount of from 0.1 wt % to less than or equal to 5 wt %, or from 0.1 wt % to less than or equal to 2 wt % or from 0.1 wt % to less than or equal to 1 wt %, or from 0.1 wt % to less than or equal to 0.5 wt %, or from 0.1 wt % to less than or equal to 0.36 wt %, or from 0.3 wt % to less than or equal to 0.36 wt %, based on the total weight of the curable composition.

23. The curable composition of any of the previous embodiments,
wherein each $L^1$ independently is an ethylene homopolymer comprising units derived from ethylene,
wherein each $A^1$ independently is a vinyl group, a vinylene group of the formula
$Y^1CH=CH-$, or a mixture of a vinyl group and a vinylene group of the formula $Y^1CH=CH-$, and
wherein each $Y^1$ independently is a methyl group.

24. The curable composition of any of embodiments 1-22, wherein each $L^1$ independently is a propylene homopolymer comprising units derived from propylene,
wherein each $A^1$ independently is a vinylidene group of the formula $CH_2=C(Y^1)-$, a vinylene group of the formula $Y^1CH=CH-$, or a mixture of a vinylidene group of the formula $CH_2=C(Y^1)-$ and a vinylene group of the formula $Y^1CH=CH-$, and
wherein $Y^1$ at each occurrence independently is a methyl group.

25. The curable composition of any of embodiments 1-22, wherein each $L^1$ independently is an ethylene/alpha-olefin copolymer comprising units derived from ethylene and a $C_3$ to $C_{30}$ alpha-olefin, and wherein the $C_3$ to $C_{30}$ alpha-olefin is selected from the group consisting of propylene, 1-butene, 1-hexene, and 1-octene.

26. The curable composition of embodiment 25, wherein the $C_3$ to $C_{30}$ alpha-olefin is propylene and each $L^1$ independently is an ethylene/propylene copolymer; and
wherein each $A^1$ independently is a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, or a mixture of a vinyl group, a vinylidene group of the formula $CH_2=C(Y^1)-$, and a vinylene group of the formula $Y^1CH=CH-$, and
wherein $Y^1$ at each occurrence independently is a methyl group.

27. The curable composition of embodiment 25, wherein the $C_3$ to $C_{30}$ alpha-olefin is 1-butene and each $L^1$ independently is an ethylene/1-butene copolymer,
wherein each $A^1$ independently is a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, or a mixture of a vinyl group, a vinylidene group of the formula $CH_2=C(Y^1)-$, and a vinylene group of the formula $Y^1CH=CH-$, and
wherein $Y^1$ at each occurrence independently is an ethyl group.

28. The curable composition of embodiment 25, wherein the $C_3$ to $C_{30}$ alpha-olefin is 1-hexene and each $L^1$ independently is an ethylene/1-hexene copolymer,
wherein each $A^1$ independently is a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, or a mixture of a vinyl group, a vinylidene group of the formula $CH_2=C(Y^1)-$, and a vinylene group of the formula $Y^1CH=CH-$, and
wherein $Y^1$ at each occurrence independently is a butyl group.

29. The curable composition of embodiment 25, wherein the $C_3$ to $C_{30}$ alpha-olefin is 1-octene and each $L^1$ independently is an ethylene/1-octene copolymer,
wherein each $A^1$ independently is a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, or a mixture of a vinyl group, a vinylidene group of the formula $CH_2=C(Y^1)-$, and a vinylene group of the formula $Y^1CH=CH-$, and
wherein $Y^1$ at each occurrence independently is a $C_6$ alkyl group.

30. The curable composition of any of embodiments 1-22, wherein each $L^1$ independently is a propylene/alpha-olefin copolymer comprising units derived from propylene and either ethylene or a $C_4$ to $C_{30}$ alpha-olefin, wherein the $C_4$ to $C_{30}$ alpha-olefin is selected from the group consisting of 1-butene, 1-hexene, and 1-octene.

31. The curable composition of embodiment 30, wherein each $L^1$ independently is a propylene/ethylene copolymer, and
wherein each $A^1$ independently is a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, or a mixture of a vinyl group, a vinylidene group of the formula $CH_2=C(Y^1)-$, and a vinylene group of the formula $Y^1CH=CH-$, and
wherein $Y^1$ at each occurrence independently is a methyl group.

32. The curable composition of any of embodiment 2-31, wherein $L^2$ is —$CH_2CH(Y^2)$—, and wherein $Y^2$ is hydrogen or a $C_1$ to $C_{30}$ hydrocarbyl group.

33. The curable composition of embodiment 32, wherein $Y^2$ is hydrogen or a C1 to C10 alkyl group.

34. The curable composition of any embodiments 2-33, wherein the hindered double bond is selected from the group consisting of the double bond of a vinylidene group, the double bond of a vinylene group, the double bond of a trisubstituted alkene, and the double bond of a vinyl group attached to a branched alpha carbon.

35. The curable composition of any of embodiments 2-34, wherein each $A^2$ independently is a $C_3$ to $C_{30}$ cyclic hydrocarbyl group or a $C_3$ to $C_{30}$ acyclic hydrocarbyl group.

36. The curable composition of any of embodiments 2-35, wherein each $A^2$ independently is selected from the group consisting of an unsubstituted cycloalkene, an alkyl-substituted cycloalkene, and an acyclic alkyl group.

37. The curable composition of any of embodiments 2-36, wherein each $A^2$ independently is selected from the group consisting of:

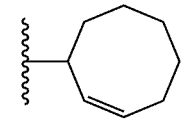
(AA)

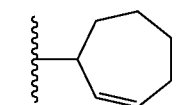
(AB)

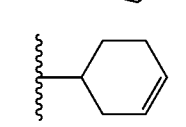
(AC)

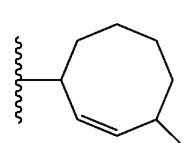
(AD)

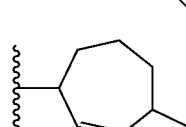
(AE)

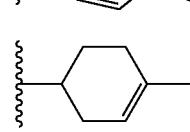
(AF)

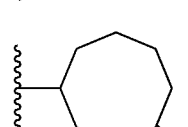
(AG)

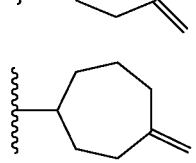
(AH)

-continued

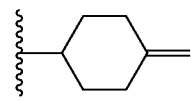
(AI)

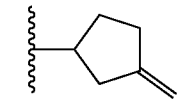
(AJ)

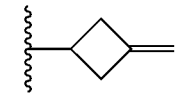
(AK)

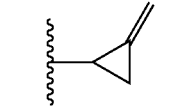
(AL)

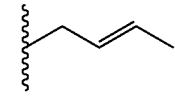
(AM)

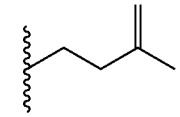
(AN)

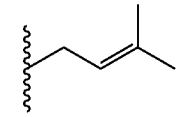
(AO)

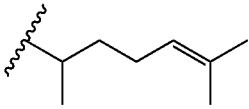
(AP)

(AQ)

(AR)

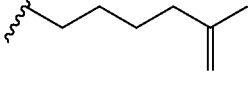
(AS)

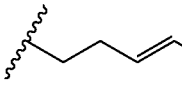
(AT)

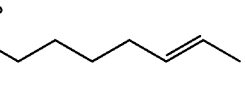
(AU)

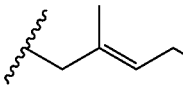
(AV)

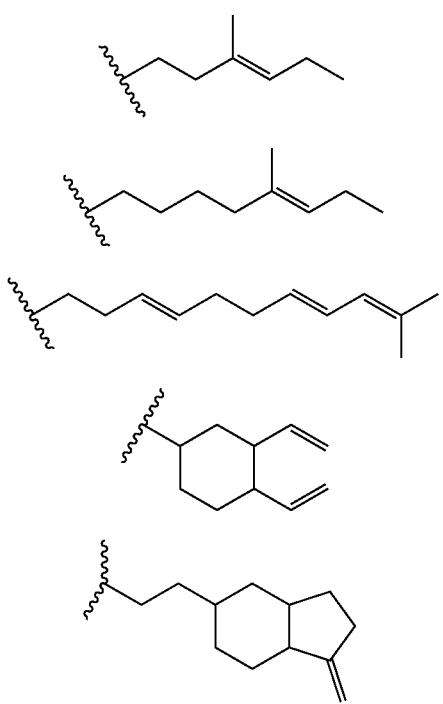

(AW)
(AX)
(AY)
(AZ)
(AZ1)

38. The curable composition of any of embodiments 2-37, wherein each $A^2$ independently is selected from the group consisting of (AC), (AF), (AM), (AO), (AP), (AS), and (AZ1).

39. The curable composition of any of the previous embodiments, wherein each of the unsaturated polyolefin of the formula $A^1L^1$ and the telechelic polyolefin of the formula $A^1L^1L^2A^2$ has a weight average molecular weight (Mw) of from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol, or from 1,000 to 250,000 g/mol, or from 40,000 to 150,000 g/mol.

40. The curable composition of any of the previous embodiments, wherein each of the unsaturated polyolefin of the formula $A^1L^1$ and the telechelic polyolefin of the formula $A^1L^1L^2A^2$ has a number average molecular weight (Mn) of from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol, or from 1,000 to 250,000 g/mol, or from 15,000 to 50,000 g/mol.

41. The curable composition of any of the previous embodiments, wherein each of the unsaturated polyolefin of the formula $A^1L^1$ and the telechelic polyolefin of the formula $A^1L^1L^2A^2$ has an average molar mass (Mz) of from 1,000 to 10,000,000 g/mol, or from 1,000 to 5,000,000 g/mol, or from 1,000 to 1,000,000 g/mol, or from 1,000 to 750,000 g/mol, or from 1,000 to 500,000 g/mol, or from 5,000 to 500,000 g/mol, or from 10,000 to 500,000 g/mol, or from 100,000 to 300,000 g/mol.

42. The curable composition of any of the previous embodiments, wherein each of the unsaturated polyolefin of the formula $A^1L^1$ and the telechelic polyolefin of the formula $A^1L^1L^2A^2$ has an Mw/Mn (PDI) of from 1 to 10, or from 1 to 7, or from 1 to 5, or from 1.5 to 4, or and or from 2 to 4.

43. The curable composition of any of the previous embodiments, wherein each of the unsaturated polyolefin of the formula $A^1L^1$ and the telechelic polyolefin of the formula $A^1L^1L^2A^2$ has a density of from 0.850 to 0.965 g/cc, or from 0.854 to 0.950 g/cc, or from 0.854 to 0.935 g/cc, or from 0.854 to 0.925 g/cc, or from 0.854 to 0.910 g/cc, or from 0.854 to 0.900 g/cc, or from 0.854 to 0.885 g/cc, or from 0.854 to 0.880 g/cc, or from 0.854 to 0.875 g/cc, or from 0.865 to 0.875 g/cc.

44. The curable composition of any of the previous embodiments, wherein each of the unsaturated polyolefin of the formula $A^1L^1$ and the telechelic polyolefin of the formula $A^1L^1L^2A^2$ has a melt index (I2) of from 0.01 to 2000 g/10 minutes, or from 0.01 to 1,500 g/10 minutes, or from 0.01 to 1,000 g/10 minutes, or from 0.01 to 500 g/10 minutes, or from 0.01 to 100 g/10 minutes, or from 0.5 to 50 g/10 minutes, or from 0.5 to 30 g/10 minutes.

45. The curable composition of any of the previous embodiments, wherein each of the unsaturated polyolefin of the formula $A^1L^1$ and the telechelic polyolefin of the formula $A^1L^1L^2A^2$ has a Tm of from −25° C. to 165° C., or from −25° C. to 150° C., or from −25° C. to 125° C., or from −25° C. to 100° C., or from 0° C. to 80° C., or from 10° C. to 70° C., or from 30° C. to 65° C.

46. The curable composition of any of the previous embodiments, wherein each of the unsaturated polyolefin of the formula $A^1L^1$ and the telechelic polyolefin of the formula $A^1L^1L^2A^2$ has an enthalpy of melting (ΔHm) of from 0 to 235 J/g, or from 0 to 200 J/g, or from 10 to 175 J/g, or from 10 to 150 J/g, or from 10 to 125 J/g, or from 20 to 117 J/g, or from 40 to 80 J/g.

47. The curable composition of any of the previous embodiments, wherein each of the unsaturated polyolefin of the formula $A^1L^1$ and the telechelic polyolefin of the formula $A^1L^1L^2A^2$ has a $T_g$ of from −80 to 100° C., or from −80 to 75° C., or from −80 to 50° C., or from −80 to 25° C., or from −80 to 0° C., or from −80 to −15° C., or from −70 to −30° C.

48. The curable composition of any of the previous embodiments, wherein each of the unsaturated polyolefin of the formula $A^1L^1$ and the telechelic polyolefin of the formula $A^1L^1L^2A^2$ comprises from 0 wt % to 0.001 wt % of units derived from diene monomers.

49. The curable composition of any of embodiments 2-48, wherein the telechelic polyolefin of the formula $A^1L^1L^2A^2$ comprises a total number of unsaturations of from equal to or greater than 1.1, or from equal to or greater than 1.2, or from equal to or greater than 1.3, or from equal to or greater than 1.4, or from equal to or greater than 1.5, or from equal to or greater than 1.6, or rom equal to or greater than 1.7, or from equal to or greater than 1.8, or from equal to or greater than 1.9.

50. The curable composition of any of embodiments 1 and 3-48, wherein the unsaturated polyolefin of the formula $A^1L^1$ comprises a total number of unsaturations of equal to or greater than 0.6, or equal to or greater than 0.7, or equal to or greater than 0.8, or equal to or greater than 0.9, or equal to or greater than 1.0, or equal to or greater than 1.1, or equal to or greater than 1.2, or equal to or greater than 1.3.

51. The curable composition of any of the previous embodiments,
wherein the crosslinking agent is present in an amount from greater than or equal to 1 wt % to 2 wt %, based on the total weight of the curable composition, and
wherein the curable composition has a hot creep at 200° C. of less than or equal to 35%, or less than or equal to 31%, or less than or equal to 25%, or less than or equal to 20%, or less than or equal to 15%, or less than or equal to 10% after curing at 180° C. for 15 minutes.

52. The curable composition of any of the previous embodiments,
wherein the crosslinking agent is present in an amount from greater than or equal to 1 wt % to 2 wt %, based on the total weight of the curable composition, and
wherein the curable composition has a hot creep at 200° C. of from greater than zero to less than or equal to 35%, or from greater than or equal to 5 wt % to less than or equal to 31%, or from greater than or equal to 7 wt % to less than or equal to 31%, after curing at 180° C. for 15 minutes.

53. The curable composition of any of embodiments 1-50, wherein the crosslinking agent is present in an amount from greater than or equal to 1 wt % to 2 wt %, based on the total weight of the curable composition, and
wherein the curable composition has a hot creep at 150° C. of less than or equal to 35%, or less than or equal to 30%, or less than or equal to 25%, or less than or equal to 23%, or less than or equal to 15%, or less than or equal to 10% after curing at 180° C. for 15 minutes.

54. The curable composition of any of embodiments 1-50, wherein the crosslinking agent is present in an amount from greater than or equal to 1 wt % to 2 wt %, based on the total weight of the curable composition, and
wherein the curable composition has a hot creep at 150° C. of from greater than zero to less than or equal to 35%, or from greater than or equal to 5 wt % to less than or equal to 30%, or from greater than or equal to 6 wt % to less than or equal to 25%, after curing at 180° C. for 15 minutes.

55. The curable composition of any of the previous embodiments,
wherein the crosslinking agent is present in an amount from greater than or equal to 1 wt % to 2 wt %, based on the total weight of the curable composition, and
wherein the curable composition has a MH of greater than or equal to 5 dNm, or greater than or equal to 8 dNm, or greater than or equal to 10 dNm, or greater than or equal to 12 dNm, after curing at 182° C. for 12 minutes.

56. The curable composition of any of the previous embodiments,
wherein the crosslinking agent is present in an amount from greater than or equal to 1 wt % to 2 wt %, based on the total weight of the curable composition, and
wherein the curable composition has a MH of from greater than or equal to 5 dNm to less than or equal to 20 dNm, or from greater than or equal to 5 dNm to less than or equal to 15 dNm, or from greater than or equal to 7.5 dNm to less than or equal to 15 dNm, after curing at 182° C. for 12 minutes.

57. The curable composition of any of embodiments 1-50, wherein the crosslinking agent is present in an amount from 0.3 wt % to 0.36 wt %, based on the total weight of the curable composition, and
wherein the curable composition has a hot creep at 200° C. of less than or equal to 175%, or less than or equal to 120%, or less than or equal to 100%, or less than or equal to 80%, or less than or equal to 60%, or less than or equal to 40%, or less than or equal to 30%, or less than or equal to 25%, after curing at 180° C. for 15 minutes.

58. The curable composition of any of embodiments 1-50, wherein the crosslinking agent is present in an amount from 0.3 wt % to 0.36 wt %, based on the total weight of the curable composition, and
wherein the curable composition has a hot creep at 200° C. of from greater than or equal to zero to less than or equal to 175%, or from greater than or equal to 20% to less than or equal to 120%, after curing at 180° C. for 15 minutes.

59. The curable composition of any of embodiments 1-50, wherein the crosslinking agent is present in an amount from 0.3 wt % to 0.36 wt %, based on the total weight of the curable composition, and
wherein the curable composition has a hot creep at 150° C. of less than or equal to 175%, or less than or equal to 130%, or less than or equal to 110%, or less than or equal to 90%, or less than or equal to 70%, or less than or equal to 50%, or less than or equal to 30%, or less than or equal to 20%, after curing at 180° C. for 15 minutes.

60. The curable composition of any of embodiments 1-50, wherein the crosslinking agent is present in an amount from 0.3 wt % to 0.36 wt %, based on the total weight of the curable composition, and
wherein the curable composition has a hot creep at 150° C. of from greater than or equal to zero to less than or equal to 175%, or from greater than or equal to 15% to less than or equal to 130%, after curing at 180° C. for 15 minutes.

61. The curable composition of any of embodiments 1-50 and 57-60,
wherein the crosslinking agent is present in an amount from 0.3 wt % to 0.36 wt %, based on the total weight of the curable composition, and
wherein the curable composition has a MH of greater than or equal to 2.1 dNm, or greater than or equal to 3 dNm, or greater than or equal to 4 dNm, or greater than or equal to 5 dNm, after curing at 182° C. for 12 minutes.

62. The curable composition of any of embodiments 1-50 and 57-60,
wherein the crosslinking agent is present in an amount from 0.3 wt % to 0.36 wt %, based on the total weight of the curable composition, and
wherein the curable composition has a MH of from greater than or equal to 2.1 dNm to less than or equal to 20 dNm, or from greater than or equal to 2.1 dNm to less than or equal to 10 dNm, or from greater than or equal to 2.1 dNm to less than or equal to 6 dNm, after curing at 182° C. for 12 minutes.

63. The curable composition of any of embodiments 1 and 3-62, wherein $L^1$ of the unsaturated polyolefin of the formula $A^1L^1$ is covalently bonded to $A^1$ through a carbon-carbon single bond.

64. The curable composition of any of embodiments 2-63, wherein $L^1$ of the telechelic polyolefin of the formula $A^1L^1L^2A^2$ is covalently bonded to each of $A^1$ and $L^2$ through carbon-carbon single bonds, and wherein $L^2$ of the telechelic polyolefin of the formula $A^1L^1L^2A^2$ is covalently bonded to $A^2$ through a carbon-carbon single bond.

65. The curable composition of any of embodiments 1 and 3-63, wherein $L^1$ of the unsaturated polyolefin of the formula $A^1L^1$ is a polyolefin that is missing one hydrogen and is covalently bonded to $A^1$ through a carbon-carbon single bond.

66. The curable composition of embodiments 2-65, wherein $L^1$ of the telechelic polyolefin of the formula $A^1L^1L^2A^2$ is a polyolefin that is missing two hydrogens and is covalently bonded to each of $A^1$ and $L^2$ through carbon-carbon single bonds.

67. An article made from the curable composition of any of the previous embodiments.

68. The article of embodiment 67, wherein the article is a cable insulation layer.

Testing Methods

Unless stated otherwise, the measurable properties discussed in the foregoing disclosure and the examples that follow are in accordance with the following analytical methods.

Density

Samples that were measured for density were prepared according to ASTM D-1928, which is incorporated herein by reference in its entirety. Measurements were made within one hour of sample pressing using ASTM D-792, Method B, which is incorporated herein by reference in its entirety.

Melt Index/Melt Flow Rate

Melt index ($I_2$) was measured in accordance with ASTM D-1238, which is incorporated herein by reference in its entirety, Condition 190° C./2.16 kg, and was reported in grams eluted per 10 minutes. Melt flow rate ($I_{10}$) was measured in accordance with ASTM D-1238, Condition 190° C./10 kg, and was reported in grams eluted per 10 minutes.

GPC

Sample polymers were tested for their properties via GPC according to the following. A high temperature Gel Permeation Chromatography system (GPC IR) consisting of an Infra-red concentration detector (IR-5) from PolymerChar Inc (Valencia, Spain) was used for Molecular Weight (MW) and Molecular Weight Distribution (MWD) determination. The carrier solvent was 1,2,4-trichlorobenzene (TCB). The auto-sampler compartment was operated at 160° C., and the column compartment was operated at 150° C. The columns used were four Polymer Laboratories Mixed A LS, 20 micron columns. The chromatographic solvent (TCB) and the sample preparation solvent were from the same solvent source with 250 ppm of butylated hydroxytoluene (BHT) and nitrogen sparged. The samples were prepared at a concentration of 2 mg/mL in TCB. Polymer samples were gently shaken at 160° C. for 2 hours. The injection volume was 200 µl, and the flow rate was 1.0 ml/minute.

Calibration of the GPC column set was performed with 21 narrow molecular weight distribution polystyrene standards. The molecular weights of the standards ranged from 580 to 8,400,000 g/mol, and were arranged in 6 "cocktail" mixtures, with at least a decade of separation between individual molecular weights.

The GPC column set was calibrated before running the examples by running twenty-one narrow molecular weight distribution polystyrene standards. The molecular weight (Mw) of the standards ranges from 580 to 8,400,000 grams per mole (g/mol), and the standards were contained in 6 "cocktail" mixtures. Each standard mixture had at least a decade of separation between individual molecular weights. The standard mixtures were purchased from Polymer Laboratories (Shropshire, UK). The polystyrene standards were prepared at 0.025 g in 50 mL of solvent for molecular weights equal to or greater than 1,000,000 g/mol and 0.05 g in 50 mL of solvent for molecular weights less than 1,000,000 g/mol. The polystyrene standards were dissolved at 80° C. with gentle agitation for 30 minutes. The narrow standards mixtures were run first and in order of decreasing highest molecular weight (Mw) component to minimize degradation. The polystyrene standard peak molecular weights were converted to polyethylene Mw using the Mark-Houwink constants. Upon obtaining the constants, the two values were used to construct two linear reference conventional calibrations for polyethylene molecular weight and polyethylene intrinsic viscosity as a function of elution column.

The polystyrene standard peak molecular weights were converted to polyethylene molecular weights using the following equation (as described in Williams and Ward, J. Polym. Sci., Polym. Let., 6, 621 (1968)):

$$M_{polyethylene} = A(M_{polystyrene})^B \quad (1)$$

Here B has a value of 1.0, and the experimentally determined value of A is around 0.41.

A third order polynomial was used to fit the respective polyethylene-equivalent calibration points obtained from equation (1) to their observed elution volumes of polystyrene standards.

Number, weight, and z-average molecular weights were calculated according to the following equations:

$$\overline{Mn} = \frac{\sum^i Wf_i}{\sum^i (Wf_i/M_i)} \quad (2)$$

$$\overline{Mw} = \frac{\sum^i (Wf_i * M_i)}{\sum^i Wf_i} \quad (3)$$

$$\overline{Mz} = \frac{\sum^i (Wf_i * M_i^2)}{\sum^i (Wf_i * M_i)} \quad (4)$$

Where, $Wf_i$ is the weight fraction of the i-th component and $M_i$ is the molecular weight of the i-th component.

The MWD was expressed as the ratio of the weight average molecular weight (Mw) to the number average molecular weight (Mn).

The accurate A value was determined by adjusting A value in equation (1) until Mw calculated using equation (3) and the corresponding retention volume polynomial, agreed with the known Mw value of 120,000 g/mol of a standard linear polyethylene homopolymer reference.

The GPC system consists of a Waters (Milford, Mass.) 150° C. high temperature chromatograph (other suitable high temperatures GPC instruments include Polymer Laboratories (Shropshire, UK) Model 210 and Model 220) equipped with an on-board differential refractometer (RI). Additional detectors could include an IR4 infra-red detector from Polymer ChAR (Valencia, Spain), Precision Detectors (Amherst, Mass.) 2-angle laser light scattering detector Model 2040, and a Viscotek (Houston, Tex.) 150R 4-capillary solution viscometer. A GPC with the last two independent detectors and at least one of the first detectors is sometimes referred to as "3D-GPC", while the term "GPC" alone generally refers to conventional GPC. Depending on the sample, either the 15-degree angle or the 90-degree angle of the light scattering detector was used for calculation purposes.

Data collection was performed using Viscotek TriSEC software, Version 3, and a 4-channel Viscotek Data Manager DM400. The system was equipped with an on-line solvent degassing device from Polymer Laboratories (Shropshire, UK). Suitable high temperature GPC columns could be used, such as four 30 cm long Shodex HT803 13 micron columns or four 30 cm Polymer Labs columns of 20-micron mixed-pore-size packing (MixA LS, Polymer Labs). The sample carousel compartment was operated at 140° C. and the column compartment was operated at 150° C. The samples were prepared at a concentration of 0.1 grams of polymer in 50 milliliters of solvent. The chromatographic solvent and the sample preparation solvent contain 200 ppm of butylated hydroxytoluene (BHT). Both solvents were sparged with nitrogen. The polyethylene samples were gently stirred at 160° C. for four hours (4 h). The injection volume was 200 microliters (L). The flow rate through the GPC was set at 1 mL/minute.

NMR ($^{13}$C and $^1$H)

Sample Preparation: For $^{13}$C NMR, a sample was prepared by adding approximately 2.7 g of stock solvent to 0.20-0.40 g of sample in a 10 mm NMR tube. The stock solvent is tetrachlorethane-$d_2$ containing 0.025M chromium acetylacetonate (relaxation agent). The samples were capped and sealed with Teflon tape. The samples were dissolved and homogenized by heating the tube and its contents at 135-140° C.

Sample Preparation: For $^1$H NMR, a sample was prepared by adding 130 mg of sample to 3.25 g of 50/50 by weight tetrachlorethane-$d_2$/Perchloroethylene with 0.001 M Cr(A-cAc)$_3$ in a 10 mm NMR tube. The samples were purged by bubbling $N_2$ through the solvent via a pipette inserted into the tube for approximately 5 minutes to prevent oxidation, capped, sealed with Teflon tape. The samples were heated and vortexed at 115° C. to ensure homogeneity.

Data Acquisition Parameters: For $^{13}$C NMR, the data was collected using a Bruker 400/600 MHz spectrometer equipped with a Bruker high-temperature CryoProbe (see Reference 1 noted below). The data was acquired using 256-8000 transients per data file, a 7.3 sec pulse repetition delay (6 sec delay+1.3 sec acq. time), 90 degree flip angles, and a modified inverse gated decoupling with a sample temperature of 120° C. (see Reference 2 noted below). All measurements were made on non-spinning samples in locked mode. Samples were homogenized immediately prior to insertion into the heated (125° C.) NMR Sample changer, and were allowed to thermally equilibrate in the probe for 7 minutes prior to data acquisition.

Data Acquisition Parameters: $^1$H NMR was performed on a Bruker AVANCE 400/600 MHz spectrometer equipped with a Bruker high-temperature CryoProbe and a sample temperature of 120° C. Two experiments were run to obtain spectra, a control spectrum to quantify the total polymer protons, and a double presaturation experiment, which suppresses the intense polymer backbone peaks and enables high sensitivity spectra for quantitation of the end-groups. The control was run with ZG pulse, 4 scans, SWH 10,000 Hz, AQ 1.64s, $D_1$ 14s. The double presaturation experiment was run with a modified pulse sequence, 1c1prf2.zz1, TD 32768, 100 scans, DS 4, SWH 10,000 Hz, AQ 1.64s, D1 is, $D_{13}$ 13s.

Data Analysis: The comonomer content was analyzed with corresponding matrix or algebra method. The unsaturation was analyzed with the method in Reference 3 noted below.

Reference 1: Z. Zhou, R. Küemmerle, J. C. Stevens, D. Redwine, Y. He, X. Qiu, R. Cong, J. Klosin, N. Montañez, G. Roof, Journal of Magnetic Resonance, 2009, 200, 328.

Reference 2: Z. Zhou, R. Kümmerle, X. Qiu, D. Redwine, R. Cong, A. Taha, D. Baugh, B. Winniford, Journal of Magnetic Resonance: 187 (2007) 225.

Reference 3: Z. Zhou, R. Cong, Y. He, M. Paradkar, M. Demirors, M. Cheatham, W. deGroot, Macromolecular Symposia, 2012, 312, 88.

Brookfield Viscosity

The Brookfield viscosity was measured at 177° C. in accordance with ASTM D-3236, using a Brookfield RV-DV-II-Pro viscometer and spindle SC-31.

GC/MS

Tandem gas chromatography/low resolution mass spectroscopy using electron impact ionization (EI) is performed at 70 eV on an Agilent Technologies 6890N series gas chromatograph equipped with an Agilent Technologies 5975 inert XL mass selective detector and an Agilent Technologies Capillary column (HP1MS, 15 m×0.25 mm, 0.25 micron) with respect to the following:

Programed method:
Oven Equilibration Time at 50° C. for 0.5 min
then 25° C./min to 200° C., and hold for 5 min
Run Time 11 min

DSC

Differential Scanning Calorimetry (DSC) was performed using a TA Instruments Discovery DSC, equipped with an RCS cooling unit and an autosampler. A nitrogen purge gas flow of 50 mL/min was used. The higher molecular weight samples (<50 dg/min melt index at 190° C.) were pressed into a thin film, at 190° C., on a Carver Hydraulic press, at a pressure of 20,000 psi, and for a time of 4 minutes, followed by cooling at a temperature of 23° C., at a pressure of 20,000 psi for a time of 1 minute. About 3-10 mg of material was cut from the pressed film, weighed, placed in a light aluminum pan, and crimped shut. For the low molecular weight samples (>50 dg/min melt index at 190° C.), about 3-10 mg of material was cut from the as-received bale, weighed, placed in a light aluminum pan, and crimped shut. The thermal behavior of the samples was investigated using the following temperature profile: the sample was rapidly heated to 180° C., and held isothermally for 5 minutes. The sample was then cooled to −90° C., at 10° C./min, and held isothermally for 5 minutes. The sample was then heated to 150° C. at 10° C./min. The cooling and second heating curves were used for analysis. The glass transition temperature (Tg), melting temperature (Tm), and heat of enthalpy (ΔHm) were obtained from the second heat data. The crystallization temperature (Tc) was obtained from the first cool data. The Tg was determined using the half-height method. The Tm and Tc were determined as the peak of the melting endotherm and crystallization exotherm, respectively. The percent crystallinity is calculated by dividing the heat of fusion (Hf), determined from the second heat curve, by a theoretical heat of fusion of 292 J/g for PE, and multiplying this quantity by 100 (for example, % cryst.= (Hf/292 J/g)×100 (for PE)). If the example contains majority propylene, the theoretical heat of fusion of 165 J/g for PP is used.

DMS

Rheology was measured on an Advanced Rheometric Expansion System (ARES), equipped with "25 mm" stainless steel parallel plates. Constant temperature dynamic frequency sweeps, in the frequency range of 0.1 to 100 rad/s, were performed under nitrogen purge at 190° C. Samples approximately "25.4 mm in diameter" and "3.2 mm thick" were compression molded on a Carver hydraulic hot press at a temperature of 190° C., at a pressure of 20,000 psi, for a time of four minutes, followed by cooling at a temperature of 23° C., at a pressure of 20,000 psi, for a time of one minute. The sample was placed on the lower plate, and allowed to melt for five minutes. The plates were then closed to a gap of 2.0 mm, and the sample trimmed to "25 mm in diameter." The sample was allowed to equilibrate at 190° C. for five minutes, before starting the test. The complex viscosity was measured at constant strain amplitude of 10%. Viscosity at 0.1 rad/s (V0.1) and at 100 rad/s (V100) are reported, along with the ratio (V0.1/V100) of the two viscosity values.

Moving Die Rheometer (MDR)

The cure kinetic profiles (also known as curing curves) of each formulation at 182° C. were measured using a MDR- 2000 instrument according to ASTM D5289. A 4 gram sample of the resins was placed between two pieces of polyester Melinex S films. The test was carried out at 182° C. over a period of 12 minutes at 0.5 degrees arc oscillation at 1.67 Hz. The rheology or curve of torque as a function of time for each formulated composition was measured from the uncured samplet, which was then cured during the analysis. The visco-elastic properties, such as minimum S' torque (ML) and maximum S' torque (MH) were measured during the cure cycle.

Hot Creep

Hot creep was measured to determine the degree of cure and hot set was used to measure the sample relaxation after hot creep elongation. Testing was based on the ICEA-T-28-562-2003 method for power cable insulation materials. Hot creep testing was conducted on 50 mil thick samples in an oven with a glass door at 150° C. or 200° C. with 0.2 MPa stress applied to the bottom of the specimens. Three test specimens for each sample were cut using ASTM D 412 type D tensile bars. The samples elongated for 15 minutes where the percentage increase in length was measured and the average values of the three specimens were reported. The hot creep values were obtained for the same samples undergoing hot-creep testing, after removing the load for 5 minutes under heat and cooling them at room temperature for 10 minutes. Samples that are reported as "Fail" either broke or stretched to the bottom of the aging oven during testing so a hot creep value could not be measured.

EXAMPLES

Preparation of Chain Transfer Agents (CTA's)

Unless otherwise noted, all starting reagents and materials were obtained from Sigma-Aldrich. The procatalysts (Cat 1), (Cat 13), (Cat 14), and (Cat 17), as well as any others, used in the examples below are the same as those discussed previously and prepared according to the methods discussed previously. Procatalyst (Cat 1) may also be identified as [N-(2,6-di(1-methylethyl)phenyl)amido)(2-isopropylphenyl)(α-naphthalen-2-diyl(6-pyridin-2-diyl)methane)]hafnium dimethyl. "Cocat A" is the co-catalyst used in the examples below and is bis(hydrogenated tallow alkyl)methyl, tetrakis(pentafluorophenyl) borate(1-) amine.

Figure 1B:
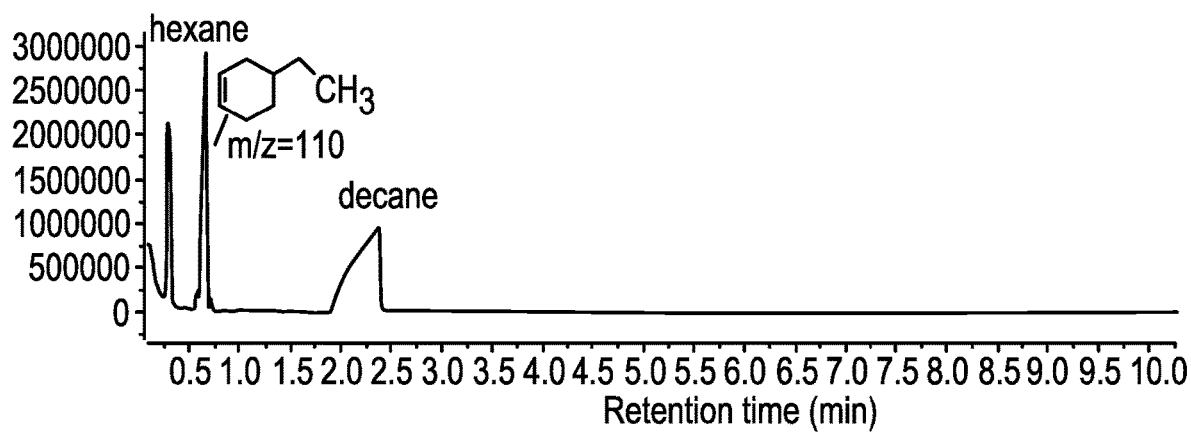

Synthesis of tris(2-(cyclohex-3-en-1-yl)ethyl)aluminum ("CTA 1"). An exemplary chain transfer agent of the present disclosure was prepared as follows. In a drybox, 4-vinyl-1-cyclohexene (3.2 mL, 24.6 mmol) and triisobutylaluminum (2.0 ml, 7.92 mmol) were added to 5 mL of decane in a vial equipped with a stirbar and a venting needle on the cap. This mixture was heated at 120° C. with stirring for 3 hours. After 3 hours, a sample was dissolved in benzene-d6 for $^1$H NMR analysis, and another aliquot was hydrolyzed with water and analyzed by GC/MS. $^1$H NMR showed all vinyl groups reacted and the internal double bond remained (FIG. 1A). GC/MS showed a clean peak at m/z of 110, consistent to the molecular weight of ethylcyclohexene (FIG. 1B). Accordingly, $^1$H NMR and GC/MS confirmed the synthesis of tris(2-(cyclohex-3-en-1-yl)ethyl)aluminum ("CTA 1") via non-limiting Scheme 1.

Scheme 1.

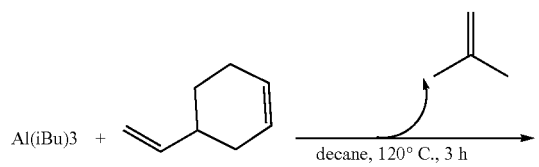

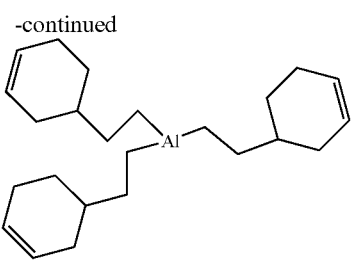

Figure 2:
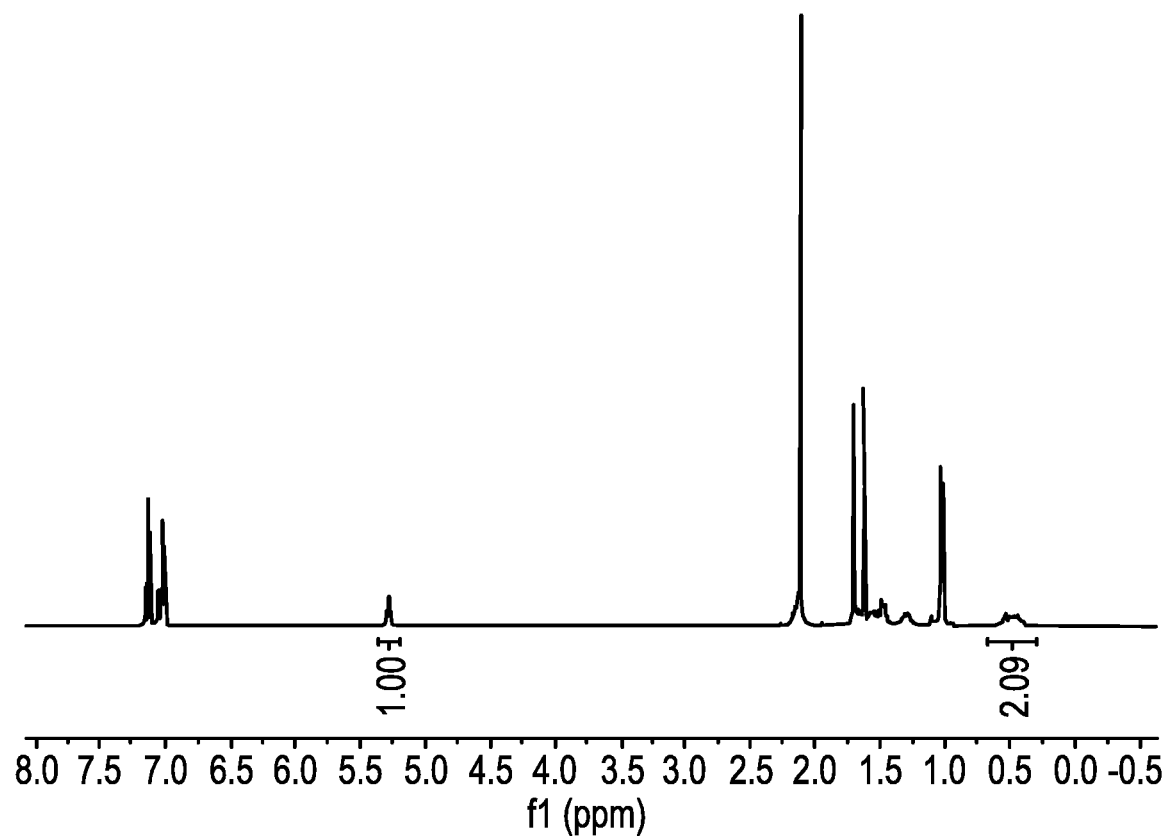
FIG. 2 provides the 1H NMR spectrum for the synthesis of CTA 2.

Synthesis of tris(3,7-dimethyloct-6-en-1-yl)aluminum ("CTA 2"): In a nitrogen-filled drybox, a 40 mL vial was equipped with a stirbar and charged with DIBAL-H (8.10 mL, 9.64 mmol; 20 wt % solution in toluene) and citronellene (4.00 g, 28.93 mmol; mixture of isomers). The vial was placed in a heating block and a vent needle was inserted into the headspace. The solution was heated at 110-112° C. for 9 hours giving a colorless transparent solution ([Al]=0.88 M). The material was determined to be the desired product via $^1$H NMR (FIG. 2) of an aliquot dissolved in $C_6D_6$ as well as the GC/MS of a hydrolyzed aliquot (m/z=140). Accordingly, $^1$H NMR and GC/MS confirmed the synthesis of tris(3,7-dimethyloct-6-en-1-yl)aluminum ("CTA 2") via non-limiting Scheme 2.

Scheme 2

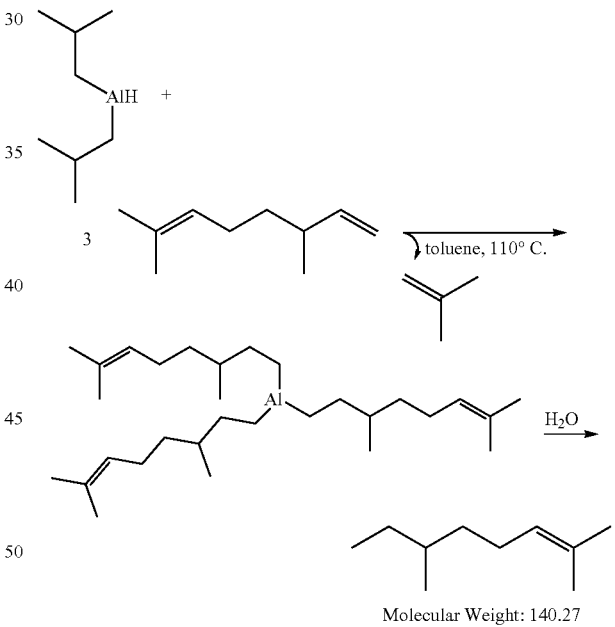

Molecular Weight: 140.27

Synthesis of hex-4-en-1-yldiisobutylaluminum ("CTA 3"): An exemplary chain transfer agent of the present disclosure was prepared as follows. In a nitrogen-filled drybox, DIBAL-H (0.800 g, 5.63 mmol) and 1,4-hexadiene (0.65 mL, 5.63 mmol, d 0.710; mixture of cis and trans isomers) were added to 3 mL of dry, degassed toluene. The reaction mixture was stirred at 25° C. for 14 hours. $^1$H NMR analysis of a hydrolyzed sample (see hydrolysis procedure below) showed no reaction. The solution was heated at 60° C. with stirring for 22 hours. After the vial was allowed to cool to 25° C. an aliquot was hydrolyzed and analyzed. Complete reaction was observed by $^1$H NMR indicated by the disappearance of the starting diene and appearance of signals consistent with the hydrolysis products: isobutane and 2-hexene. Hydrolysis for analysis was carried out by diluting ca 0.1 mL of the sample to ca 2 mL with $C_6D_6$ in a vial, removing the sample from the glove box, and adding ca 0.1 mL of nitrogen-purged water via syringe. After shaking the vial the mixture was passed through a 0.45 m syringe filter. The organic phase passes through more easily than the aqueous phase, allowing for quick isolation of the organic phase for analysis. The sample was then mixed with a small amount of silica gel and filtered again. This helps remove residual Al species that can cause gelation. Accordingly, $^1H$ NMR confirmed the synthesis of hex-4-en-1-yldiisobutyl-aluminum ("CTA 3") via non-limiting Scheme 3.

Scheme 3.

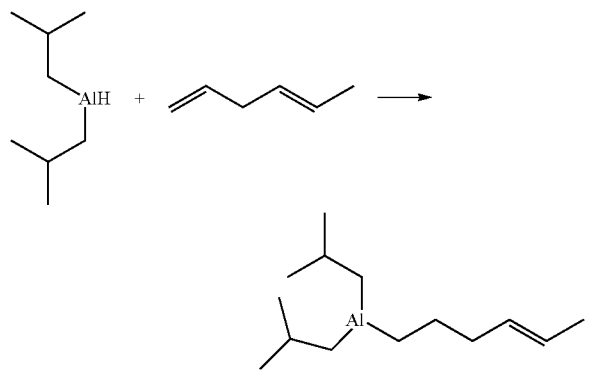

Synthesis of bis(-2-ethylhex-4-en-1-yl)zinc ("CTA 4"): In a nitrogen-filled drybox, diethylzinc (3.40 mL, 5.00 mmol, 20 wt % in toluene), 1,4-hexadiene (1.16 mL, 10.00 mmol, d 0.710; mixture of cis and trans isomers), and the activator [HNMe$(C_{18}H_{37})_2$][B$(C_6F_5)_4$] (1.40 mL, 0.09 mmol, 0.064 M in methylcyclohexane) were mixed in a vial. (Cat 13) (0.045 g, 0.08 mmol)) was added as a solid and the reaction mixture was stirred at 25° C. for 20 hours. $^1H$ NMR and GC/MS analysis of a hydrolyzed sample (see hydrolysis procedure below) showed complete reaction. $^1H$ NMR indicated by the disappearance of the starting diene and appearance of signals consistent with the hydrolysis product 5-methylhept-2-ene. GC/MS showed the same expected hydrolysis product. Accordingly, $^1H$ NMR and GC/MS confirmed the synthesis of bis(-2-ethylhex-4-en-1-yl)zinc ("CTA 4") via non-limiting Scheme 4.

Scheme 4.

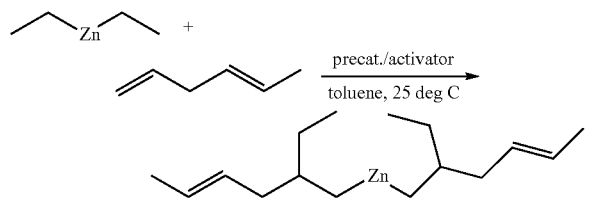

Synthesis of "CTA 5": Diethylzinc (0.66 mL, 0.97 mmol; 1.47 M solution in toluene), 4-vinylcyclohexene (1.77 mL, 13.58 mmol; d 0.832), the activator ([HNMe$(C_{18}H_{37})_2$][B$(C_6F_5)_4$]) solution in methylcyclohexane (0.60 mL, 0.039 mmol; 0.0644M) and triethylaluminum (0.53 mL, 3.88 mmol; neat, 93%) were dissolved in toluene (~10 mL). (Cat 13) (0.023 g, 0.039 mmol) was added as a solid and the reaction mixture was stirred at 25° C. for 14 hours. An aliquot was dissolved in $C_6D_6$ and quenched with water. GC/MS and $^1H$ NMR confirmed the consumption of 4-vinylcyclohexene and the formation of the desired product (m/z=138). Accordingly, this confirms that CTA 5 was prepared via non-limiting Scheme 5.

Scheme 5

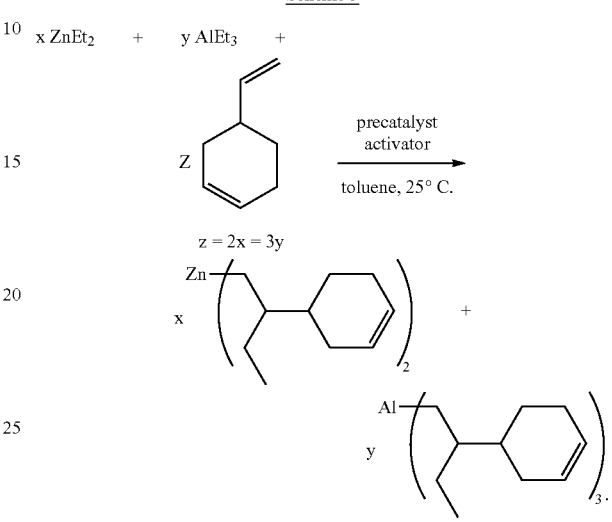

Synthesis of "CTA 6": The toluene solution of tris(2-(cyclohex-3-en-1-yl)ethyl)aluminum (10 mL, [Al]=0.424 M) was mixed with diisobutylzinc (0.286 g, 1.59 mmol) and 4-vinylcyclohexene (0.416 mL, 3.19 mmol; d 0.830). The solution was heated for 4 hours at 110° C. with a vent needle inserted through the septum cap of the vial to allow isobutylene to escape. During this treatment $^iBu$ groups from DIBZ transferred to Al and thermal elimination of isobutylene followed by 4-vinylcyclohexene insertions ensured that all alkyl groups on Al and Zn were cyclohexenylethyl groups. An aliquot (0.1 mL) of this mixture was diluted with $C_6D_6$ (0.5 mL) and hydrolyzed for $^1H$ NMR analysis. $^1H$ NMR analysis confirmed CTA was synthesized via non-limiting Scheme 6.

Scheme 6

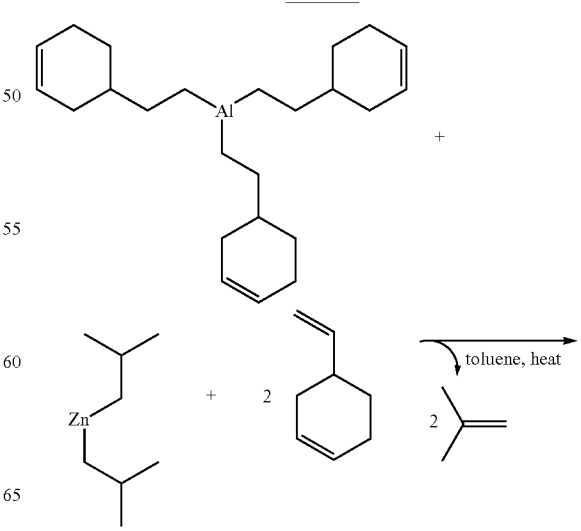

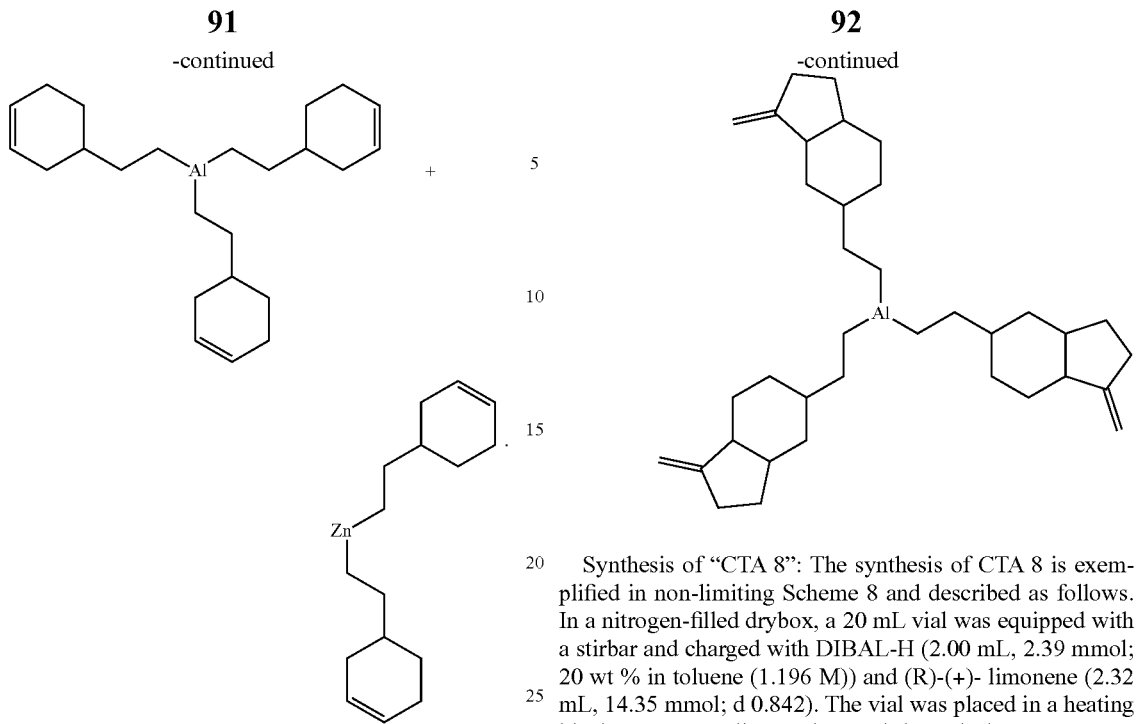

Synthesis of "CTA 7": The synthesis of CTA 7 is exemplified in non-limiting Scheme 7 and described as follows. It was carried out in two steps. In the first step, trivinylcyclohexane (TVCH) was converted to a diene via intramolecular cyclization in the presence of catalytic amount of DIBAL-H, and in the second step additional DIBAL-H was added to form the CTA.

Thus, in a nitrogen-filled drybox, DIBAL-H (0.30 g, 2.11 mmol) was added to TVCH (4.09 mL, 21.1 mmol; d 0.836). The mixture was heated at 160° C. and stirred for 2 h to form cyclized-TVCH. In a separate vial additional DIBAL-H (0.35 g, 2.46 mmol) was dissolved in decane (5 mL), followed by addition of a portion of the cyclized-TVCH (2.05 mL, 10.5 mmol) obtained above. The solution was maintained at 130° C. for 2 h to obtain the Al-TVCH solution.

Scheme 7.

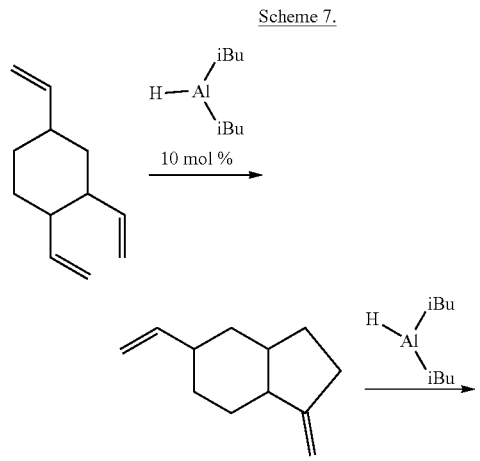

Synthesis of "CTA 8": The synthesis of CTA 8 is exemplified in non-limiting Scheme 8 and described as follows. In a nitrogen-filled drybox, a 20 mL vial was equipped with a stirbar and charged with DIBAL-H (2.00 mL, 2.39 mmol; 20 wt % in toluene (1.196 M)) and (R)-(+)- limonene (2.32 mL, 14.35 mmol; d 0.842). The vial was placed in a heating block, a vent needle was inserted through the septum cap, and the solution was heated at 110-112° C. for 11 hours. Solvent and excess limonene were removed under vacuum at 50° C. overnight to afford the desired product as a colorless viscous oil (0.870 g, 83%).

Scheme 8.

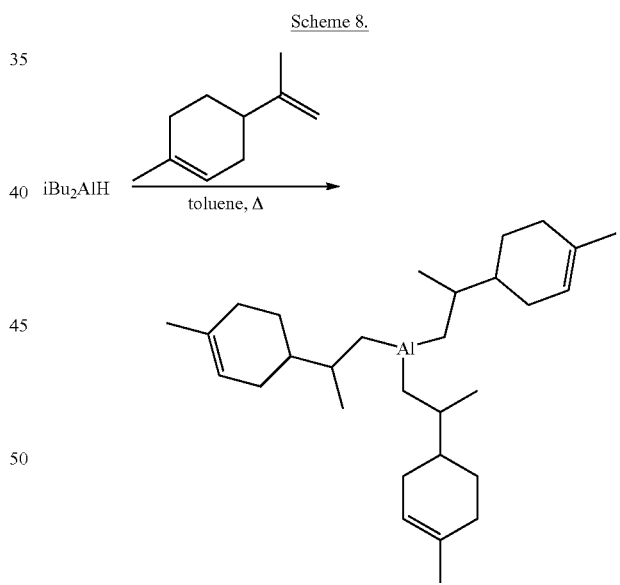

Synthesis of "CTA 9": The synthesis of CTA 9 is exemplified in non-limiting Scheme 9 and described as follows. In a nitrogen-filled drybox a 40 mL vial was equipped with a stirbar and charged with DIBAL-H (2.00 g, 14.06 mmol), toluene (9.2 mL) and 7-methyl-1,6-octadiene (5.24 g, 42.19 mmol). An immediate exotherm (with some bubbling) was observed. The vial was placed in a heating block, a vent needle was inserted through the septum cap, and the solution was heated at 110-112° C. for 3 hours. After 3 hours of reaction time an aliquot showed reaction progress. The solution contained a small amount of suspended white solid particles. The reaction was continued for another 22 hours. The reaction was nearly complete. A small amount of dimer formation from the alkene reagent was observed. The reaction was continued for another 16 hours. Analysis of an aliquot showed no significant changes.

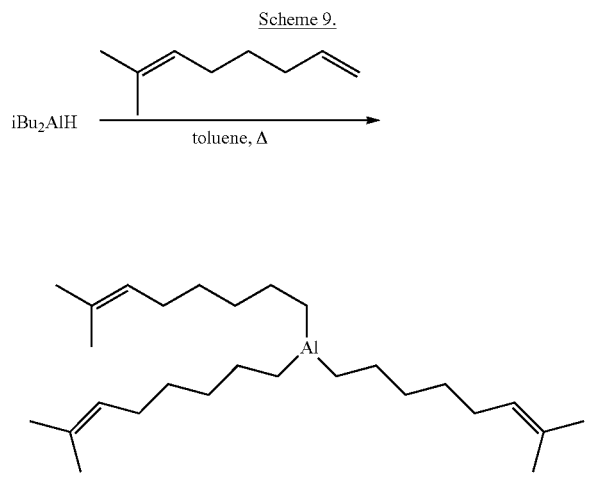

Scheme 9.

Batch Reactor Synthesis of Telechelic Polyolefins

Three sets of non-limiting examples of the telechelic polyolefin of the formula $A^1L^1L^2A^2$ were synthesized via batch reactor as follows.

Set 1

With reference to Tables 1A-1C, Set 1 includes inventive telechelic polymers made in runs BR1 to BR12 that were prepared as follows. In each run, a one gallon stirred autoclave reactor is charged with Isopar™ E mixed alkanes solvent (~1.3 kg), desired mass of propylene, or octene, and/or ethylidene norbornene (ENB) (60 g) and CTA. The reactor is heated to 120° C. and charged with ethylene (20 g). An active catalyst solution is prepared in a drybox under inert atmosphere by mixing procatalyst and an activator mixture (a mixture of 1.2 equiv of Cocat A and 10 equiv of modified methyl aluminoxane (MMAO-3A)), where the active catalyst solution has a ratio of procatalyst to Cocat A of 1:1.2. The active catalyst solution is injected into the reactor to initiate the polymerization. The reactor pressure and temperature is kept constant by feeding ethylene during the polymerization and cooling the reactor as needed. After 10 minutes, the reactor was heated to 200° C. and kept at the temperature for 20 minutes. The ethylene feed is shut off and the polymer solution transferred into a nitrogen-purged resin kettle. An additive solution containing a phosphorus stabilizer and phenolic antioxidant (Irgafos® 168 and Irganox® 1010 in a 2:1 ratio by weight in toluene) is added to give a total additive content of approximately 0.1% in the polymer. The polymer is thoroughly dried in a vacuum oven.

| | | | | Step 1 | | Step 2 | | | | | | |
|---|---|---|---|---|---|---|---|---|---|---|---|---|
| Run | CTA 1 (mmol) | Ethylene (g) | Propylene (g) | Temp. (° C.) | Time (min) | Temp. (° C.) | Time (min) | Yield (g) | Efficiency (g-Pol/g-M) | Mn, g/mol | Mw, g/mol | Mw/Mn |
| BRA | 0 | 22 | 61 | 120 | 10 | 200 | 20 | 35.2 | 9,860 | 43,003 | 727,981 | 5.1 |
| BR1 | 0.66 | 20 | 62 | 120 | 10 | 200 | 20 | 54.7 | 15,323 | 29,864 | 109,316 | 3.7 |
| BR2 | 1.33 | 19 | 62 | 120 | 10 | 200 | 20 | 60.5 | 16,948 | 19,729 | 61,983 | 3.1 |
| BR3 | 2 | 19 | 61 | 120 | 10 | 200 | 20 | 32.6 | 9,132 | 14,129 | 44,304 | 3.1 |
| BR4 | 2.66 | 18 | 62 | 120 | 10 | 200 | 20 | 27.8 | 7,788 | 8,840 | 35,203 | 4.0 |

| | | Run | | | | | | | |
|---|---|---|---|---|---|---|---|---|---|
| | | BR5 | BR6 | BR7 | BR8 | BR9 | BR10 | BR11 | BRB | BR12 |
| Catalyst | | Cat 1 | Cat 17 | Cat 1 | Cat 17 | Cat 1 | Cat 1 | Cat 17 | Cat A* | Cat A* |
| Catylst (mmol) | | 0.03 | 0.003 | 0.0065 | 0.031 | 0.035 | 0.0175 | 0.015 | 0.0006 | 0.0019 |
| CTA | | CTA 1 | CTA 1 | CTA 1 | CTA 1 | CTA 1 | CTA 1 | CTA 1 | — | CTA1 |
| CTA (mmol) | | 10 | 0.68 | 10 | 6.3 | 10 | 10 | 0.68 | 0 | 6.3 |
| Ethylene (g) | | 0 | 5.4 | 5.1 | 4 | 2.3 | 5.7 | 1.9 | 30.6 | 29 |
| Propylene (g) | | 100 | 202 | 301 | 150 | — | — | — | 102 | 101 |
| Octene (g) | | — | — | — | — | 30 | 21 | 30 | — | — |
| ENB (mL) | | — | — | — | — | — | — | — | 4.4 | 4.4 |
| Step 1 | Temp. (° C.) | 120 | 130 | 120 | 120 | 120 | 120 | 120 | 120 | 120 |
| Step 1 | Time (min) | 10 | 10 | 10 | 10 | 10 | 10 | 10 | 10 | 10 |
| Step 2 | Temp. (° C.) | 200 | 200 | 200 | 200 | 200 | 200 | 200 | — | 200 |

-continued

| | | Run | | | | | | | | |
|---|---|---|---|---|---|---|---|---|---|---|
| | | BR5 | BR6 | BR7 | BR8 | BR9 | BR10 | BR11 | BRB | BR12 |
| Step 2 | Time (min) | 20 | 20 | 20 | 20 | 20 | 20 | 20 | — | 20 |
| Yield (g) | | 10.6 | 34.3 | 69.5 | 36.5 | 36.7 | 53.4 | 50.6 | 11.2 | 31.4 |
| Efficiency (g-Pol/g-M) | | 1,985 | 642,322 | 60,069 | 6,615 | 5,891 | 17,143 | 18,951 | 205,128 | 181,608 |

*Cat A = Zirconium,[2,2'''-[1,3-propanediylbis(oxy-κO)bis[3'',5,5''-tris(1,1-dimethylethyl)-5'-methyl[1,1':3',1''-terphenyl]-2'-olato-κO]]dimethyl-, (OC-6-33)-

| | | Run | | | | | | | | |
|---|---|---|---|---|---|---|---|---|---|---|
| | | BR5 | BR6 | BR7 | BR8 | BR9 | BR10 | BR11 | BRB | BR12 |
| Mn (g/mol) | | 2,759 | 193,481 | 7,495 | 136,766 | 1,134 | 1,613 | 52,297 | 48,589 | 63,408 |
| Mw (g/mol) | | 6,714 | 524,693 | 26,840 | 282,774 | 2,270 | 5,474 | 159,337 | 95,524 | 147,907 |
| Mw/Mn | | 2.43 | 2.71 | 3.58 | 2.07 | 2.00 | 3.39 | 3.05 | 1.97 | 2.33 |
| 13C NMR | C2 mol % | — | 26.3 | 35.8 | 30.9 | 73.3 | 90.5 | 83.3 | 82.9 | 81.7 |
| 13C NMR | C3 mol % | 100.0 | 73.7 | 64.2 | 69.1 | — | — | — | 16.4 | 17.4 |
| 13C NMR | C8 mol % | — | — | — | — | 26.7 | 9.5 | 16.7 | — | — |
| 13C NMR | ENB mol % | — | — | — | — | — | — | — | 0.7 | 0.9 |
| 1H NMR | #Vinyls/1000000 C | 28 | 40 | 551 | 62 | 5190 | 4806 | 139 | 35 | 152 |
| 1H NMR | #Vinylidenes/1000000 C | 2695 | 33 | 937 | 52 | 1971 | 800 | 23 | 31 | 66 |
| 1H NMR | #Vinylenes/1000000 C | 215 | 20 | 6 | 0 | 423 | 169 | 47 | 21 | 93 |
| 1H NMR | #Cyclohexenes/1000000 C | 1853 | 10 | 1093 | 98 | 6767 | 5313 | 168 | — | 200 |
| 1H NMR | #Trisubstituted alkenes/1000000 C (including ENB) | 0 | 3 | 0 | 0 | 47 | 32 | 4 | 4578 | 4119 |
| 1H NMR | #Unsaturations/1000 C | 4.791 | 0.106 | 2.587 | 0.212 | 14.398 | 11.120 | 0.381 | 4.665 | 4.630 |
| Calculation | Unsats/chain | 1.42 | 2.00 | 1.83 | 2.79 | 2.10 | 1.65 | 2.14 | 17.92 0.33** | 23.41 1.57** |

**Excluding ENB

Set 2

With reference to Table 2, Set 2 includes inventive telechelic polymers made in runs B1-B7 via a similar procedure as Set 1. Run B1 used the scavenger MMAO-3A with a (Cat 1):Cocat A:scavenger ratio of 1:1.2:10. Runs B2 to B7 used a procatalyst to cocatalyst ratio of 1:1.2. All runs in Table 2 were carried out without hydrogen. All runs had the following conditions: Ethylene (g): 20, 1-octene (g): 60, pressure (psi): 55, solvent (Isopar E, g): 1325. CTA 5 loading was based on the number of transferrable groups. Runs B1, B2, B4 and B6 were at 120° C. for 10 min. Runs B3, B5 and B7 included an additional heating step at 200° C. for 20 min (excluding the transition time from 120 to 200° C.).

TABLE 2

| Run | Cat 1 | CTA 5 | Polymer (g) | Temp. (° C.) | Mn, g/mol | Mw, g/mol | Mw/Mn |
|---|---|---|---|---|---|---|---|
| B1 | 4.5 | — | 43.0 | 120 | 72,542 | 739,532 | 10.2 |
| B2 | 2.8 | 2 | 52.0 | 120 | 49,377 | 208,606 | 4.2 |
| B3 | 1.5 | 2 | 37.6 | 120 + 200 | 37,531 | 169,615 | 4.5 |
| B4 | 2.5 | 4 | 86.0 | 120 | 26,232 | 75,541 | 2.9 |
| B5 | 1.5 | 4 | 76.0 | 120 + 200 | 22,630 | 78,956 | 3.5 |
| B6 | 2.0 | 8 | 87.3 | 120 | 15,875 | 35,117 | 2.2 |
| B7 | 1.0 | 8 | 119.0 | 120 + 200 | 12,239 | 31,477 | 2.6 |

Set 3

Set 3 includes the following examples to synthesize inventive telechelic polyethylene polymers.

Figure 3:
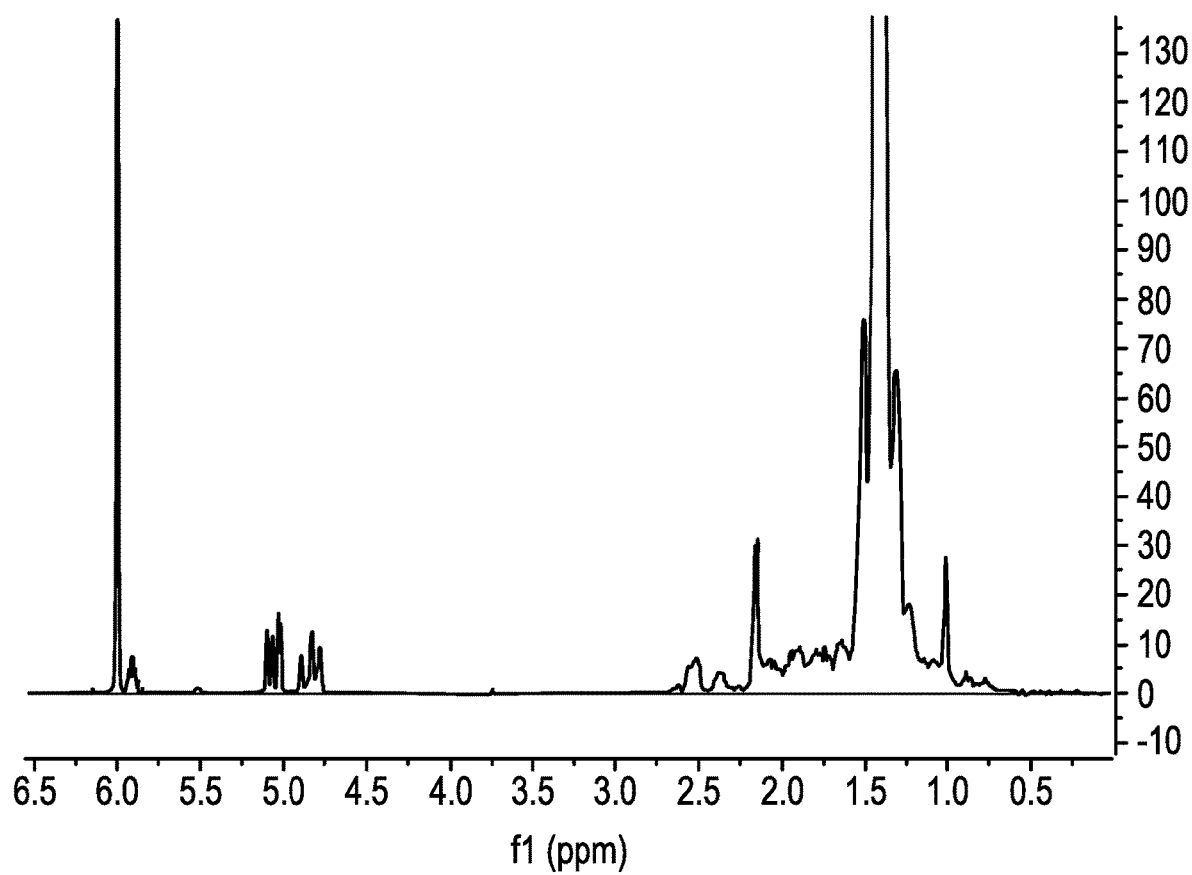
FIG. 3 provides the 1H NMR spectrum for the synthesis of a telechelic polyolefin using CTA 7.

In a nitrogen-filled drybox, a vial equipped with a stir-bar is charged with octene (10 mL), Cocat A (0.023 mL of 0.075 M solution, 0.0017 mmol) and CTA 7 (0.402 mL of 0.5 M solution, 0.2 mmol). The vial is sealed with a septum cap and placed in a heating block set to 100° C. An ethylene line (from a small cylinder) is connected and the vial headspace is slowly purged via a needle. Cat 13 (0.067 mL of 0.02 M solution, 0.0013 mmol) was injected, and the purge needle is removed to maintain a total pressure at 20 psig. The polymerization was maintained for 20 min, then the ethylene line was removed and the polymer solution was cooled down. This polymer solution was transferred to a 600 mL Parr reactor and sealed. The reactor was heated to 200 degree C. under 200 psig of ethylene pressure for 30 min. Polymer was quenched by large amount of methanol, filtrated and dried under vacuum overnight. 1H NMR (FIG. 3) confirmed the synthesis occurred via the non-limiting reaction scheme shown below.

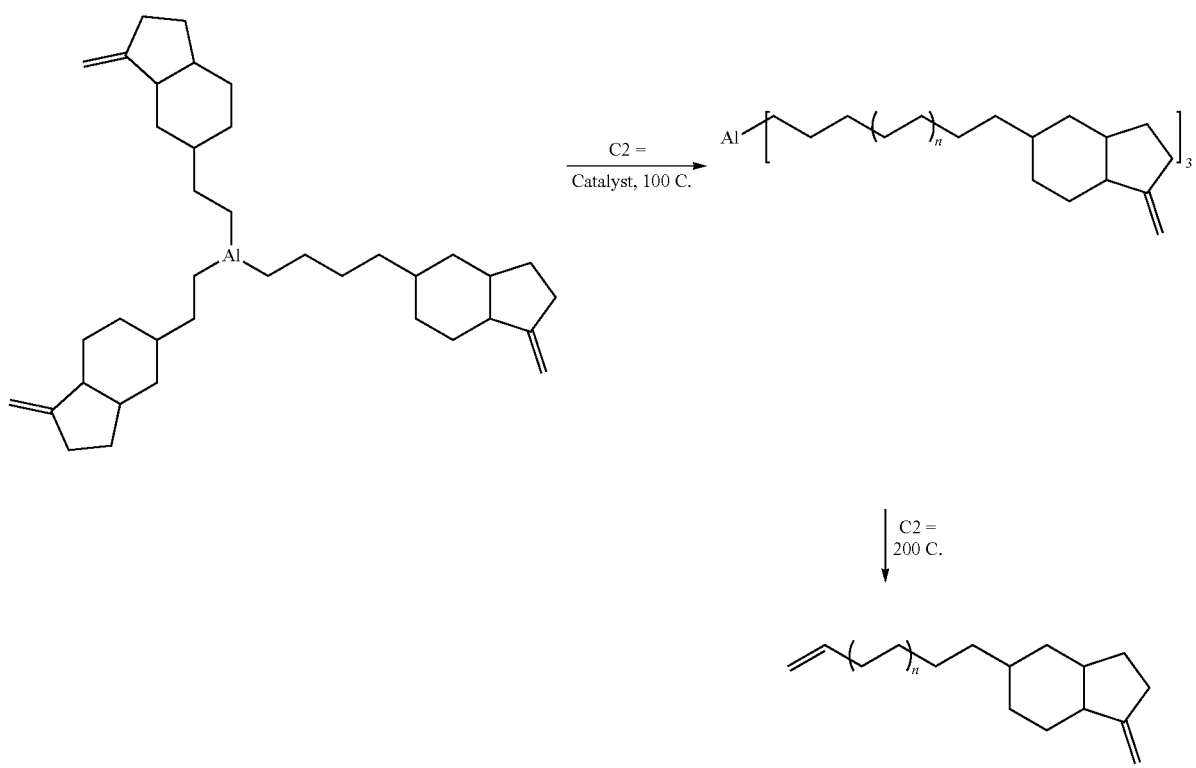

Figure 4:
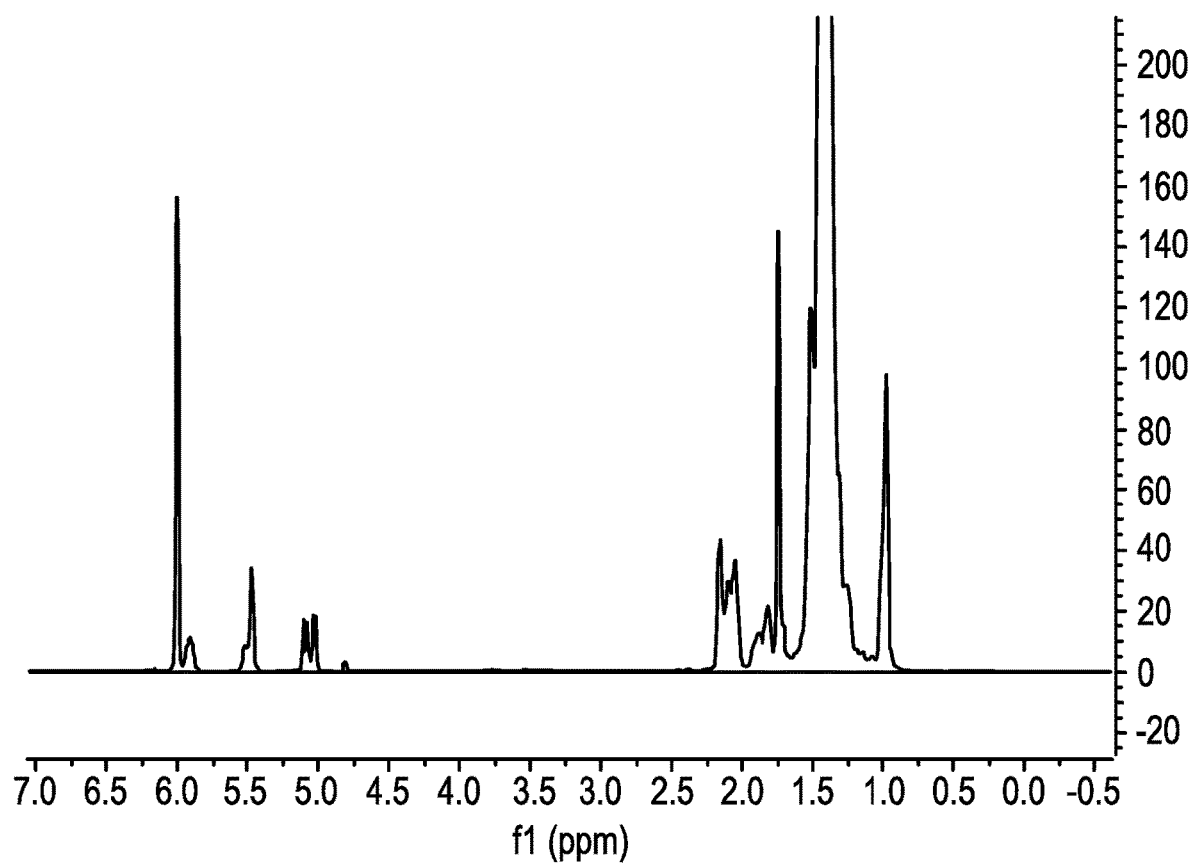
FIG. 4 provides the 1H NMR spectrum for the synthesis of a telechelic polyolefin using CTA 8.

In a nitrogen-filled drybox, a vial equipped with a stir-bar is charged with octene (10 mL), Cocat A (0.023 mL of 0.075 M solution, 0.0017 mmol) and CTA 8 (0.088 g, 0.2 mmol). The vial is sealed with a septum cap and placed in a heating block set to 100° C. An ethylene line (from a small cylinder) is connected and the vial headspace is slowly purged via a needle. Cat 13 (0.067 mL of 0.02 M solution, 0.0013 mmol) was injected, and the purge needle is removed to maintain a total pressure at 20 psig. The polymerization was maintained for 20 min, then the ethylene line was removed and the polymer solution was cooled down. This polymer solution was transferred to a 600 mL Parr reactor and sealed. The reactor was heated to 200 degree C. under 200 psig of ethylene pressure for 30 min. Polymer was quenched by large amount of methanol, filtrated and dried under vacuum overnight. 1H NMR (FIG. 4) analysis confirmed the synthesis occurred via the non-limiting reaction scheme below.

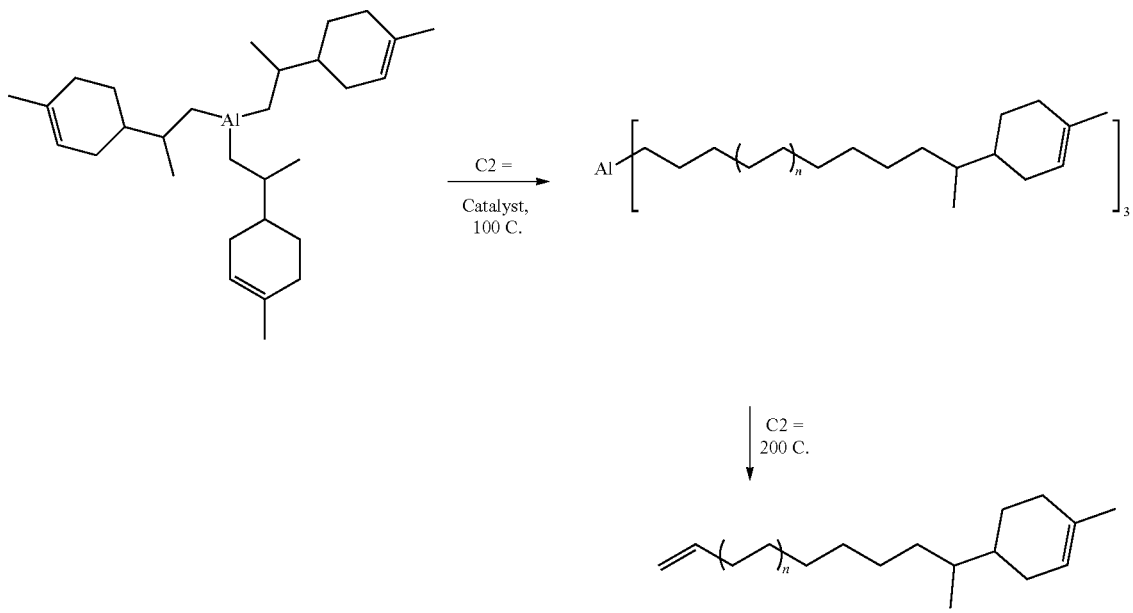

Continuous Solution Polymerization

Non-limiting examples of the telechelic polyolefin of the formula $A^1L^1L^2A^2$ and the unsaturated polyolefin of the formula $A^1L^1$ were made via continuous solution polymerization as follows.

Continuous solution polymerizations are carried out in a computer controlled autoclave reactor equipped with an internal stirrer. Purified mixed alkanes solvent (Isopar™ E available from ExxonMobil), monomers, and molecular weight regulator (hydrogen or chain transfer agent) are supplied to a 3.8 L reactor equipped with a jacket for temperature control. The solvent feed to the reactor is measured by a mass-flow controller. A variable speed diaphragm pump controls the solvent flow rate and pressure to the reactor. At the discharge of the pump, a side stream is taken to provide flush flows for the procatalyst, activator, and chain transfer agent (catalyst component solutions) injection lines. These flows are measured by Micro-Motion mass flow meters and controlled by control valves. The remaining solvent is combined with monomers and hydrogen and fed to the reactor. The temperature of the solvent/monomer solution is controlled by use of a heat exchanger before entering the reactor. This stream enters the bottom of the reactor. The catalyst component solutions are metered using pumps and mass flow meters and are combined with the catalyst flush solvent and introduced into the bottom of the reactor. The reactor is liquid full at 500 psig with vigorous stirring. Polymer is removed through exit lines at the top of the reactor. All exit lines from the reactor are steam traced and insulated. The product stream is then heated at 230° C. by passing through a post reactor heater (PRH) where beta-H elimination of polymeryl-Al takes place. A small amount of isopropyl alcohol is added along with any stabilizers or other additives either before the PRH (for the comparative examples) or after the PRH (for the inventive examples) before devolatilization. The polymer product is recovered by extrusion using a devolatilizing extruder.

The polymerization process conditions and results prior to post reactor heating (PRH) for the inventive and comparative examples are listed in Tables A1 to B2. Inventive unsaturated polyolefins of the formula $A^1L1$ are named as Inv. MP1 to MP4. Inventive telechelic polyolefins of the formula $A^1L^1L^2A^2$ are named as Inv. TP1 to TP10. Comparative polymers are named as Comp. A and B. Additional abbreviations in the tables are explained as follows: "Co." stands for comonomer; "sccm" stands for standard cm³/min; "T" refers to temperature; "Cat" stands for Procatalyst; "Cat 1" stands for Procatalyst (Cat 1); "Cat 17" stands for Procatalyst (Cat 17), "Cocat" stands for Cocat A; "Al CTA" stands for aluminum chain transfer agent"; "TEA" stands for triethylaluminum; "TOA" stands for trioctylaluminum, "Poly Rate" stands for polymer production rate; "Conv" stands for percent ethylene conversion in reactor; and "Eff." stands for efficiency, kg polymer/g catalyst metal.

In addition, $[CTA]/[C_2H_4]$ refers to the molar ratio in reactor; Al/$C_2$*1000=(Al feed flow*Al concentration/1000000/Mw of Al)/(Total Ethylene feed flow*(1-fractional ethylene conversion rate)/Mw of Ethylene)*1000. "Al" in "Al/$C_2$*1000" refers to the amount of Al in the CTA used in the polymerization process, and "C2" refers to the amount of ethylene used in the polymerization process.

The properties of the inventive and comparative polymers following post reactor heating and recovery are provided in Tables C1-E2.

TABLE A1

| Ex. | C2 lbs/hr | Co. Type | Co. lbs/hr | Solv. lbs/hr | H₂ sccm | T ° C. | Cat. 1 ppm Hf | Cat. 1 Flow lbs/hr |
|---|---|---|---|---|---|---|---|---|
| Comp. A | 1.375 | Propylene | 2.111 | 14.17 | 0 | 115 | 65.8 | 0.220 |
| Inv. MP1 | 1.556 | Propylene | 1.641 | 13.93 | 0 | 115 | 65.8 | 0.225 |
| Comp. B | 1.520 | Octene | 1.362 | 14.98 | 352.7 | 115 | 65.8 | 0.286 |
| Inv. MP2 | 1.521 | Octene | 1.520 | 15.01 | 0 | 115 | 65.8 | 0.170 |
| Inv. MP3 | 3.33 | Octene | 3.60 | 29.26 | 0 | 115 | 125.5 | 0.212 |
| Inv. MP4 | 2.78 | Octene | 2.41 | 30.44 | 0 | 115 | 63.2 | 0.385 |

TABLE A2

| Ex. | CTA | CTA Conc. ppm Al | CTA Flow lbs/hr | Cocat A ppm | Cocat A Flow lbs/hr | $[C_2H_4]$/[CTA] | Poly Rate lbs/hr | Conv % | Solids % | Eff. |
|---|---|---|---|---|---|---|---|---|---|---|
| Comp. A | TEA | 10000 | 0.928 | 922 | 0.126 | 51.1 | 2.2 | 86.3 | 14.3 | 0.154 |
| Inv. MP1 | TEA | 10000 | 1.14 | 922 | 0.129 | 143.5 | 2.2 | 94.7 | 14.1 | 0.148 |
| Comp. B | TEA | 29.8 | 0.17 | 922 | 0.164 | 0.0 | 2.1 | 90.9 | 12.6 | 0.11 |
| Inv. MP2 | TEA | 10000 | 0.43 | 922 | 0.098 | 17.3 | 1.82 | 83 | 13 | 0.194 |
| Inv. MP3 | TEA | 9827 | 0.744 | 925 | 0.232 | 20.7 | 4.47 | 89.0 | 13.7 | 0.168 |
| Inv. MP4 | TEA | 1920 | 0.723 | 894 | 0.219 | 21.6 | 3.72 | 97.6 | 8.4 | 0.114 |

TABLE B1

| Ex. | C2 Lbs/hr | Co. Type | Co. lbs/hr | Solv. lbs/hr | H₂ sccm | T °C. | Cat | Cat. Conc. ppm Hf | Cat. Flow lbs/hr |
|---|---|---|---|---|---|---|---|---|---|
| Comp. A | 1.375 | Propylene | 2.111 | 14.17 | 0 | 115 | Cat 1 | 65.8 | 0.22 |
| Inv. TP1 | 1.555 | Propylene | 1.633 | 13.95 | 0 | 115 | Cat 1 | 65.8 | 0.334 |
| Inv. TP2 | 1.52 | Propylene | 1.768 | 14.1 | 0 | 115 | Cat 1 | 65.8 | 0.326 |
| Comp. B | 1.52 | Octene | 1.362 | 14.98 | 352.7 | 115 | Cat 1 | 65.8 | 0.286 |
| Inv. TP3 | 1.519 | Octene | 1.415 | 14.93 | 0 | 115 | Cat 1 | 65.8 | 0.204 |
| Inv. TP4 | 1.506 | Octene | 1.657 | 19.44 | 0 | 115 | Cat 1 | 65.8 | 0.18 |
| Inv. TP5 | 2.78 | Octene | 2.62 | 25.5 | 0 | 115 | Cat 1 | 63.2 | 0.475 |
| Inv. TP6 | 4.76 | Octene | 5.46 | 41.78 | 0 | 118 | Cat 1 | 125.5 | 0.328 |
| Inv. TP7 | 2.56 | Octene | 3.39 | 17.40 | 0 | 115 | Cat 1 | 125.5 | 0.199 |
| Inv. TP8 | 3.84 | Octene | 1.07 | 42.19 | 0 | 125 | Cat 14 | 54.2 | 0.149 |
| Inv. TP9 | 2.78 | Octene | 2.67 | 29.52 | 0 | 115 | Cat 1 | 63.2 | 0.372 |
| Inv. TP10 | 5.55 | Octene | 4.45 | 59.08 | 0 | 119 | Cat 1 | 63.2 | 1.002 |

TABLE B2

| Ex. | CTA | CTA Conc. ppm Al | CTA Flow lbs/hr | Cocat A ppm | Cocat A Flow lbs/hr | [C₂H₄]/[CTA] | Poly Rate lbs/hr | Conv % | Solids % | Eff. |
|---|---|---|---|---|---|---|---|---|---|---|
| Comp. A | TEA | 10000 | 0.928 | 922 | 0.126 | 51.1 | 2.2 | 86.3 | 14.3 | 0.154 |
| Inv. TP1 | CTA 1 | 69198 | 0.797 | 922 | 0.192 | 681.6 | 2.0 | 94.6 | 13 | 0.092 |
| Inv. TP2 | CTA 1 | 69198 | 0.78 | 922 | 0.187 | 594.4 | 2.7 | 93.8 | 17.1 | 0.125 |
| Comp. B | TEA | 29.8 | 0.17 | 922 | 0.164 | 0 | 2.1 | 90.9 | 12.6 | 0.11 |
| Inv. TP3 | CTA 1 | 69198 | 0.179 | 922 | 0.118 | 130.2 | 2.2 | 93.5 | 13.1 | 0.161 |
| Inv. TP4 | CTA 1 | 69198 | 0.077 | 922 | 0.103 | 33.1 | 2.0 | 88.9 | 9.7 | 0.174 |
| Inv. TP5 | CTA 2 | 2503 | 0.748 | 894 | 0.27 | 11.6 | 2.7 | 94.0 | 8.4 | 0.091 |
| Inv. TP6 | CTA 1 | 9432 | 0.420 | 925 | 0.359 | 7.8 | 6.4 | 88.9 | 13.8 | 0.157 |
| Inv. TP7 | CTA 1 | 18302 | 0.370 | 925 | 0.218 | 76.3 | 3.8 | 96.4 | 19.0 | 0.151 |
| Inv. TP8 | CTA 1 | 1478 | 0.210 | 495 | 0.31 | 0.8 | 3.5 | 89.8 | 7.5 | 0.431 |
| Inv. TP9 | CTA 1 | 3994 | 0.241 | 894 | 0.212 | 10.0 | 2.7 | 96.4 | 8.3 | 0.114 |
| Inv. TP10 | CTA 1 | 3994 | 0.467 | 894 | 0.570 | 11.6 | 5.5 | 97.0 | 8.6 | 0.087 |

TABLE C1

| Method | Property | Units | Comp. A | Inv. MP1 | Comp. B | Inv. MP2 | Inv. MP3 | Inv. MP4 |
|---|---|---|---|---|---|---|---|---|
| 13C NMR | % C2 | mol % | 70.1 | 76 | 89.4 | 88.7 | 89.1 | 88.3 |
| 13C NMR | % C3 | mol % | 29.9 | 24 | — | — | — | — |
| 13C NMR | % C8 | mol % | — | — | 10.6 | 11.3 | 10.9 | 11.7 |
| 1H NMR | Vinyls | #/1000000C | 27 | 1076 | 14 | 441 | 295 | 291 |
| 1H NMR | Vinylidenes | #/1000000C | 185 | 686 | 27 | 117 | 66 | 122 |
| 1H NMR | Vinylenes | #/1000000C | 4 | 36 | 14 | 20 | 12 | 19 |
| 1H NMR | Cyclohexenes | #/1000000C | 0 | 0 | 0 | 0 | 0 | 0 |
| 1H NMR | Trisubstituted alkenes | #/1000000C | 4 | 31 | 7 | 15 | 6 | 10 |
| 13C NMR | Saturated CH3 | #/1000000C | 2050 | 1810 | — | — | — | — |
| NMR | Unsaturations | #/1000C | 0.22 | 1.8 | 0.06 | 0.58 | 0.379 | 0.442 |
| Calculation | Unsats/chain | #/chain | 0.17 | 1.06 | 0.11 | 1.30 | 0.68 | 1.39 |
| Density | | g/cc | — | — | 0.873 | 0.872 | 0.873 | 0.8715 |
| Melt Index | I2 at 190° C. | dg/min | — | — | 18.3 | 17.6 | 30.8 | 5.1 |
| Melt Index | I10/I2 at 190° C. | | — | — | 6.6 | 7.1 | 6.9 | 6.8 |
| Brookfield | Viscosity @ 177° C. | cP | 11,687 | 6,952 | — | — | — | — |

TABLE C2

| Method | Property | Units | Comp. A | Inv. MP1 | Comp. B | Inv. MP2 | Inv. MP3 | Inv. MP4 |
|---|---|---|---|---|---|---|---|---|
| Conv. GPC | Mn | g/mol | 9,244 | 7,239 | 19,618 | 22,862 | 18,823 | 32,689 |
| Conv. GPC | Mw | g/mol | 20,993 | 16,847 | 52,931 | 56,983 | 50,945 | 79,030 |
| Conv. GPC | Mz | g/mol | 44,770 | 34,657 | 92,282 | 122,456 | 129,351 | 157,436 |
| Conv. GPC | Mw/Mn | | 2.27 | 2.33 | 2.7 | 2.49 | 2.71 | 2.42 |

TABLE C2-continued

| Method | Property | Units | Comp. A | Inv. MP1 | Comp. B | Inv. MP2 | Inv. MP3 | Inv. MP4 |
|---|---|---|---|---|---|---|---|---|
| DMS | Viscosity at 0.1 rad/s (190° C.) | Pa-s | — | — | 348 | 479 | — | 1513 |
| DMS | Viscosity at 100 rad/s (190° C.) | Pa-s | — | — | 279 | 303 | — | 725 |
| DMS | RR (V0.1/V100) | | — | — | 1.25 | 1.58 | — | 2.09 |
| DMS | Tan Delta at 0.1 rad/s (190° C.) | | — | — | 331 | 66.9 | — | 53.1 |
| DMS | Tan Delta at 100 rad/s (190° C.) | | — | — | 3.13 | 2.62 | — | 1.68 |
| DMC | Tm | ° C. | −6.3 | 13.8 | 62.1 | 56.3 | 58.9 | 55.8 |
| DMC | Tc | ° C. | −27.8 | −3.5 | 48.6 | 61.2 | 68.3 | 61.7 |
| DMC | Heat of Fusion | J/g | 30.9 | 44.2 | 70.8 | 65 | 65.6 | 60.8 |
| DMC | Wt % Crystallinity | % | 10.6 | 15.1 | 24.3 | 22.3 | 22.5 | 20.8 |

TABLE D1

| Method | Property | Units | Comp. A | Inv. TP1 | Inv. TP2 | Comp. B | Inv. TP3 | Inv. TP4 |
|---|---|---|---|---|---|---|---|---|
| 13C NMR | % C2 | mol % | 70.1 | 77.4 | 75.6 | 89.4 | 89 | 88.9 |
| 13C NMR | % C3 | mol % | 29.9 | 22.6 | 24.4 | — | — | — |
| 13C NMR | % C8 | mol % | — | — | — | 10.6 | 11 | 11.1 |
| 13C NMR | % ENB | Mol % | — | — | — | — | — | — |
| 1H NMR | Vinyls | #/1000000C | 27 | 1262 | 1222 | 14 | 444 | 207 |
| 1H NMR | Vinylidenes | #/1000000C | 185 | 677 | 722 | 27 | 101 | 86 |
| 1H NMR | Vinylenes | #/1000000C | 4 | 62 | 63 | 14 | 28 | 23 |
| 1H NMR | Cyclohexenes | #/1000000C | 0 | 1720 | 1680 | 0 | 450 | 215 |
| 1H NMR | Trisubstituted alkenes | #/1000000C | 4 | 37 | 34 | 7 | 8 | 7 |
| 13C NMR | Saturated CH3 | #/1000000C | 2050 | 640 | 440 | — | — | — |
| NMR | Unsaturations | #/1000C | 0.22 | 3.72 | 3.69 | 0.06 | 1.02 | 0.53 |
| Calculation | Unsats/chain | #/chain | 0.17 | 2.07 | 2.13 | 0.11 | 2.22 | 2.24 |
| Density | | g/cc | — | — | — | 0.873 | 0.873 | 0.87 |
| Melt Index | I2 at 190° C. | dg/min | — | — | — | 18.3 | 16.8 | 0.9 |
| Melt Index | I10/I2 at 190° C. | | — | — | — | 6.6 | 7 | 7.2 |
| Brookfield | Viscosity @ 177° C. | cP | 11,687 | 6,108 | 8,178 | — | — | — |

TABLE D2

| Method | Property | Units | Inv. TP5 | Inv. TP6 | Inv. TP7 | Inv. TP8 | Inv. TP9 | Inv. TP10 |
|---|---|---|---|---|---|---|---|---|
| 13C NMR | % C2 | mol % | 87.9 | 88.9 | 87.9 | 98.2 | 88.6 | 88.6 |
| 13C NMR | % C3 | mol % | — | — | — | — | — | — |
| 13C NMR | % C8 | mol % | 12.1 | 11.2 | 12.1 | 1.8 | 11.4 | 11.5 |
| 13C NMR | % ENB | Mol % | — | — | — | — | — | — |
| 1H NMR | Vinyls | #/1000000C | 285 | 471 | 1239 | 283 | 307 | 288 |
| 1H NMR | Vinylidenes | #/1000000C | 97 | 101 | 465 | 21 | 105 | 107 |
| 1H NMR | Vinylenes | #/1000000C | 73 | 23 | 193 | 12 | 24 | 24 |
| 1H NMR | Cyclohexenes | #/1000000C | — | 474 | 1473 | 278 | 302 | 318 |
| 1H NMR | Trisubstituted alkenes | #/1000000C | 242 | 9 | 110 | 0 | 10 | 7 |
| 13C NMR | Saturated CH3 | #/1000000C | — | — | — | — | — | — |
| NMR | Unsaturations | #/1000C | 0.7 | 1.078 | 3.480 | 0.594 | 0.748 | 0.744 |
| Calculation | Unsats/chain | #/chain | 2.2 | 1.97 | 2.34 | 1.71 | 2.36 | 2.42 |
| Density | | g/cc | 0.869 | 0.873 | 0.869 | 0.922 | 0.872 | 0.872 |
| Melt Index | I2 at 190° C. | dg/min | 5.4 | 27.3 | — | 1.9 | 4.7 | 5.3 |
| Melt Index | I10/I2 at 190° C. | | 6.7 | 6.7 | — | 7.4 | 6.8 | 6.7 |
| Brookfield | Viscosity @ 177° C. | cP | — | — | 7906 | — | — | — |

TABLE E1

Polmer Properties

| Method | Property | Units | Comp. A | Inv. TP1 | Inv. TP2 | Comp. B | Inv. TP3 | Inv. TP4 |
|---|---|---|---|---|---|---|---|---|
| Conv. GPC | Mn | g/mol | 9,244 | 6,925 | 7,149 | 19,618 | 22,713 | 43,792 |
| Conv. GPC | Mw | g/mol | 20,993 | 16,138 | 16,622 | 52,931 | 56,021 | 123,693 |
| Conv. GPC | Mz | g/mol | 44,770 | 39,246 | 47,921 | 92,282 | 129,181 | 283,832 |
| Conv. GPC | Mw/Mn |  | 2.27 | 2.33 | 2.33 | 2.7 | 2.47 | 2.83 |
| DMS | Viscosity at 0.1 rad/s (190° C.) | Pa-s | — | — | — | 348 | 490 | 9,312 |
| DMS | Viscosity at 100 rad/s (190° C.) | Pa-s | — | — | — | 279 | 302 | 1,903 |
| DMS | RR (V0.1/V100) |  | — | — | — | 1.25 | 1.63 | 4.89 |
| DMS | Tan Delta at 0.1 rad/s (190° C.) |  | — | — | — | 331 | 52.9 | 10.1 |
| DMS | Tan Delta at 100 rad/s (190° C.) |  | — | — | — | 3.13 | 2.65 | 0.934 |
| DSC | Tm | ° C. | −6.3 | 17 | 10.1 | 62.1 | 58.4 | 53.3 |
| DSC | Tc | ° C. | −27.8 | −0.1 | −7 | 48.6 | 64.4 | 58.9 |
| DSC | Heat of Fusion | J/g | 30.9 | 51.9 | 39.6 | 70.8 | 69.6 | 60.2 |
| DSC | Wt % Crystallinity | % | 10.6 | 17.8 | 13.6 | 24.3 | 23.8 | 20.6 |

TABLE E2

| Method | Property | Units | Inv. TP5 | Inv. TP6 | Inv. IF7 | Inv. IF8 | Inv. IF9 | Inv. IP10 |
|---|---|---|---|---|---|---|---|---|
| Conv. GPC | Mn | g/mol | 32,443 | 19,168 | 6,904 | 38,313 | 32,968 | 33,937 |
| Conv. GPC | Mw | g/mol | 79,907 | 49,328 | 15,631 | 99,196 | 82,260 | 78,203 |
| Conv. GPC | Mz | g/moll | 64,709 | 113,520 | 33,550 | 325,630 | 175,471 | 153,716 |
| Conv. GPC | Mw/Mn |  | 2.46 | 2.57 | 2.26 | 2.59 | 2.50 | 2.30 |
| DMS | Viscosity at 0.1 rad/s (190° C.) | Pa-s | 1479 | — | — | — | 1735 | — |
| DMS | Viscosity at 100 rad/s (190° C.) | Pa-s | 703 | — | — | — | 784 | — |
| DMS | RR (V0.1/V100) |  | 2.1 | — | — | — | 2.21 | — |
| DMS | Tan Delta at 0.1 rad/s (190° C.) |  | 54.3 | — | — | — | 42.8 | — |
| DMS | Tan Delta at 100 rad/s (190° C.) |  | 1.66 | — | — | — | 1.61 | — |
| DSC | Tm | ° C. | 50 | 56.5 | 51.8 | 114.5 | 54.6 | 55.5 |
| DSC | Tc | ° C. | 54.2 | 67.3 | 34.9 | 103.7 | 58.7 | 54.1 |
| DSC | Heat of Fusion | J/g | 55.2 | 69.3 | 55.7 | 130.4 | 58.6 | 59.1 |
| DSC | Wt % Crystallinity | % | 18.9 | 23.7 | 19.1 | 44.7 | 20.1 | 20.2 |

As seen in the above tables, $^1$H NMR and $^{13}$C NMR analyses confirm the synthesis of new telechelic polyolefins TP1 to TP10 via the inventive process of the present disclosure. Specifically, as one of ordinary skill in the art would understand, $^1$H NMR and $^{13}$C NMR analyses confirm formation of new telechelic polyolefins for TP1 to TP10, where such polyolefins have unsaturations at both ends. Specifically, such polyolefins have $A^1$ groups (vinyls, vinylenes, vinylidenes) on one end with $A^2$ groups having hindered double bonds (cyclohexenes or trisubstituted alkenes) on the other end. In contrast, comparative polymers A and B, which were not prepared according to the inventive process of the present disclosure, are polymers with low unsaturation as seen via $^1$H NMR and $^{13}$C NMR analyses.

In Inv. TP5, the hindered double bond of the A2 group is a trisubstituted unsaturation, resulting in a high number of trisubstituted unsaturations/1000000C as reported in the above tables. The number of trisubstituted unsaturations in TP5 is higher than for Comparative B that was produced with the same catalyst under similar reactor conditions, but with hydrogen to control molecular weight. A small number of trisubstituted unsaturations can be formed via beta-hydride elimination and subsequent rearrangement of the unsaturation in an ethylene/alpha-olefin. The number of trisubstituted unsaturations formed by this thermal termination mechanism is dependent on the catalyst and process conditions used. A small number of trisubstituted unsaturations from this thermal termination mechanism is present in all of the comparative and inventive examples, but at a lower level than the vinyls and vinylidenes, with the exception of TP5 where the majority of the trisubstituted unsaturations are from the A2 group.

As described above, the novel telechelic polyolefins of the present disclosure contain unsaturations at the termini of the chains rather than randomly distributed along the polymer backbone. Such telechelic polyolefins may be suitable for curable formulations and may improve crosslinking. By controlling the location of the unsaturations to the polymer chain ends, a more controlled network structure is formed (uniform Mw between crosslinks) and more efficient use is made of the unsaturations on the polymer chain. This should provide better thermal and UV aging stability as less unsaturations are needed to form a cross-linked network with good mechanical properties for a given molecular weight. A low viscosity of a low Mw telechelic polyolefin of the present disclosure would provide excellent processability and flow prior to crosslinking, unlike high Mw EPDM.

In addition, the telechelic polyolefins of the present disclosure are produced in a low cost solution polymerization from ethylene and alpha-olefins that is unique from telechelic polyolefins that have been produced in the literature via much more expensive and complicated synthetic routes. Further, the telechelic polyolefins also enable the opportunity for controlled chain extension to a higher molecular weight thermoplastic unlike random copolymers with unsaturations. Because the unsaturations are located at the chain ends, the telechelic polyolefins can be chain extended to form a high molecular weight thermoplastic resin. Suitable crosslinking and chain extension chemistry includes, but is not limited to peroxide, thiolene, sulfur cure, phenolic cure, etc.

Curable Compositions for Cable Insulation

The following non-limiting examples demonstrate the inventive curable compositions of the present disclosure, where the inventive curable compositions include the inventive polyolefins TP3, TP9, TP4, or MP4.

The following materials were also used in the following examples:

LDPE: a low density polyethylene having a density of 0.9183 g/cm$^3$ (ASTM D792) and a melt index of 1.9 g/10 min (ASTM D1238, 190° C./2.16 kg) from The Dow Chemical Company.

ENGAGE™ 8100: an ethylene/1-octene copolymer having a density of 0.870 g/cm$^3$ (ASTM D792) and a melt index of 1.0 g/10 min (ASTM D1238, 190° C./2.16 kg) available from The Dow Chemical Company.

ENGAGE™ 8100: an ethylene/1-octene copolymer having a density of 0.870 g/cm$^3$ (ASTM D792) and a melt index of 5.0 g/10 min (ASTM D1238, 190° C./2.16 kg) available from The Dow Chemical Company.

4,6-bis(octylthiomethyl)-o-cresol is a commercially available antioxidant.

AMSD refers to alpha-methyl styrene dimer, a scorch inhibitor.

Dicumyl peroxide (DCP) available from Fangruida.

Monocyclic organosiloxane: 2,4,6,8-tetramethyl-2,4,6,8-tetravinyl-cyclotetrasiloxane, "(D$^{Vi}$)$_4$" (CAS No. 2554-06-5) obtained from The Dow Chemical Company.

Sample Preparation

The final compositions were prepared by pre-heating 150 grams of pellets for each sample in a glass jar (no more than 50% full) at 70° C. for compositions comprising LDPE and at 50° C. for all other compositions for 4 hours. Examples containing two polymer resins were melt blended and pelletized (melt blended using a single screw extruder at 40 rpm and temperature profile of 120/117/115/113° C., then extruded through a strand die, cooled on a belt, and pelletizied-belt speed adjusted to obtain pellets of equivalent size to the as-received LDPE pellets), prior to the soaking with the dicumyl peroxide and other additives. The dicumyl peroxide was preheated separately to 60° C. (above its melting point of 40° C.). Once melted, the liquid dicumyl peroxide and other additives were added to the preheated polymer pellets in the jar using a syringe, and tumble blended for 5 minutes at room temperature. The jars were then placed back in the oven until liquid was absorbed.

The compositions were compression molded into 50 mil thick plaques for hot creep testing. The plaques were compression molded and cured in the press. The samples were pressed under low pressure at 125° C. for 3 min, and then high pressure for 3 minutes. Next, the samples were removed, cut into sections, reloaded, and pressed under low pressure at 125° C. for 3 min, and then the press was raised to 180° C. and high pressure for a cure time of 15 minutes. After 15 minutes the press was cooled to 30° C. at high pressure. Once at 30° C., the press was opened, and the plaque was removed.

Performance and Properties

Tables WC1 to WC5 shown below report the MH and hot creep of the exemplary curable compositions. IE indicates an inventive curable composition. CE indicates a comparative example that represent the state of the art with respect to curable compositions for cable insulation.

TABLE WC1

| Component, wt % | CE-1A | CE-1B | CE-1C | CE-2A | CE-2B | CE-2C | IE-2A | IE-2B | IE-2C |
|---|---|---|---|---|---|---|---|---|---|
| LDPE | 98.65 | 98.25 | 97.85 | | | | | | |
| ENGAGE 8100 | | | | 98.65 | 98.25 | 97.85 | | | |
| TP4 | | | | | | | 98.65 | 98.25 | 97.85 |
| ENGAGE 8200 | | | | | | | | | |
| MP4 | | | | | | | | | |
| TP9 | | | | | | | | | |
| ENGAGE 8411 | | | | | | | | | |
| TP3 | | | | | | | | | |
| 4,6-bis (octylthio-methyl-o-cresol | 0.15 | 0.15 | 0.15 | 0.15 | 0.15 | 0.15 | 0.15 | 0.15 | 0.15 |
| Dicumyl Peroxide | 1.2 | 1.6 | 2.0 | 1.2 | 1.6 | 2.0 | 1.2 | 1.6 | 2.0 |
| Results | | | | | | | | | |
| MH (at 182° C., 12 min) dNm | 2.1 | 3.1 | 4.0 | 4.7 | 5.8 | 7.1 | 9.7 | 11.2 | 12.5 |
| Hot Creep at 200° C., % | 213.7 | 76.3 | 38.8 | 78.2 | 29.0 | 20.4 | 10.4 | 9.2 | 7.7 |
| Hot Creep at 150° C., % | 184.3 | 55.1 | 31.3 | 31.0 | 18.8 | 12.9 | 10.0 | 7.3 | 6.2 |

TABLE WC2

| Component, wt % | CE-3A | CE-3B | CE-3C | IE-3A | IE-3B | IE-3C | IE-3D | IE-3E |
|---|---|---|---|---|---|---|---|---|
| LDPE | | | | | | | | |
| ENGAGE 8100 TP4 | 98.65 | 98.25 | 97.85 | | | | | |
| ENGAGE 8200 MP4 TP9 | | | | 98.65 | 98.25 | 97.85 | | |
| ENGAGE 8411 TP3 | | | | | | | 98.65 | 98.25 |
| 4,6-bis(octyl-thiomethyl-o-cresol | 0.15 | 0.15 | 0.15 | 0.15 | 0.15 | 0.15 | 0.15 | 0.15 |
| Dicumyl Peroxide | 1.2 | 1.6 | 2.0 | 1.2 | 1.6 | 2.0 | 1.2 | 1.6 |
| Results | | | | | | | | |
| MH (at 182° C., 12 min) dNm | 2.7 | 3.8 | 4.9 | 5.9 | 7.4 | 8.5 | 7.8 | 10.2 |
| Hot Creep at 200° C., % | Fail | Fail | 39.3 | 27.1 | 16.3 | 12.5 | 17.3 | 10.4 |
| Hot Creep at 150° C., % | 128.8 | 39.4 | 24.2 | 18.2 | 10.7 | 10.4 | 12.0 | 7.0 |

| Component, wt % | IE-3F | CE-4A | CE-4B | CE-4C | IE-4A | IE-4B | IE-4C |
|---|---|---|---|---|---|---|---|
| LDPE | | | | | | | | 
| ENGAGE 8100 TP4 | | | | | | | |
| ENGAGE 8200 MP4 TP9 | 97.85 | 98.65 | 98.25 | 97.85 | | | |
| ENGAGE 8411 TP3 | | | | | 98.65 | 98.25 | 97.85 |
| 4,6-bis(octyl-thiomethyl-o-cresol | 0.15 | 0.15 | 0.15 | 0.15 | 0.15 | 0.15 | 0.15 |
| Dicumyl Peroxide | 2.0 | 1.2 | 1.6 | 2.0 | 1.2 | 1.6 | 2.0 |
| Results | | | | | | | |
| MH (at 182° C., 12 min) dNm | 11.9 | 1.2 | 1.9 | 2.9 | 5.3 | 8.2 | 10.5 |
| Hot Creep at 200° C., % | 9.5 | Fail | Fail | Fail | 31.0 | 15.7 | 10.0 |
| Hot Creep at 150° C., % | 6.2 | Fail | 205.7 | 66.3 | 23.2 | 10.6 | 7.6 |

TABLE WC3

| Component, wt % | CE-5A | IE-6B | IE-6C | IE-6D | IE-6E |
|---|---|---|---|---|---|
| LDPE | 98.09 | | | | |
| TP4 | | 99.03 | 98.63 | 98.29 | 98.23 |
| MP4 | | | | | |
| TP9 | | | | | |
| 4,6-bis (octylthio-methyl-o-cresol) | 0.15 | 0.15 | 0.15 | 0.15 | 0.15 |
| Dicumyl Peroxide | 0.50 | 0.36 | 0.36 | 0.30 | 0.36 |
| $(D^{ri})_4$ | 1.20 | 0.4 | 0.8 | 1.2 | 1.2 |
| AMSD | 0.06 | 0.06 | 0.06 | 0.06 | 0.06 |
| Results | | | | | |
| MH (at 182° C., 12 min) dNm | 2.0 | 4.0 | 5.0 | 4.7 | 5.4 |
| Hot Creep at 200° C., % | 97.1 | 60.8 | 28.1 | 28.9 | 23.5 |
| Hot Creep at 150° C., % | 93.5 | 52.0 | 25.7 | 17.0 | 21.7 |

TABLE WC4

| Component, wt % | IE-8D | IE-8E | IE-9D | IE-9E |
|---|---|---|---|---|
| LDPE | | | | |
| TP4 | | | | |
| MP4 | 98.63 | 98.23 | | |
| TP9 | | | 98.63 | 98.23 |
| 4,6-bis (octylthio-methyl-o-cresol) | | | | |
| Dicumyl Peroxide | 0.36 | 0.36 | 0.36 | 0.36 |
| $(D^{ri})_4$ | 0.8 | 1.2 | 0.8 | 1.2 |
| AMSD | 0.06 | 0.06 | 0.06 | 0.06 |
| Results | | | | |
| MH (at 182° C., 12 min) dNm | 3.0 | 3.3 | 2.9 | 3.2 |
| Hot Creep at 200° C., % | 108.8 | 65.2 | 117.8 | 75.9 |
| Hot Creep at 150° C., % | 94.8 | 62.0 | 109.1 | 70.0 |

TABLE WC 5

| Component, wt % | CE-6 | IE-11B | IE-11C | IE-11D |
|---|---|---|---|---|
| LDPE | 98.23 | 73.67 | 49.115 | 24.56 |
| TP4 | | 24.56 | 49.115 | 73.67 |
| 4,6-bis (octylthio-methyl-o-cresol) | 0.15 | 0.15 | 0.15 | 0.15 |
| Dicumyl Peroxide | 0.36 | 0.36 | 0.36 | 0.36 |
| $(D^{ri})_4$ | 1.2 | 1.2 | 1.2 | 1.2 |
| AMSD | 0.06 | 0.06 | 0.06 | 0.06 |
| Results | | | | |
| MH (at 182° C., 12 min) dNm | 1.4 | 2.2 | 3.1 | 4.2 |
| Hot Creep at 200° C., % | 213.1 | 113.3 | 59.9 | 35.1 |
| Hot Creep at 150° C., % | 253.3 | 127.9 | 61.1 | 37.6 |

As seen in Tables WC1-WC5, the inventive curable compositions comprising the telechelic polyolefin and/or the unsaturated polyolefin of the present disclosure surprisingly and unexpectedly demonstrate improved curing levels (higher MH) and lower hot creep even with less crosslinking agent compared to the comparative examples representing the state of the art. The inventive examples is Tables WC1 and WC2 demonstrate higher MH and lower hot creep than comparative examples of similar melt index. Accordingly, industry hot creep requirements (<175% at 150° C. and/or 200° C.), can be met at lower levels of peroxide. Alternatively at a given peroxide level, curable compositions with inventive telechelic and/or unsaturated polyolefin of the present invention having higher melt index/lower viscosity can be used to meet the hot creep requirement than comparative curable compositions. Lower viscosity formulations will have less shear heating during extrusion, which can result in scorch, thus can be beneficial by enabling faster extrusion speeds. For example, CE-3B, which is made with a polyolefin with low or no unsaturation having a melt index of 5 g/10 minutes and 1.6 wt % DCP, does not pass the hot creep requirement at 200° C. But, IE-4B, which is made with a telechelic polyolefin of the present invention having a melt index of 17 g/10 minutes and 1.6 wt % DCP, passes the hot creep requirement (<175%) at 200° C. In Tables WC3-WC5, inventive examples with 0.36 wt % peroxide (IE-6B, IE-6C, IE-6E, IE-8D, IE-8E, IE-9D, IE-9E, IE-11B, IE-11C, IE-11D) or 0.3 wt % peroxide (IE-6D), can meet the industry hot creep requirements (<175% at 150° C. and/or 200° C.), whereas the comparative example (CE-6) does not meet the hot creep requirement when using 0.36 wt % DCP. Rather, 0.5 wt % DCP (CE-5A) is required to meet the hot creep requirement when using an LDPE polymer representing the current state of the art. IE-11B, IE-11C, and IE-11D demonstrate that inventive curable compositions can be prepared wherein the telechelic polyolefin of the present invention is blended with LDPE. Accordingly, it is clear from these unexpected results that inventive curable compositions of the present disclosure address the need for reducing peroxide level to reduce byproducts to less than 100 ppm methane to achieve a zero degassing formulation, which leads to reduction or even elimination of the time-consuming and costly degassing process in production of insulated cables.

What is claimed is:

1. A curable composition for a cable insulation layer, the curable composition comprising (A) a polyolefin component comprising a low-density polyethylene and an unsaturated polyolefin of the formula $A^1L^1$ and (B) a curing component comprising a cross-linking agent, wherein:

$L^1$ is a polyolefin;

$A^1$ is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$; and $Y^1$ at each occurrence independently is a $C_1$ to $C_{30}$ hydrocarbyl group.

2. The curable composition of claim 1, wherein the unsaturated polyolefin has a weight average molecular weight from 1,000 g/mol to 1,000,000 g/mol.

3. The curable composition of claim 1, wherein the cross-linking agent is dicumyl peroxide.

4. The curable composition of claim 1, wherein the curable composition further comprises (C) an additive component comprising an antioxidant.

5. The curable composition of claim 1, wherein the (B) curing component further comprises a coagent.

6. The curable composition of claim 5, wherein the coagent is 2,4,6,8-tetramethyl-2,4,6,8-tetravinyl cyclotetrasiloxane.

7. The curable composition of claim 1,
wherein the crosslinking agent is present in an amount from greater than or equal to 1 wt % to 2 wt %, based on a total weight of the curable composition, and
wherein the curable composition has a hot creep at 150° C. or 200° C. of less than or equal to 35% after curing at 180° C. for 15 minutes.

8. The curable composition of claim 1,
wherein the crosslinking agent is present in an amount from 0.3 wt % to 0.36 wt %, based on a total weight of the curable composition, and
wherein the curable composition has a hot creep at 150° C. or 200° C. of less than or equal to 175% after curing at 180° C. for 15 minutes.

9. The curable composition of claim 1, wherein $L^1$ of the unsaturated polyolefin of the formula $A^1L^1$ is covalently bonded to $A^1$ through a carbon-carbon single bond.

10. An article made from the curable composition of claim 1, wherein the article is a cable insulation layer.

11. A curable composition for a cable insulation layer, the curable composition comprising (A) a polyolefin component comprising a low-density polyethylene and a telechelic polyolefin of the formula $A^1L^1L^2A^2$ and (B) a curing component comprising a cross-linking agent, wherein:

$L^1$ is a polyolefin;

$A^1$ is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;

$Y^1$ at each occurrence independently is a $C_1$ to $C_{30}$ hydrocarbyl group;

$L^2$ is a $C_1$ to $C_{32}$ hydrocarbylene group; and $A^2$ is a hydrocarbyl group comprising a hindered double bond.

12. The curable composition of claim 11, wherein the telechelic polyolefin has a weight average molecular weight from 1,000 g/mol to 1,000,000 g/mol.

13. The curable composition of claim 11, wherein $L^1$ of the telechelic polyolefin of the formula $A^1L^1L^2A^2$ is covalently bonded to each of $A^1$ and $L^2$ through carbon-carbon single bonds, and wherein $L^2$ of the telechelic polyolefin of the formula $A^1L^1L^2A^2$ is covalently bonded to $A^2$ through a carbon-carbon single bond.

14. A curable composition for a cable insulation layer, the curable composition comprising (A) a polyolefin component comprising a low-density polyethylene, an unsaturated polyolefin of the formula $A^1L^1$ and a telechelic polyolefin of the formula $A^1L^1L^2A^2$ and (B) a curing component comprising a cross-linking agent, wherein:

$L^1$ at each occurrence independently is a polyolefin;

$A^1$ at each occurrence independently is selected from the group consisting of a vinyl group, a vinylidene group of the formula $CH_2=C(Y^1)-$, a vinylene group of the formula $Y^1CH=CH-$, a mixture of a vinyl group and a vinylene group of the formula $Y^1CH=CH-$, a mixture of a vinyl group and a vinylidene group of the formula $CH_2=C(Y^1)-$, a mixture of a vinylidene group of the formula $CH_2=C(Y^1)-$ and a vinylene group of the formula $Y^1CH=CH-$, and a mixture of a vinyl group, a vinylidene group of the formula $CH_2=C(Y^1)-$, and a vinylene group of the formula $Y^1CH=CH-$;

$Y^1$ at each occurrence independently is a $C_1$ to $C_{30}$ hydrocarbyl group;

$L^2$ is a $C_1$ to $C_{32}$ hydrocarbylene group; and $A^2$ is a hydrocarbyl group comprising a hindered double bond.

* * * * *